(12) United States Patent
Badehi et al.

(10) Patent No.: US 7,538,358 B2
(45) Date of Patent: May 26, 2009

(54) ELECTRO-OPTICAL CIRCUITRY HAVING INTEGRATED CONNECTOR AND METHODS FOR THE PRODUCTION THEREOF

(75) Inventors: Avner Badehi, Yehuda (IL); Sylvie Rockman, Zichron Ya'akov (IL)

(73) Assignee: XLoom Communications, Ltd., Tel Aviv-Yafo (IL)

( * ) Notice: Subject to any disclaimer, the term of this patent is extended or adjusted under 35 U.S.C. 154(b) by 0 days.

(21) Appl. No.: 10/595,372

(22) PCT Filed: Oct. 15, 2003

(86) PCT No.: PCT/IL03/00833

§ 371 (c)(1),
(2), (4) Date: Apr. 13, 2006

(87) PCT Pub. No.: WO2005/036226

PCT Pub. Date: Apr. 21, 2005

(65) Prior Publication Data

US 2007/0013017 A1   Jan. 18, 2007

(51) Int. Cl.
*H01L 33/00*   (2006.01)
*G02B 6/02*   (2006.01)
(52) U.S. Cl. .............................. 257/98; 385/132; 438/31
(58) Field of Classification Search .................. 438/31; 257/98, 432; 385/132
See application file for complete search history.

(56) References Cited

U.S. PATENT DOCUMENTS

| | | | |
|---|---|---|---|
| 3,968,360 A | 7/1976 | Monnier | |
| 4,117,329 A | 9/1978 | Kruer et al. | |
| 4,168,883 A | 9/1979 | MacLeod | |
| 4,351,051 A | 9/1982 | Van Alem et al. | |
| 4,386,821 A | 6/1983 | Simon et al. | |
| 4,399,541 A | 8/1983 | Kovats et al. | |
| 4,602,158 A | 7/1986 | Barrett | |
| 4,615,031 A | 9/1986 | Eales et al. | |
| 4,689,246 A | 8/1987 | Barrett | |
| 4,750,799 A | 6/1988 | Kawachi et al. | |
| 4,778,242 A | 10/1988 | Ota et al. | |
| 4,810,053 A | 3/1989 | Woith | |
| 4,988,159 A | 1/1991 | Turner et al. | |
| 4,989,930 A | 2/1991 | Nakagawa et al. | |

(Continued)

FOREIGN PATENT DOCUMENTS

EP   1008880   6/2000

OTHER PUBLICATIONS

Optocube 40 3.35Gb/s Channel Speed 850nm Receiver Array 12 Channel Parallel Optical Receivers and OptoCube 40 3.35Gb/s Channel Speed 850nm Receiver Array 12 Channel Parallel Optical Transmitters, from Corona Optical Systems, Inc. USA.

*Primary Examiner*—W. David Coleman
(74) *Attorney, Agent, or Firm*—Perkins Coie, LLP

(57) ABSTRACT

A packaged electro-optic integrated circuit and a multi-fiber connector including an integrated circuit substrate, at least one optical signal providing element, at least one optical signal sensor, sensing at least one optical signal from the at least one optical signal providing element and at least one discrete reflecting optical element, mounted onto the integrated circuit substrate, cooperating with the at least one optical signal providing element and being operative to direct light from the at least one optical signal providing element.

25 Claims, 69 Drawing Sheets

FIG. 9C

U.S. PATENT DOCUMENTS

| | | | |
|---|---|---|---|
| 4,989,943 A | 2/1991 | Yoshinaga et al. |
| 5,044,720 A | 9/1991 | Haley et al. |
| 5,172,206 A | 12/1992 | Iizuka |
| 5,195,150 A | 3/1993 | Stegmueller et al. |
| 5,200,631 A | 4/1993 | Austin et al. |
| 5,231,686 A | 7/1993 | Rabinovich |
| 5,400,419 A | 3/1995 | Heinen et al. |
| 5,424,573 A | 6/1995 | Kato et al. |
| 5,436,503 A | 7/1995 | Kunitomo et al. |
| 5,446,814 A | 8/1995 | Kuo et al. |
| 5,455,455 A | 10/1995 | Badehi |
| 5,485,540 A | 1/1996 | Eda et al. |
| 5,547,906 A | 8/1996 | Badehi |
| 5,550,408 A | 8/1996 | Kunitomo et al. |
| 5,641,996 A | 6/1997 | Omoya et al. |
| 5,716,759 A | 2/1998 | Badehi |
| 5,764,832 A | 6/1998 | Tabuchi et al. |
| 5,771,218 A | 6/1998 | Feldman et al. |
| 5,785,874 A | 7/1998 | Eda et al. |
| 5,818,990 A | 10/1998 | Steijer et al. |
| 5,841,591 A | 11/1998 | Zhu et al. |
| 5,844,320 A | 12/1998 | Ono et al. |
| 5,872,762 A | 2/1999 | Feldman et al. |
| 5,886,971 A | 3/1999 | Feldman et al. |
| 5,912,872 A | 6/1999 | Feldman et al. |
| 5,933,551 A | 8/1999 | Boudreau et al. |
| 5,980,663 A | 11/1999 | Badehi |
| 6,022,758 A | 2/2000 | Badehi |
| 6,040,235 A | 3/2000 | Badehi |
| 6,052,498 A | 4/2000 | Paniccia |
| 6,058,228 A | 5/2000 | Fasanella et al. |
| 6,061,169 A | 5/2000 | Feldman et al. |
| 6,071,652 A | 6/2000 | Feldman et al. |
| 6,075,908 A | 6/2000 | Paniccia et al. |
| 6,096,155 A | 8/2000 | Harden et al. |
| 6,103,551 A | 8/2000 | Ono et al. |
| 6,104,690 A | 8/2000 | Feldman et al. |
| 6,115,521 A | 9/2000 | Tran et al. |
| 6,117,707 A | 9/2000 | Badehi |
| 6,180,945 B1 | 1/2001 | Barton et al. |
| 6,214,642 B1 | 4/2001 | Chen et al. |
| 6,234,688 B1 | 5/2001 | Boger et al. |
| 6,235,141 B1 | 5/2001 | Feldman et al. |
| 6,295,156 B1 | 9/2001 | Feldman et al. |
| 6,343,171 B1 | 1/2002 | Yoshimura et al. |
| 6,406,196 B1 | 6/2002 | Uno et al. |
| 6,450,704 B1 | 9/2002 | O'Connor et al. |
| 6,456,761 B2 | 9/2002 | Yap et al. |
| 6,466,349 B1 | 10/2002 | Valley et al. |
| 6,483,969 B1 | 11/2002 | Yap et al. |
| 6,509,066 B1 | 1/2003 | Jost |
| 6,605,806 B2 | 8/2003 | Walmsley et al. |
| 6,611,635 B1 | 8/2003 | Yoshimura et al. |
| 6,684,007 B2 | 1/2004 | Yoshimura et al. |
| 6,690,845 B1 | 2/2004 | Yoshimura et al. |
| 6,706,546 B2 | 3/2004 | Yoshimura et al. |
| 6,741,781 B2 | 5/2004 | Furuyama et al. |
| 6,785,447 B2 | 8/2004 | Yoshimura et al. |
| 6,792,179 B2 | 9/2004 | Lu et al. |
| 6,798,953 B1 | 9/2004 | Cohen et al. |
| 6,819,836 B2 | 11/2004 | Murali |
| 6,843,608 B2 | 1/2005 | O'Connor et al. |
| 6,845,184 B1 | 1/2005 | Yoshimura et al. |
| 6,921,956 B2 | 7/2005 | Yang et al. |
| 6,952,504 B2 | 10/2005 | Bi et al. |
| 6,968,109 B2 | 11/2005 | Furuyama et al. |
| 2002/0025122 A1 | 2/2002 | Ouchi et al. |
| 2002/0185588 A1 | 12/2002 | Wagner et al. |
| 2003/0118288 A1* | 6/2003 | Korenaga et al. ............. 385/49 |
| 2003/0138219 A1 | 7/2003 | O'Toole et al. |
| 2004/0021214 A1 | 2/2004 | Badehi et al. |
| 2006/0022289 A1* | 2/2006 | Badhei et al. ............... 257/432 |
| 2006/0145279 A1* | 7/2006 | Badehi et al. ............... 257/432 |

* cited by examiner

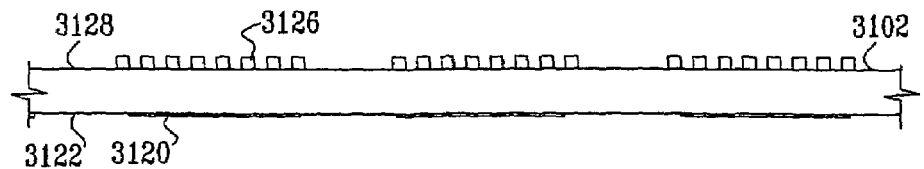
FIG. 7C
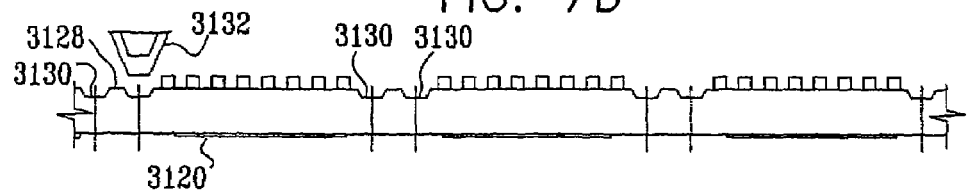
FIG. 7D
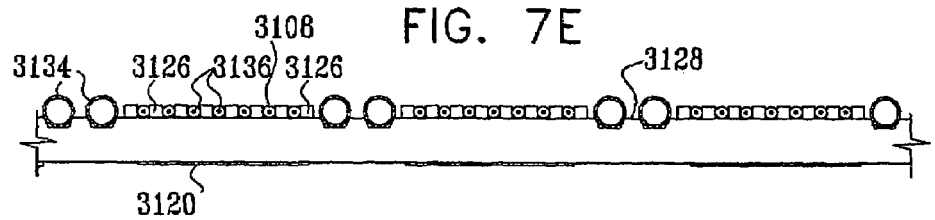
FIG. 7E
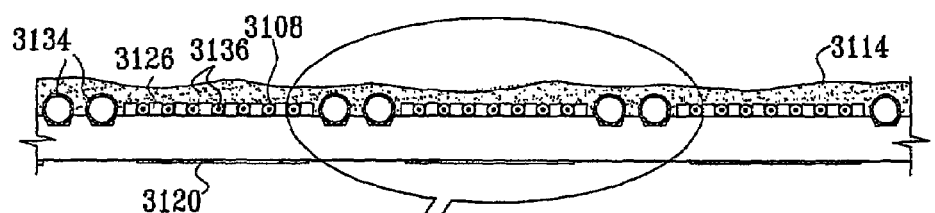
FIG. 7F
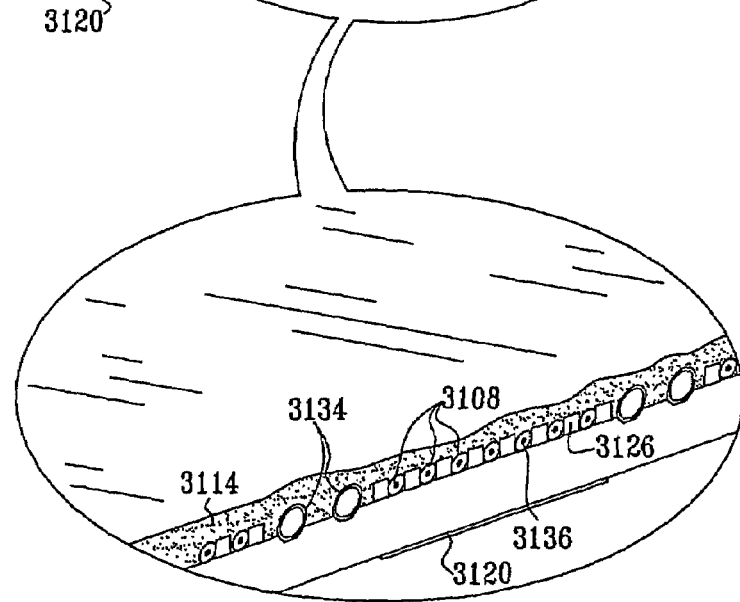

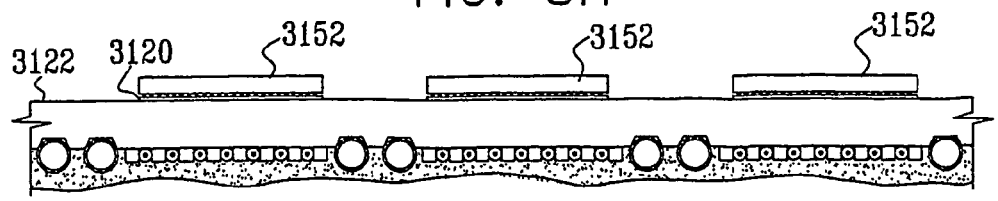
FIG. 8H
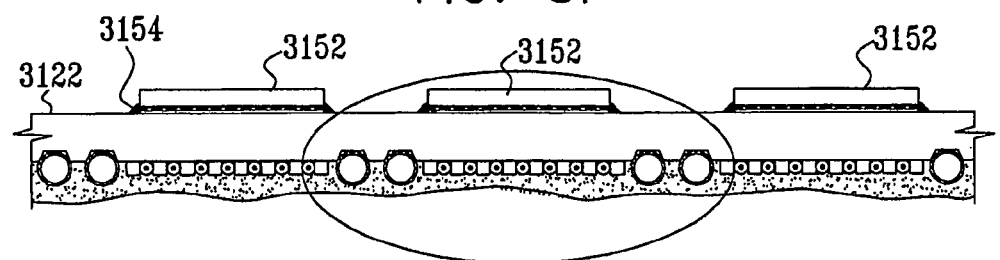
FIG. 8I
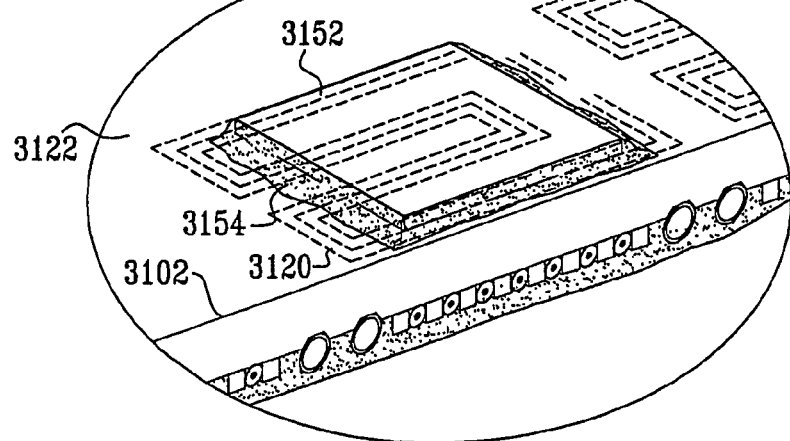
FIG. 8J
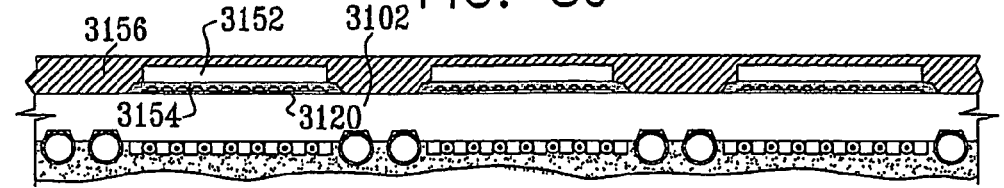

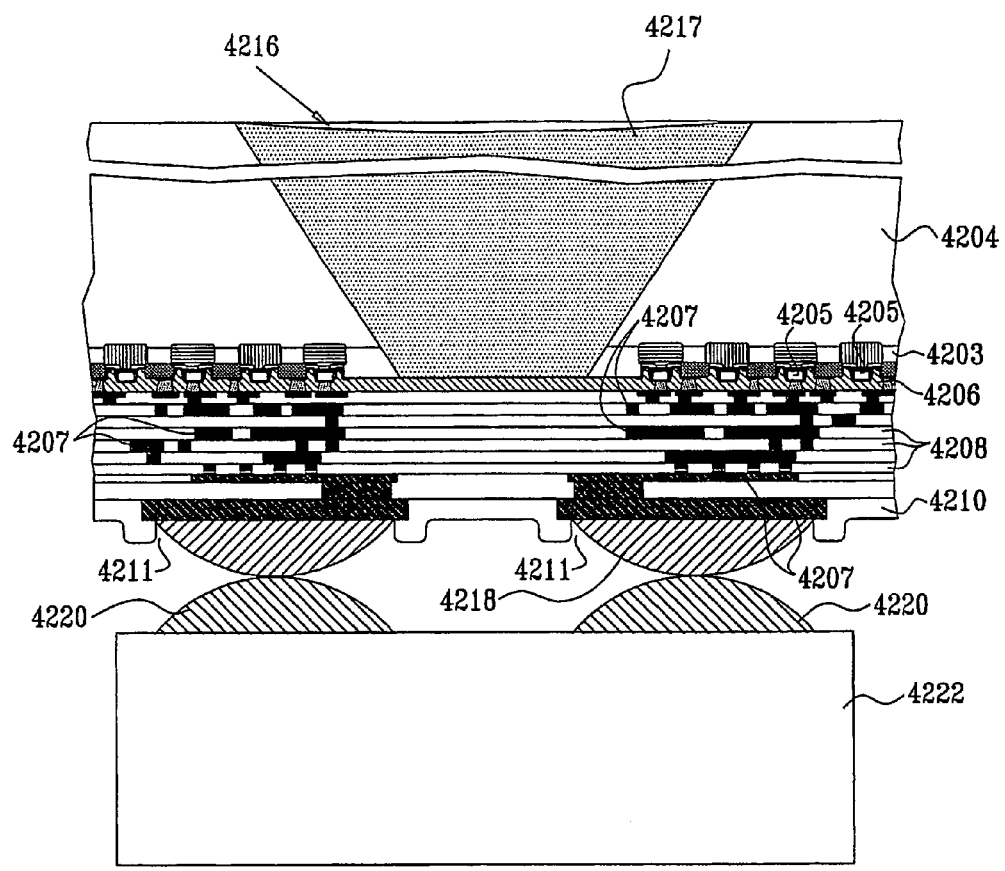

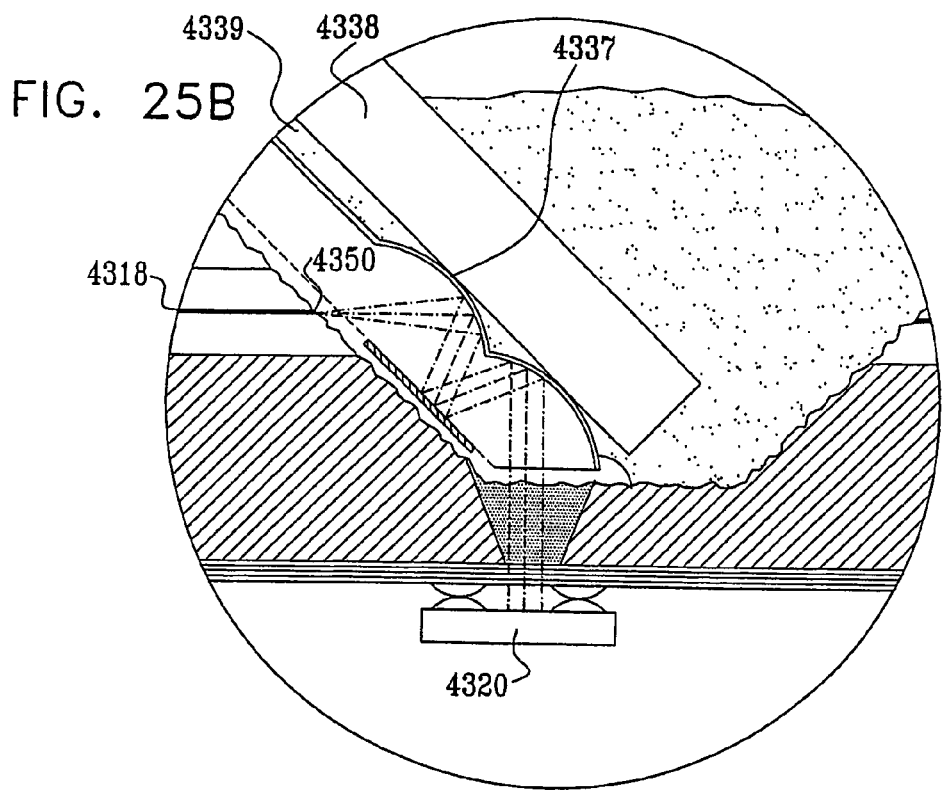
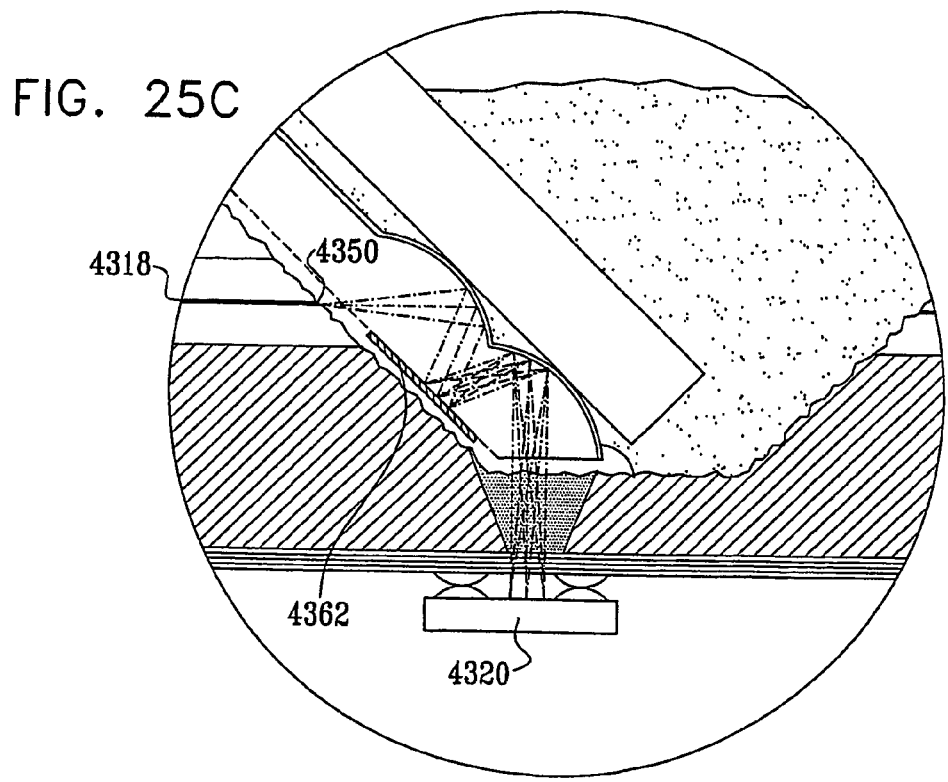

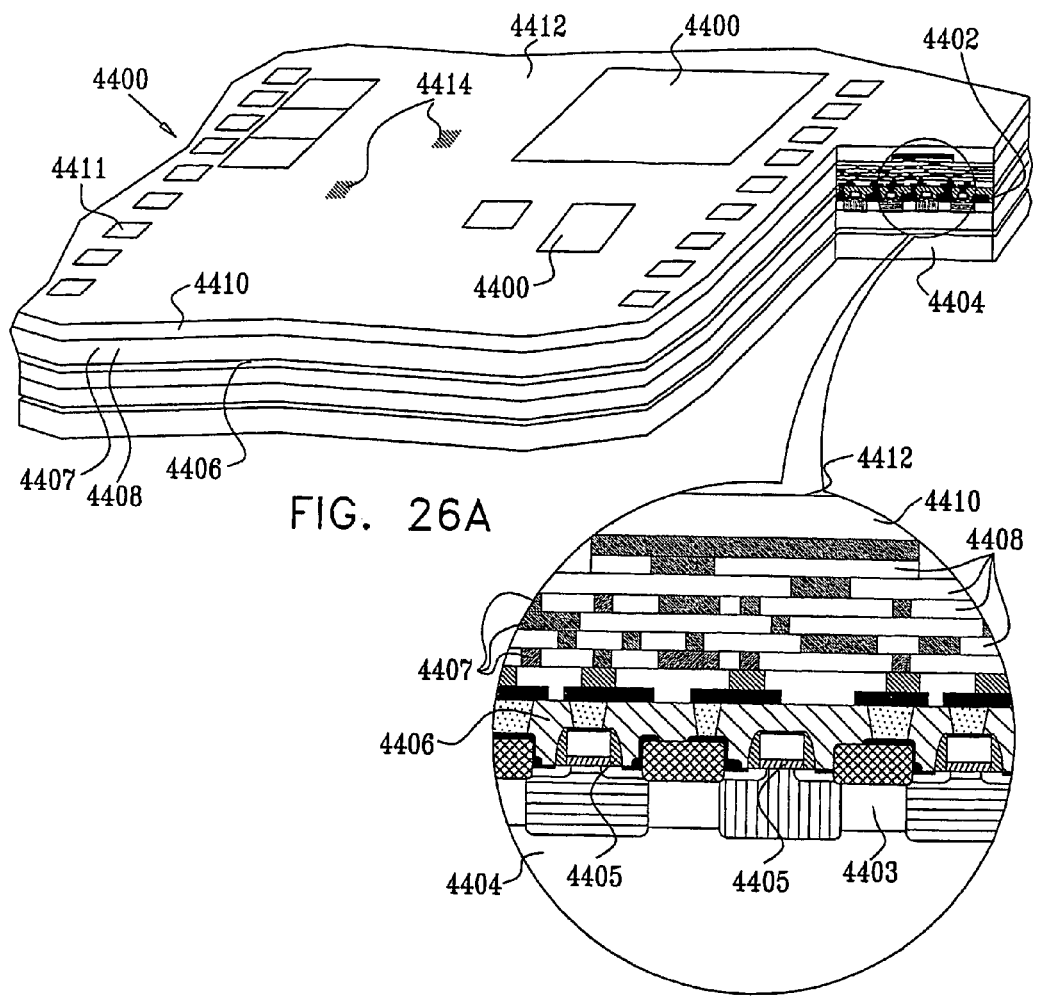

FIG. 36D
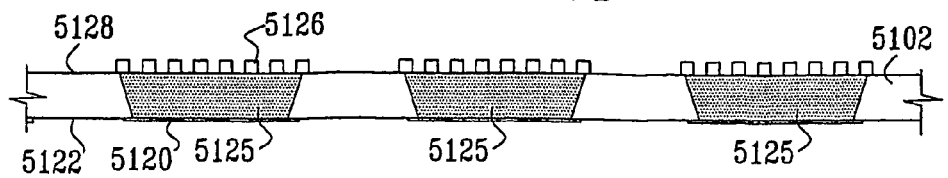
FIG. 36E
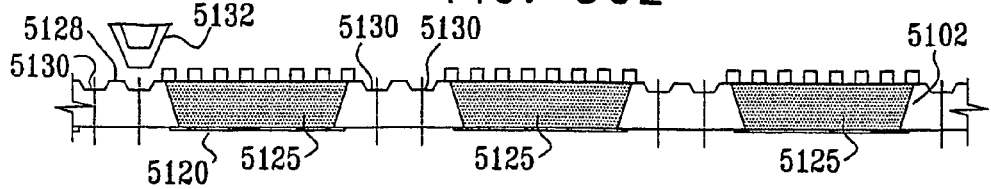
FIG. 36F
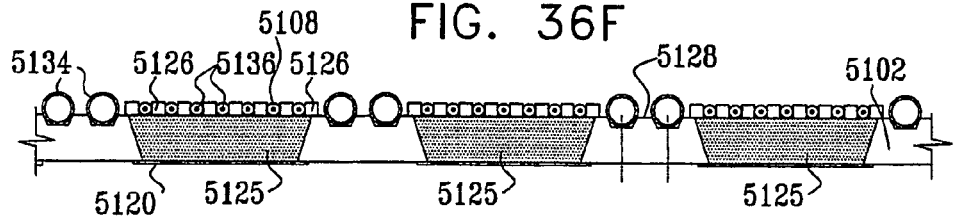
FIG. 36G
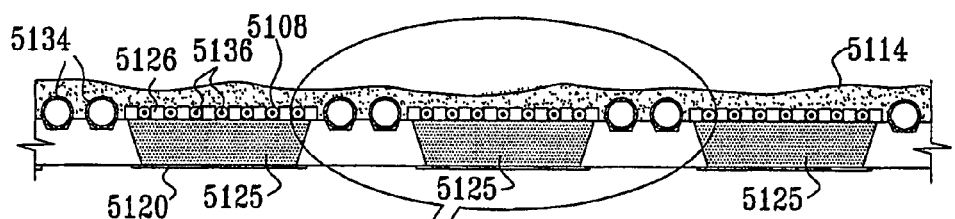
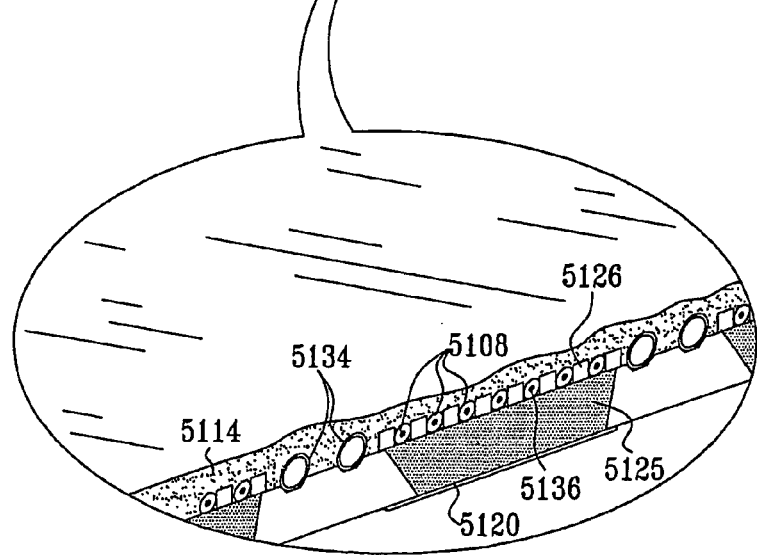

FIG. 37C
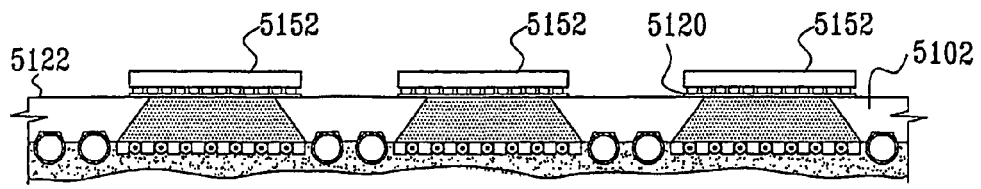
FIG. 37D
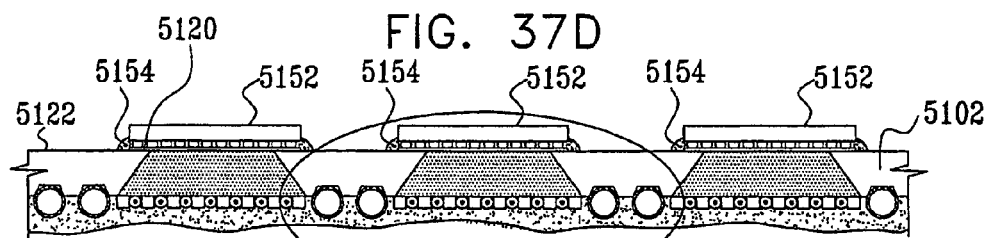
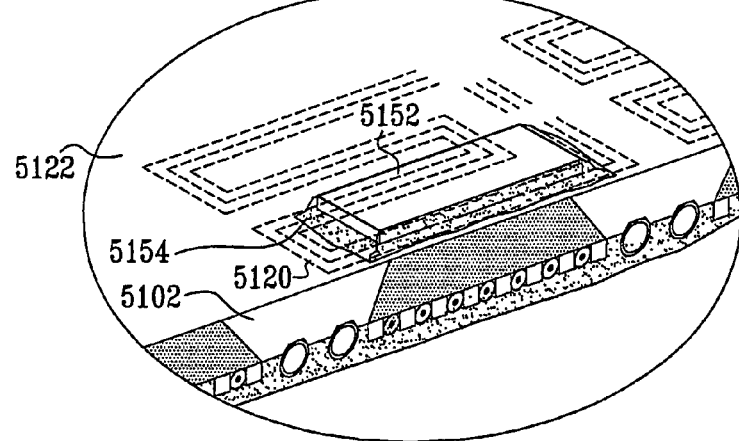
FIG. 37E
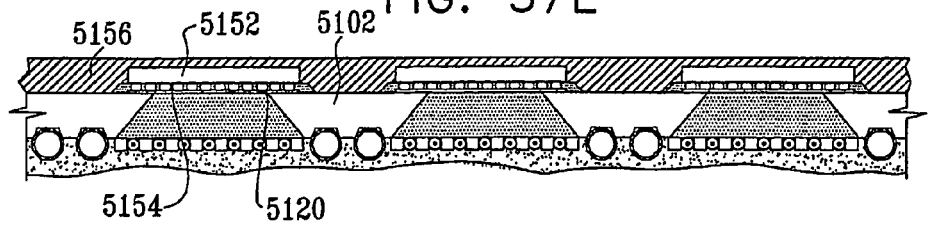

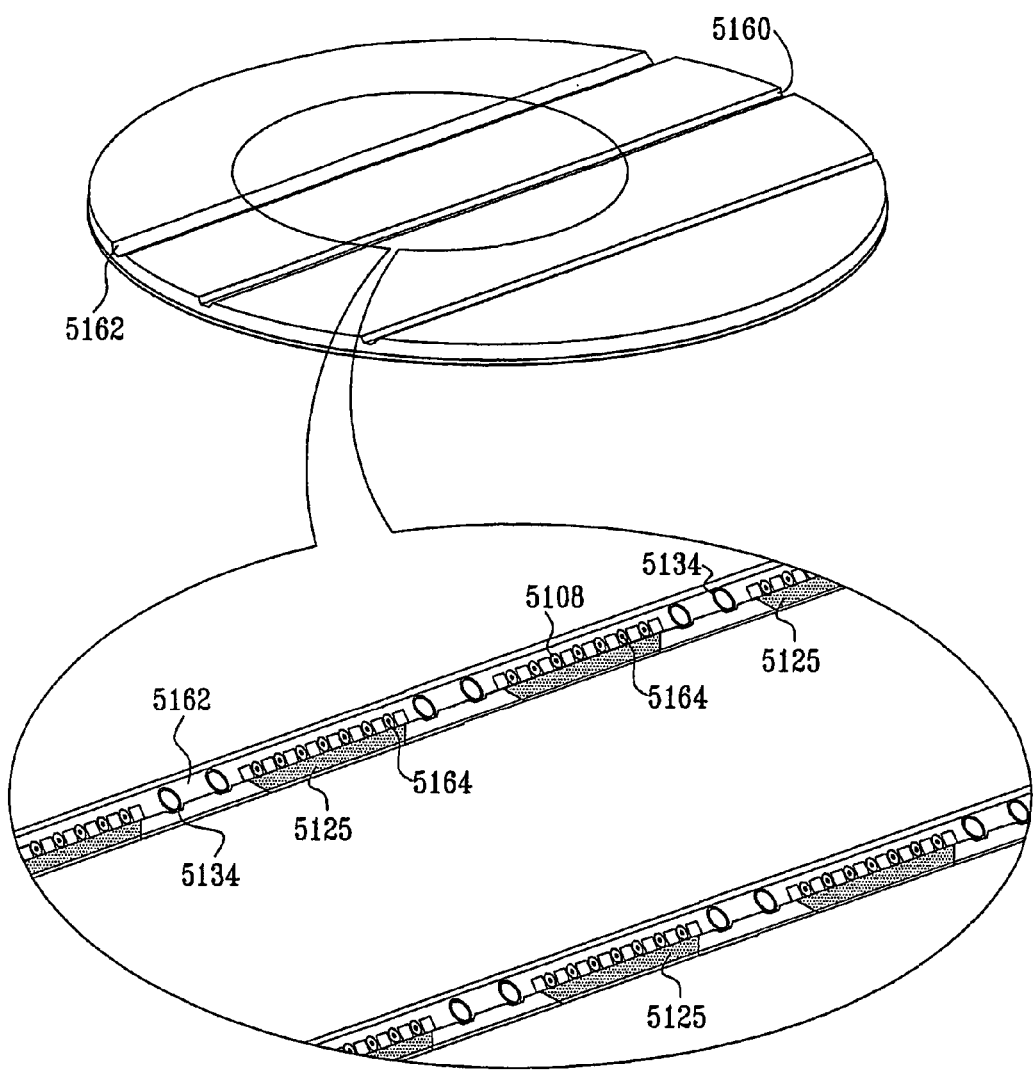

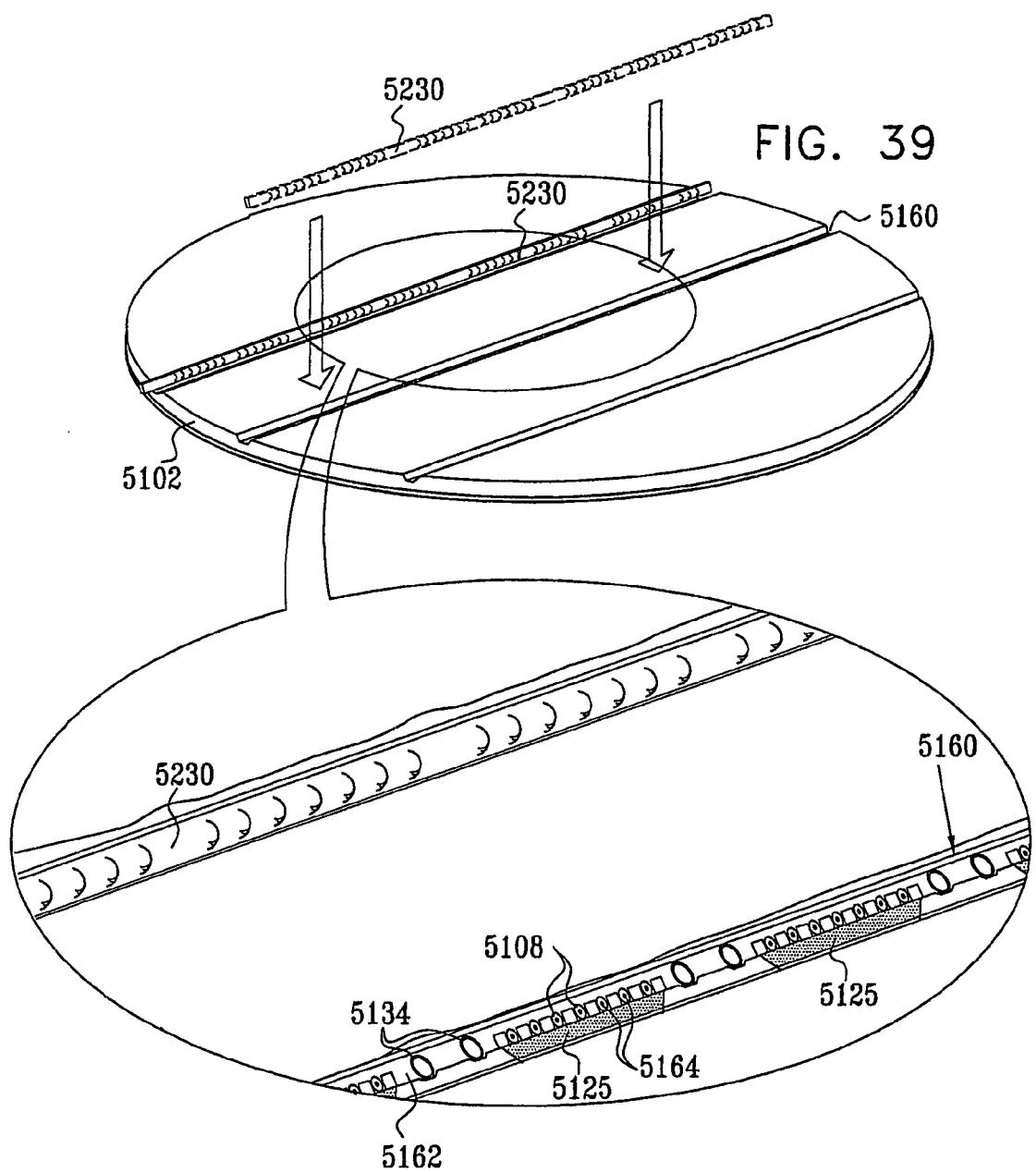

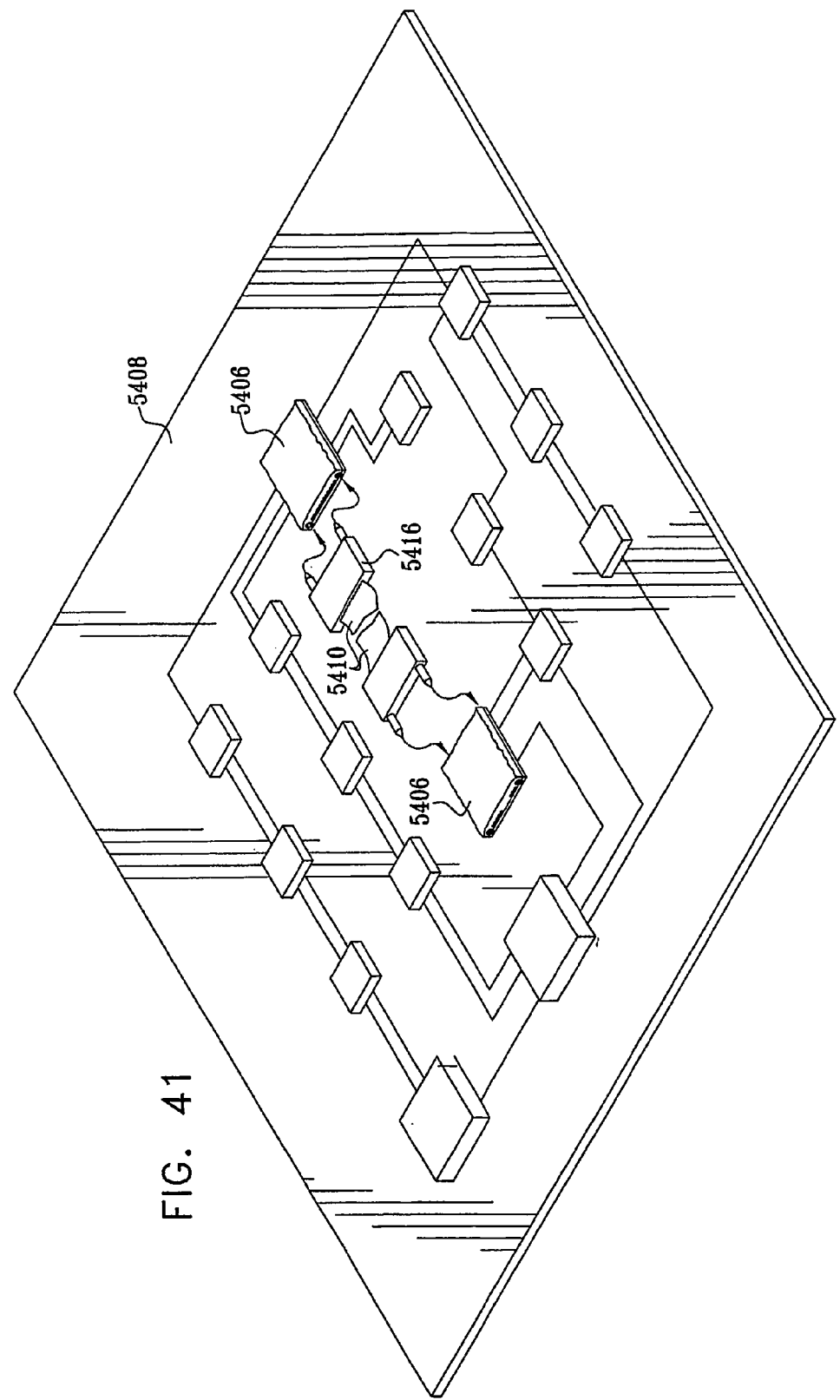

ELECTRO-OPTICAL CIRCUITRY HAVING INTEGRATED CONNECTOR AND METHODS FOR THE PRODUCTION THEREOF

REFERENCE TO CO-PENDING APPLICATIONS

Applicant hereby makes reference to co-pending PCT Patent Application PCT/IL03/00308, entitled "Electro-Optical Circuitry Having Integrated Connector and Methods for the Production Thereof", which claims priority of U.S. Provisional Patent Application Ser. No. 60/373,415, filed on Apr. 16, 2002, entitled "Electro-Optic Integrated Circuits and Methods for the Production Thereof", U.S. patent application Ser. No. 10/314,088, filed Dec. 6, 2002, entitled "Electro-Optic Integrated Circuits with Connectors and Methods for the Production Thereof" and U.S. Provisional Patent Application Ser. No. 60/442,948, filed on Jan. 27, 2003, entitled "Direct Optical Connection".

CROSS-REFERENCE TO PRIOR APPLICATION

The above-referenced application is the U.S. National Phase of international Patent Application PCT/IL2003/000833, filed Oct. 15, 2003. The International application was published in English on Apr. 21, 2005 as WO 2005/036226 A1.

FIELD OF THE INVENTION

The present invention relates to interconnection of high speed integrated circuits, electro-optic integrated circuits, multi-fiber connectors and methods for the production thereof generally and more particularly to wafer level manufacture of chip level electro-optic integrated circuits with integrated optical connectors and optical interconnections which transfer data between semiconductor integrated circuits.

BACKGROUND OF THE INVENTION

The following U.S. patents of the present inventor represent the current state of the art:

U.S. Pat. Nos. 6,117,707; 6,040,235; 6,022,758; 5,980,663; 5,716,759; 5,547,906 and 5,455,455.

The following U.S. patents represent the current state of the art relevant to stud bump mounting of electrical circuits:

U.S. Pat. Nos. 6,214,642; 6,103,551; 5,844,320; 5,641,996; 5,550,408 and 5,436,503.

Additionally, the following patents are believed to represent the current state of the art:

U.S. Pat. Nos. 3,968,360; 4,117,329; 4,168,883; 4,351,051; 4,386,821; 4,399,541; 4,602,158; 4,615,031; 4,689,246; 4,810,053; 4,988,159; 4,989,930; 4,989,943; 5,044,720; 5,231,686; 5,771,218; 5,841,591; 5,872,762; 6,052,498; 6,058,228; 6,234,688; 5,886,971; 5,912,872; 5,933,551; 6,061,169; 6,071,652; 6,096,155; 6,104,690; 6,180,945; 6,235,141; 6,295,156; 6,509,066 and 6,605,806.

SUMMARY OF THE INVENTION

The present invention seeks to provide improved optical interconnections means to transfer high speed data between semiconductor integrated circuits, electro-optic integrated circuits and methods for production thereof.

There is thus provided, in accordance with a preferred embodiment of the present invention, a packaged electro-optic integrated circuit including an integrated circuit substrate, at least one optical signal providing element, at least one optical signal sensor, sensing at least one optical signal from the at least one optical signal providing element and at least one discrete reflecting optical element, mounted onto the integrated circuit substrate, cooperating with the at least one optical signal providing element and being operative to direct light from the at least one optical signal providing element.

There is also provided, in accordance with another preferred embodiment of the present invention, a packaged electro-optic integrated circuit including an integrated circuit substrate defining a planar surface, at least one optical signal providing element, at least one optical signal sensor, sensing at least one optical signal from the at least one optical signal providing element and at least one reflecting optical element having an optical axis which is neither parallel nor perpendicular to the planar surface, the element cooperating with the at least one optical signal providing element and being operative to direct light from the at least one optical signal providing element.

In accordance with another preferred embodiment of the present invention, the packaged electro-optic integrated circuit also includes at least one optical signal receiving element, the at least one reflecting optical element cooperating with the at least one optical signal receiving element and being operative to direct light to the at least one optical signal receiving element.

There is further provided, in accordance with still another preferred embodiment of the present invention, a method for producing a packaged electro-optic integrated circuit including providing an integrated circuit substrate, mounting at least one optical signal providing element onto the integrated circuit substrate, forming at least one optical signal sensor onto the integrated circuit substrate for sensing at least one optical signal from the at least one optical signal providing element, mounting at least one optical signal receiving element onto the integrated circuit substrate and providing optical alignment, between the at least one optical signal providing element and the at least one optical signal receiving element, subsequent to mounting thereof, by suitably positioning along an optical path extending therebetween, at least one intermediate optical element and fixing the at least one intermediate optical element to the integrated circuit substrate.

There is still further provided, in accordance with yet another preferred embodiment of the present invention, a method for producing a packaged electro-optic integrated circuit including providing an integrated circuit substrate, mounting at least one optical signal providing element on the integrated circuit substrate, forming at least one optical signal sensor onto the integrated circuit substrate for sensing at least one optical signal from the at least one optical signal providing element and mounting at least one discrete reflecting optical element onto the integrated circuit substrate to cooperate with the at least one optical signal providing element and to direct light from the at least one optical signal providing element.

There is even further provided, in accordance with yet another preferred embodiment of the present invention, a method for producing a packaged electro-optic integrated circuit including providing an integrated circuit substrate defining a planar surface, mounting at least one optical signal providing element on the integrated circuit substrate, forming at least one optical signal sensor onto the integrated circuit substrate for sensing at least one optical signal from the at least one optical signal providing element and mounting at least one reflecting optical element onto the integrated circuit substrate to cooperate with the at least one optical signal providing element and to direct light from the at least one optical signal providing element, wherein an optical axis of the at least one reflecting optical element is neither parallel nor perpendicular to the planar surface.

In accordance with another preferred embodiment of the present invention, the method also includes mounting at least one optical signal receiving element on the integrated circuit substrate, the at least one reflecting optical element cooperating with the at least one optical signal receiving element and being operative to direct light to the at least one optical signal receiving element.

There is even further provided, in accordance with still another preferred embodiment of the present invention, a multi-fiber connector including a connector housing and a packaged electro-optic integrated circuit and connector chip disposed within the housing, the packaged electro-optic integrated circuit and connector chip including an integrated circuit substrate, at least one optical signal providing element and at least one discrete reflecting optical element, mounted onto the integrated circuit substrate, cooperating with the at least one optical signal providing element and being operative to direct light from the at least one optical signal providing element.

There is also provided, in accordance with yet another preferred embodiment of the present invention, a multi-fiber connector including a connector housing and a packaged electro-optic integrated circuit and connector chip disposed within the housing, the packaged electro-optic integrated circuit and connector chip including an integrated circuit substrate, at least one optical signal receiving element and at least one discrete reflecting optical element mounted onto the integrated circuit substrate and cooperating with the at least one optical signal receiving element and being operative to direct light to the at least one optical signal receiving element.

There is further provided, in accordance with another preferred embodiment of the present invention, a multi-fiber connector including a connector housing and a packaged electro-optic integrated circuit and connector chip disposed within the housing, the packaged electro-optic integrated circuit and connector chip including an integrated circuit substrate defining a planar surface, at least one optical signal providing element and at least one reflecting optical element having an optical axis which is neither parallel nor perpendicular to the planar surface, the element cooperating with the at least one optical signal providing element and being operative to direct light from the at least one optical signal providing element.

In accordance with another preferred embodiment of the present invention, the packaged electro-optic integrated circuit also includes at least one optical signal receiving element, the at least one reflecting optical element cooperating with the at least one optical signal receiving element and being operative to direct light to the at least one optical signal receiving element.

There is even further provided, in accordance with still another preferred embodiment of the present invention, a multi-fiber connector including a connector housing and a packaged electro-optic integrated circuit and connector chip disposed within the housing, the electro-optic integrated circuit and connector chip including an integrated circuit substrate defining a planar surface, at least one optical signal receiving element and at least one reflecting optical element having an optical axis which is neither parallel nor perpendicular to the planar surface, the element cooperating with the at least one optical signal receiving element and being operative to direct light to the at least one optical signal receiving element.

There is still further provided, in accordance with another preferred embodiment of the present invention, a method for producing a multi-fiber connector including forming a packaged electro-optic integrated circuit and connector chip, the forming including providing an integrated circuit substrate, mounting at least one optical signal providing element onto the integrated circuit substrate, mounting at least one optical signal receiving element onto the integrated circuit substrate and providing optical alignment, between the at least one optical signal providing element and the at least one optical signal receiving element, subsequent to mounting thereof, by suitably positioning along an optical path extending therebetween, at least one intermediate optical element and fixing the at least one intermediate optical element to the integrated circuit substrate and disposing the electro-optic integrated circuit and connector chip within a connector housing.

There is also provided, in accordance with yet another preferred embodiment of the present invention, a method for producing a multi-fiber connector including forming a packaged electro-optic integrated circuit and connector chip, the forming including providing an integrated circuit substrate, mounting at least one optical signal providing element on the integrated circuit substrate and mounting at least one discrete reflecting optical element onto the integrated circuit substrate to cooperate with the at least one optical signal providing element and to direct light from the at least one optical signal providing element and disposing the electro-optic integrated circuit and connector chip within a connector housing.

There is further provided, in accordance with still another preferred embodiment of the present invention, a method for producing a multi-fiber connector including forming a packaged electro-optic integrated circuit and connector chip, the forming including providing an integrated circuit substrate, mounting at least one optical signal receiving element on the integrated circuit substrate and mounting at least one discrete reflecting optical element onto the integrated circuit substrate to cooperate with the at least one optical signal receiving element and to direct light to the at least one optical signal receiving element and disposing the electro-optic integrated circuit and connector chip within a connector housing.

There is still further provided, in accordance with yet another preferred embodiment of the present invention, a method for producing a multi-fiber connector including forming a packaged electro-optic integrated circuit and connector chip, the forming including providing an integrated circuit substrate defining a planar surface, mounting at least one optical signal providing element on the integrated circuit substrate and mounting at least one reflecting optical element onto the integrated circuit substrate to cooperate with the at least one optical signal providing element and to direct light from the at least one optical signal providing element, wherein an optical axis of the at least one reflecting optical element is neither parallel nor perpendicular to the planar surface and disposing the electro-optic integrated circuit and connector chip within a connector housing.

There is yet further provided, in accordance with another preferred embodiment of the present invention, a method for producing a multi-fiber connector including forming a packaged electro-optic integrated circuit and connector chip, the forming including providing an integrated circuit substrate defining a planar surface, mounting at least one optical signal receiving element on the integrated circuit substrate and mounting at least one reflecting optical element onto the integrated circuit substrate to cooperate with the at least one optical signal receiving element and to direct light to the at least one optical signal receiving element, wherein an optical axis of the at least one reflecting optical element is neither parallel nor perpendicular to the planar surface and disposing the electro-optic integrated circuit and connector chip within a connector housing.

There is also provided, in accordance with another preferred embodiment of the present invention, a multi-fiber connector including a connector housing and a packaged electro-optic integrated circuit and connector chip disposed within the housing, the electro-optic integrated circuit and connector chip including an optical connector including a plurality of optical elements defining at least one optical input path and at least one optical output path, the at least one optical input path and the at least one optical output path being non-coaxial.

There is further provided, in accordance with another preferred embodiment of the present invention, a method for producing a multi-fiber connector including forming a packaged electro-optic integrated circuit and connector chip including an optical connector, the forming including providing a plurality of optical elements, defining at least one optical input path through at least one of the plurality of optical elements and defining at least one optical output path through at least one of the plurality of optical elements, the at least one optical input path and the at least one optical output path being non-coaxial and disposing the electro-optic integrated circuit and connector chip within a connector housing.

In accordance with a preferred embodiment of the present invention, the at least one optical element includes a flat reflective surface. Additionally, the at least one optical element includes a concave mirror. Alternatively, the at least one optical element includes a partially flat and partially concave mirror. Additionally, the partially concave mirror includes a mirror with multiple concave reflective surfaces.

In accordance with another preferred embodiment, the at least one optical element includes a reflective grating. In accordance with yet another preferred embodiment, the at least one optical element includes reflective elements formed on opposite surfaces of an optical substrate. Preferably, at least one of the reflective elements includes a flat reflective surface. Alternatively, at least one of the reflective elements includes a concave mirror. Alternatively or additionally, at least one of the reflective elements includes a partially flat and partially concave mirror. Additionally, the mirror includes a mirror with multiple concave reflective surfaces.

Preferably, the at least one optical element is operative to focus light received from the at least one optical signal providing element. Alternatively, the at least one optical element is operative to collimate light received from the at least one optical signal providing element. In accordance with yet another preferred embodiment the at least one optical element is operative to focus at least one of multiple colors of light received from the at least one optical signal providing element. In accordance with another preferred embodiment, the at least one optical element is operative to collimate at least one of multiple colors of light received from the at least one optical signal providing element.

In accordance with a preferred embodiment, the at least one optical signal-providing element includes an optical fiber. Alternatively, the at least one optical signal-providing element includes a laser diode. Additionally or alternatively, the at least one optical signal-providing element includes a waveguide.

Preferably, the at least one optical signal-providing element is operative to convert an electrical signal to an optical signal. Alternatively, the at least one optical signal-providing element is operative to transmit an optical signal. Additionally, the at least one optical signal-providing element also includes an optical signal-receiving element. In accordance with another preferred embodiment, the at least one optical signal-providing element is operative to generate an optical signal.

Preferably, the at least one optical signal receiving element includes an optical fiber. Additionally or alternatively, the at least one optical signal receiving element includes a diode detector.

In accordance with a preferred embodiment of the present invention, the at least one optical signal receiving element is operative to convert an optical signal to an electrical signal. Additionally, the at least one optical signal receiving element is operative to transmit an optical signal. Alternatively, the at least one optical signal receiving element also includes an optical signal providing element.

In accordance with another preferred embodiment of the present invention the at least one reflecting optical element is operative to focus light received by the at least one optical signal receiving element. Additionally, the at least one reflecting optical element is operative to focus at least one of multiple colors of light received by the at least one optical signal receiving element.

In accordance with another preferred embodiment of the present invention the at least one intermediate optical element, when fixed to the substrate, has an optical axis which is neither parallel nor perpendicular to a planar surface of the integrated circuit substrate.

There is also provided, in accordance with another preferred embodiment of the present invention, a packaged electro-optical integrated circuit including a silicon integrated circuit substrate having electrical signal processing circuitry, including an electrical signal input and an electrical signal output, formed thereon and at least one discrete optical element, including an optical input and an optical output, mounted thereon, and at least one optical signal sensor, sensing at least one optical signal from the optical output of the at least one discrete optical element.

There is further provided, in accordance with still another preferred embodiment of the present invention, a method for producing a packaged electro-optical integrated circuit including providing a silicon integrated circuit substrate, forming, on the substrate, electrical signal processing circuitry including an electrical signal input and an electrical signal output, mounting, on the substrate, at least one discrete optical element including an optical input and an optical output and forming at least one optical signal sensor, sensing at least one optical signal from the at least one discrete optical element.

In accordance with another preferred embodiment of the present invention, the optical element is operative to convert the electrical signal output into the optical input. Additionally or alternatively, the electrical signal processing circuitry is operative to convert the optical output into the electrical signal input.

In accordance with another preferred embodiment of the present invention, the electrical signal processing circuitry and the discrete optical element are located on a single planar surface of the substrate. Alternatively, the electrical signal processing circuitry and the discrete optical element are located on different planar surfaces of the substrate.

There is yet further provided, in accordance with still another preferred embodiment of the present invention, a packaged electro-optical integrated circuit having integrally formed therein an optical connector to an optical fiber and an optical signal sensor.

In accordance with another preferred embodiment of the present invention the optical connector includes a pair of elongate locating pin sockets formed over a silicon substrate of the integrated circuit, and extending generally parallel to a surface thereof. Alternatively or additionally, the optical connector includes a linear array of optical fiber ends arranged to have abutment surfaces generally coplanar with an edge of the packaged electro-optical integrated circuit.

There is still further provided, in accordance with yet another preferred embodiment of the present invention, a method for wafer scale production of a packaged electro-optic circuit having integrally formed therein an optical connector and electrical connections including wafer scale formation of a multiplicity of electro-optical circuits onto a substrate, wafer scale provision of at least one optical waveguide on the substrate, wafer scale formation at least one optical signal sensor on the substrate, wafer scale mounting of at least one integrated circuit component onto the substrate, wafer scale formation of at least one optical pathway providing an optical connection between the at least one integrated circuit component and the at least one optical waveguide, wafer scale formation of at least one mechanical alignment bore on the substrate, wafer scale formation of at least one packaging layer over at least one surface of the substrate and thereafter, dicing of the substrate to define a multiplicity of electro-optic circuits, each having integrally formed therein an optical connector.

In accordance with yet another preferred embodiment of the present invention, an end of the at least one optical waveguide defines an optical connector interface. Additionally, the substrate includes a silicon substrate having formed thereon a multiplicity of integrated circuits.

There is also provided, in accordance with another preferred embodiment of the present invention, a method for wafer scale production of a packaged electro-optical circuit including wafer scale formation of a multiplicity of electro-optical circuits onto an active surface of a substrate, wafer scale formation at least one optical signal sensor on the substrate and wafer scale provision of at least one optical via on the substrate.

In accordance with still another preferred embodiment of the present invention, the wafer scale provision of the at least one optical via includes etching the substrate on a non-active surface of the substrate at a location opposite a region of the active surface generally free of circuitry, thereby to define at least one cavity whose bottom surface is translucent and filling the at least one cavity with a transparent material. Additionally or alternatively, the method also includes attaching a semiconductor element in optical engagement with the at least one optical via. Additionally or alternatively, the transparent material has an index of refraction similar to that employed along at least one optical path in the electro-optical circuit communicating therewith.

There is further provided, in accordance with yet another preferred embodiment of the present invention, a method for wafer level production of a packaged electro-optical integrated circuit including forming electrical circuitry on a first side of a wafer, forming at least one optical signal sensor on the wafer, forming an optical assembly on a second side of the wafer and forming an optical connection between first and second sides of the wafer, through the wafer, thereby providing optical communication between the electrical circuitry and the optical assembly through the wafer.

In accordance with another preferred embodiment of the present invention, the method also includes dicing the wafer to define a multiplicity of integrated circuits each having formed thereon electrical circuitry on a first side of the integrated circuit, an optical assembly on a second side of the integrated circuit and an optical connection between the first and second sides of the integrated circuit, thereby providing optical communication between the electrical circuitry and the optical assembly.

There is still further provided, in accordance with yet another preferred embodiment of the present invention, a multi-fiber connector including a connector housing and a packaged electro-optic integrated circuit and connector chip disposed within the housing, the electro-optic integrated circuit and connector chip including a first integrated circuit substrate having first and second planar surfaces, the first planar surface having first electrical circuitry formed thereon and the second planar surface having formed therein at least one recess and at least one second integrated circuit substrate having second electrical circuitry formed thereon, the at least one second integrated circuit substrate being located in at least partially overlapping relationship with the at least one recess, the second electrical circuitry communicating with the first electrical circuitry.

In accordance with another preferred embodiment of the present invention, the first electrical circuitry includes a light sensor. Additionally or alternatively, the first electrical circuitry includes electro-optic components. Alternatively or additionally, the second electrical circuitry includes electro-optic components. In accordance with another preferred embodiment of the present invention, the second electrical circuitry communicating with the first electrical circuitry communicates via an optical communication path. Additionally, the optical communication path includes optical coupling through free space.

There is yet further provided, in accordance with another preferred embodiment of the present invention, a multi-fiber connector including a connector housing and a packaged electro-optic integrated circuit and connector chip disposed within the housing, the electro-optic integrated circuit and connector chip including a silicon integrated circuit substrate having electrical signal processing circuitry, including an electrical signal input and an electrical signal output, formed thereon and at least one discrete optical element, including an optical input and an optical output, mounted thereon.

There is still further provided, in accordance with yet another preferred embodiment of the present invention, a method for producing a multi-fiber connector including forming a packaged electro-optic integrated circuit and connector chip, the forming including providing a silicon integrated circuit substrate, forming, on the substrate, electrical signal processing circuitry including an electrical signal input and an electrical signal output and mounting, on the substrate, at least one discrete optical element including an optical input and an optical output and disposing the electro-optic integrated circuit and connector chip within a connector housing.

In accordance with another preferred embodiment of the present invention, the optical element is operative to convert the electrical signal output into the optical input. Alternatively or additionally, the electrical signal processing circuitry is operative to convert the optical output into the electrical signal input. In accordance with another preferred embodiment of the present invention, the electrical signal processing circuitry and the discrete optical element are located on a single planar surface of the substrate. Alternatively, the electrical signal processing circuitry and the discrete optical element are located on different planar surfaces of the substrate.

There is even further provided, in accordance with still another preferred embodiment of the present invention, a multi-fiber connector including a connector housing and a packaged electro-optic integrated circuit and connector chip disposed within the housing, the electro-optic integrated circuit and connector chip including an optical reflector including an optical substrate, at least one microlens formed on a surface of the optical substrate and a first reflective surface formed over the at least one microlens.

Preferably, the first reflective surface is also formed over at least a portion of the surface of the optical substrate. Additionally, the multi-fiber connector also includes at least one second reflective surface formed on at least a portion of an opposite surface of the substrate. In accordance with another preferred embodiment of the present invention at least a portion of the first reflective surface includes a grating. Additionally or alternatively, at least a portion of the second reflective surface includes a grating. Additionally or alternatively, the multi-fiber connector also includes a notch formed in the opposite surface of the substrate.

In accordance with a preferred embodiment of the present invention the at least one microlens is formed by photolithography and thermal reflow forming. Alternatively, the at least one microlens is formed by photolithography using a grey scale mask forming. In accordance with another preferred embodiment of the present invention the at least one microlens is formed by jet printing formation. Additionally or alternatively, the at least one microlens has an index of refraction which closely approximates that of the optical substrate.

There is yet further provided, in accordance with another preferred embodiment of the present invention, a method for producing a multi-fiber connector including forming a packaged electro-optic integrated circuit and connector chip including an optical reflector, the forming including providing an optical substrate, forming at least one microlens on a surface of the optical substrate, coating the at least one microlens with a reflective material and dicing the substrate and disposing the electro-optic integrated circuit and connector chip within a connector housing.

In accordance with another preferred embodiment of the present invention the coating also includes coating at least a portion of the surface of the substrate. Additionally, the method also includes coating at least a portion of an opposite surface of the substrate with a reflective material prior to dicing the substrate.

In accordance with yet another preferred embodiment of the present invention the method also includes forming a grating on at least a portion of the surface prior to coating thereof. Alternatively or additionally, the method also includes forming a grating on at least a portion of the opposite surface prior to coating thereof. In accordance with yet another preferred embodiment of the present invention the method also includes forming a notch in an opposite surface of the substrate prior to dicing the substrate.

In accordance with a preferred embodiment of the present invention the forming includes photolithography and thermal reflow forming. Alternatively, the forming includes photolithography using a grey scale mask forming. Alternatively, the forming includes jet printing formation. Preferably, the at least one microlens has an index of refraction which closely approximates that of the optical substrate.

There is also provided in accordance with still another preferred embodiment of the present invention a multi-fiber connector including a connector housing and a packaged electro-optic integrated circuit and connector chip disposed within the housing, the electro-optic integrated circuit and connector chip including a packaged electro-optical integrated circuit having integrally formed therein an optical connector to an optical fiber.

In accordance with yet another preferred embodiment of the present invention the optical connector includes a pair of elongate locating pin sockets formed over a silicon substrate of the integrated circuit, and extending generally parallel to a surface thereof. Alternatively or additionally, the optical connector includes a linear array of optical fiber ends arranged to have abutment surfaces generally coplanar with an edge of the packaged electro-optical integrated circuit.

There is also provided in accordance with yet another preferred embodiment of the present invention a method for production of a multi-fiber connector including wafer scale formation of a plurality of packaged electro-optic integrated circuit and connector chips each having integrally formed therein an optical connector and electrical connections, the formation including wafer scale formation of a multiplicity of electro-optical circuits onto a substrate, wafer scale provision of at least one optical waveguide on the substrate, wafer scale mounting of at least one integrated circuit component onto the substrate, wafer scale formation of at least one optical pathway providing an optical connection between the at least one integrated circuit component and the at least one optical waveguide, wafer scale formation of at least one mechanical alignment bore on the substrate, wafer scale formation of at least one packaging layer over at least one surface of the substrate and thereafter, dicing of the substrate to define a multiplicity of electro-optic circuits, each having integrally formed therein an optical connector and disposing at least one of the plurality of packaged electro-optic integrated circuit and connector chips within at least one a connector housing.

Preferably, an end of the at least one optical waveguide defines an optical connector interface. In accordance with another preferred embodiment of the present invention the substrate includes a silicon substrate having formed thereon a multiplicity of integrated circuits.

There is yet further provided in accordance with still another preferred embodiment of the present invention a method of forming a multi-fiber connector including a connector housing and a packaged electro-optic integrated circuit and connector chip disposed within the housing, the method including forming an integrated circuit with a multiplicity of electrical connection pads which generally lie along a mounting surface of the integrated circuit, forming an electrical circuit with a multiplicity of electrical connection contacts which generally protrude from a mounting surface of the electrical circuit and employing at least a conductive adhesive to electrically and mechanically join the multiplicity of electrical connection pads to the multiplicity of electrical connection contacts.

In accordance with another preferred embodiment of the present invention the integrated circuit is an electro-optical circuit and the method also includes providing an optically transparent underfill layer intermediate the mounting surface of the integrated circuit and the mounting surface of the electrical circuit.

There is still further provided in accordance with another preferred embodiment of the present invention a method for production of a multi-fiber connector including a connector housing and a packaged electro-optic integrated circuit and connector chip disposed within the housing, including wafer scale formation of a multiplicity of electro-optical circuits onto an active surface of a substrate and wafer scale provision of at least one optical via on the substrate.

In accordance with yet another preferred embodiment of the present invention the wafer scale provision of the at least one optical via includes etching the substrate on a non-active surface of the substrate at a location opposite a region of the active surface generally free of circuitry, thereby to define at least one cavity whose bottom surface is translucent and filling the at least one cavity with a transparent material. Additionally or alternatively, the method also includes attaching a semiconductor element in optical engagement with the at least one optical via. Preferably, the transparent material has an index of refraction similar to that employed along at least one optical path in the electro-optical circuit communicating therewith.

There is also provided in accordance with still another preferred embodiment of the present invention a method for production of a multi-fiber connector including forming a packaged electro-optic integrated circuit and connector chip, the forming comprising forming electrical circuitry on a first side of a wafer, forming an optical assembly on a second side of the wafer and forming an optical connection between first and second sides of the wafer, through the wafer, thereby providing optical communication between the electrical circuitry and the optical assembly through the wafer and disposing the packaged electro-optic integrated circuit and connector chip on a connector housing.

In accordance with another preferred embodiment of the present invention the method also includes dicing the wafer to define a multiplicity of integrated circuits each having formed thereon electrical circuitry on a first side of the integrated circuit, an optical assembly on a second side of the integrated circuit and an optical connection between the first and second sides of the integrated circuit, thereby providing optical communication between the electrical circuitry and the optical assembly.

In accordance with another preferred embodiment of the present invention the connector housing complies with at least one of the following standards: ANSI/TIA-604-5B-2—FOCIS 5—Fiber Optic Connector Intermateability Standard—Type MPO; ANSI/TIA-604-12—FOCIS 12—Fiber Optic Connector Intermateability Standard Type MT-RJ; IEC61754-5—Fibre optic connector interfaces—Part 5: Type MT connector family; IEC61754-7—Fibre optic connector interfaces—Part 7: Type MPO connector family; IEC-61754-10—Fibre optic connector interfaces—Part 10: Type Mini-MPO connector family; IEC-61754-18—Fibre optic connector interfaces—Part 18: Type MT-RJ connector family; Tyco Electronics Lightray MPX™ connector and US-Conec MTP™ Connectors.

There is further provided in accordance with another preferred embodiment of the present invention a micro optical concave reflector including an optical substrate, at least one concave microlens formed on a surface of the optical substrate and a reflective surface formed over the at least one microlens.

In accordance with another preferred embodiment of the present invention the micro optical concave reflector also includes a protective layer formed over the reflective surface.

There is even further provided in accordance with another preferred embodiment of the present invention a micro optical reflector including an optical substrate, at least one microlens formed on a surface of the optical substrate, a reflective surface formed over the at least one microlens and a protective layer formed over the reflective surface.

There is further provided in accordance with another preferred embodiment of the present invention a method for production of a micro optical reflector including providing an optical substrate, forming at least one microlens on a surface of the optical substrate, forming a reflective surface over the at least one microlens and forming a protective layer over the reflective surface.

In accordance with another preferred embodiment of the present invention the optical substrate is formed of glass and the protective layer is formed of a heat-resistant material selected from the group consisting of glass, silicon, alumina and ceramic.

There is still further provided in accordance with still another preferred embodiment of the present invention a micro optical reflector including an optical substrate, at least one microlens formed on a surface of the optical substrate and a reflective surface formed over the at least one microlens, and wherein the at least one microlens has a focus at a location beyond the optical substrate.

There is also provided in accordance with another preferred embodiment of the present invention a method for production of a micro optical concave reflector including providing an optical substrate, forming at least one concave microlens on a surface of the optical substrate and forming a reflective surface over the at least one microlens.

In accordance with another preferred embodiment of the present invention, the method also includes forming a protective layer over the reflective surface.

There is also provided in accordance with yet another preferred embodiment of the present invention a method for production of a micro optical reflector including providing an optical substrate, forming at least one microlens on a surface of the optical substrate and forming a reflective surface over the at least one microlens, and wherein the at least one microlens has a focus at a location beyond the optical substrate.

BRIEF DESCRIPTION OF THE DRAWINGS

The present invention will be appreciated more fully from the following detailed description, taken in conjunction with the drawings in which:

FIGS. 7A, 7B, 7C, 7D, 7E and 7F are simplified pictorial and sectional illustrations of a first plurality of stages in the manufacture of the packaged electro-optic circuit of FIGS. 6A and 6B;

FIGS. 8A, 8B, 8C, 8D, 8E, 8F, 8G, 8H, 8I and 8J are simplified pictorial and sectional illustrations of a second plurality of stages in the manufacture of the packaged electro-optic circuit of FIGS. 6A and 6B;

FIGS. 10A, 10B and 10C are enlarged simplified optical illustrations of a portion of FIG. 9D in accordance with various preferred embodiments of the present invention;

FIGS. 17A, 17B, 17C, 17D and 17E are simplified sectional illustrations of further stages in the production of the electro-optic integrated circuit of FIG. 16;

FIGS. 25A, 25B and 25C are enlarged simplified optical illustrations of a portion of FIG. 24 in accordance with other embodiments of the present invention;

FIGS. 26A, 26B, 26C, 26D and 26E are simplified pictorial illustrations of stages in the production of a packaged electro-optic integrated circuit constructed and operative in accordance with still another preferred embodiment of the present invention;

FIGS. 36A, 36B, 36C, 36D, 36E, 36F and 36G are simplified pictorial and sectional illustrations of a plurality of stages in the manufacture of the packaged electro-optic circuit of FIGS. 35A and 35B;

FIGS. 37A, 37B, 37C, 37D and 37E are simplified pictorial and sectional illustrations of a further plurality of stages in the manufacture of the packaged electro-optic circuit of FIGS. 35A and 35B;

FIG. 38 is a simplified pictorial illustration corresponding to sectional illustration FIG. 22B;

FIG. 39 is a simplified pictorial illustration corresponding to sectional illustrations FIGS. 22C, 22D and 24;

FIG. 41 is a simplified illustration of incorporation of packaged electro-optic circuits of the type shown in FIGS. 35A and 35B as parts of a larger electrical circuit.

DETAILED DESCRIPTION OF PREFERRED EMBODIMENTS

Figure 1A:
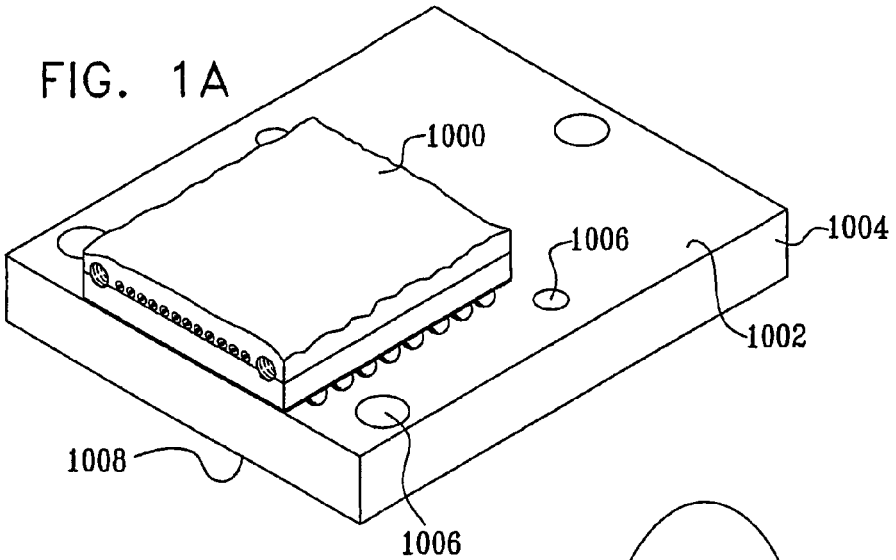
FIGS. 1A, 1B, 1C and 1D are simplified pictorial illustrations of assembly of a multi-fiber connector constructed and operative in accordance with a preferred embodiment of the present invention.
Figure 1B:
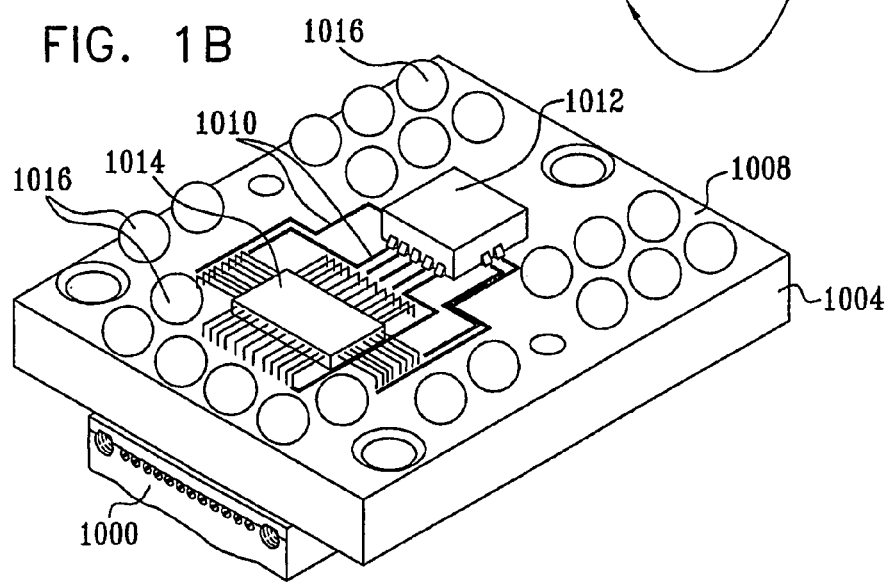

Reference is now made to FIGS. 1A, 1B, 1C and 1D, which are simplified pictorial illustrations of assembly of a multi-fiber connector constructed and operative in accordance with a preferred embodiment of the present invention. As seen in FIGS. 1A and 1B, a packaged electro-optic integrated circuit and connector chip 1000 is surface mounted onto a first surface 1002 of a printed circuit board 1004 preferably having formed therein a plurality of mounting apertures 1006. An opposite surface 1008 of printed circuit board 1004 has formed thereon electrical circuitry 1010, preferably including both passive and active components, such as a microcontroller 1012 and a laser driving circuit 1014. Solder balls 1016 are also preferably formed on surface 1008 and have a height which exceeds the height of the highest component of the electrical circuitry 1010. As will be described hereinbelow with reference to FIGS. 5A and 5B, solder balls 1016 are preferably employed for mounting the multi-fiber connector onto a printed circuit board (not shown).

Figure 1C:
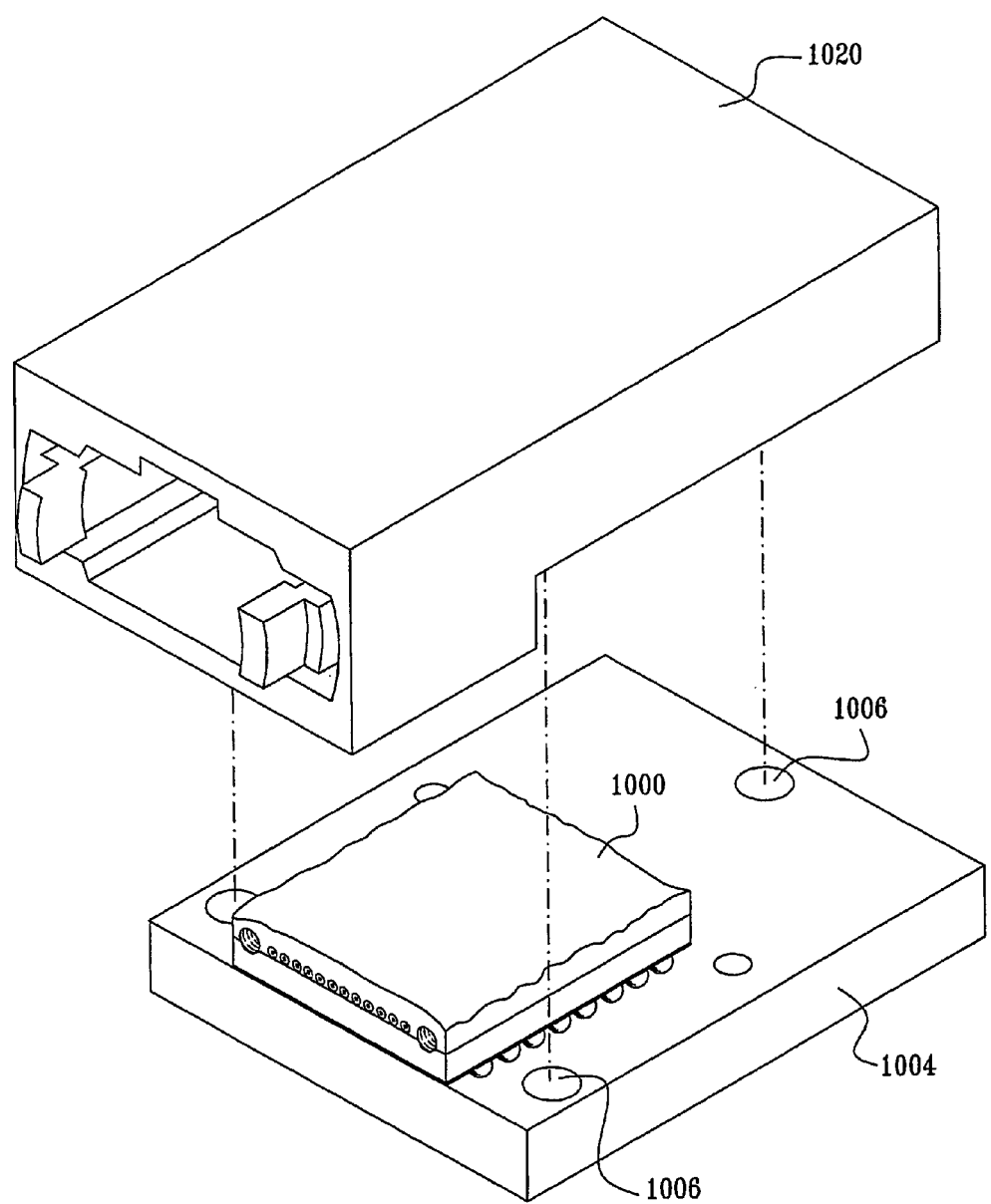
Figure 1D:
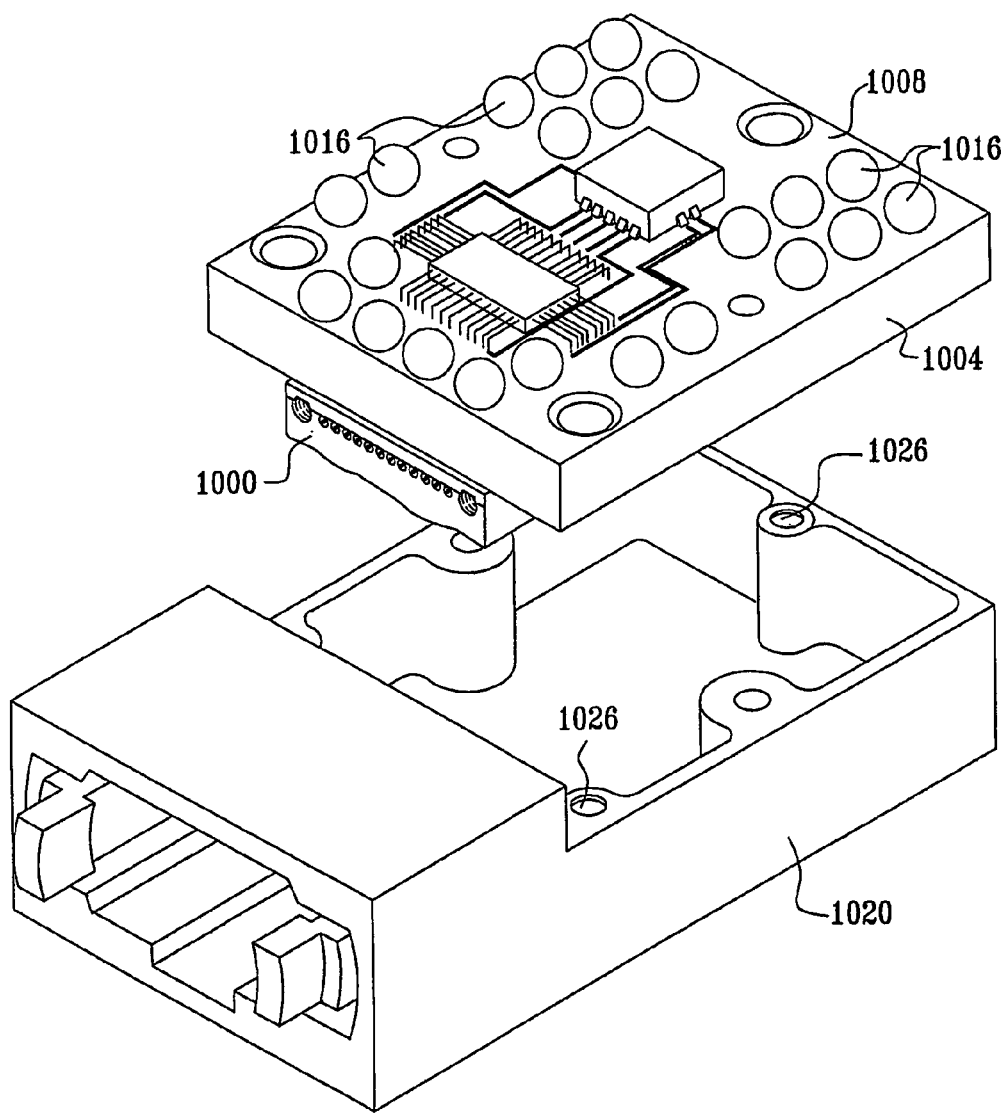

Reference is now made to FIGS. 1C and 1D, which show the assembly of printed circuit board 1004, having chip 1000 mounted thereon, into a standard MPO type fiber optic connector housing 1020. Rivets or other fasteners (not shown) are preferably employed for engaging mounting apertures 1006 and corresponding mounting apertures 1026 formed in housing 1020. It is seen that surface 1008 and its solder balls 1016 are exposed.

Figure 2A:
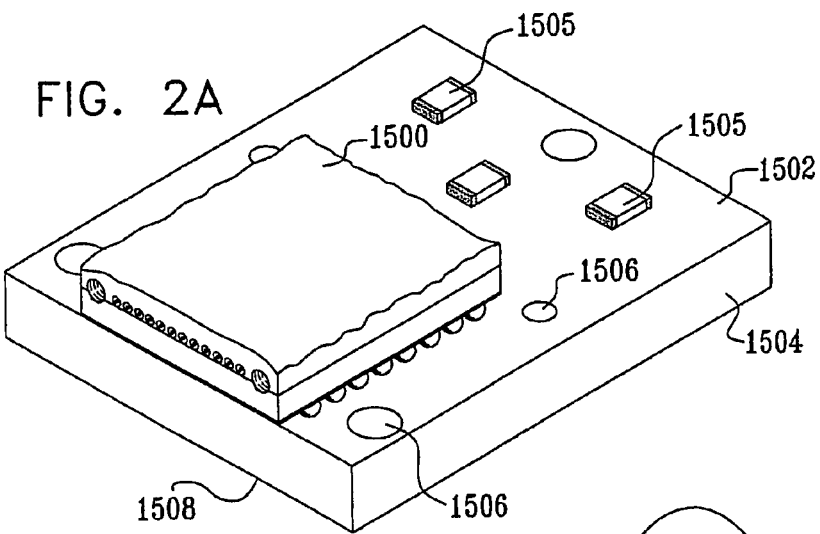
FIGS. 2A, 2B, 2C, and 2D are simplified pictorial illustrations of assembly of a multi-fiber connector constructed and operative in accordance with another preferred embodiment of the present invention.
Figure 2B:
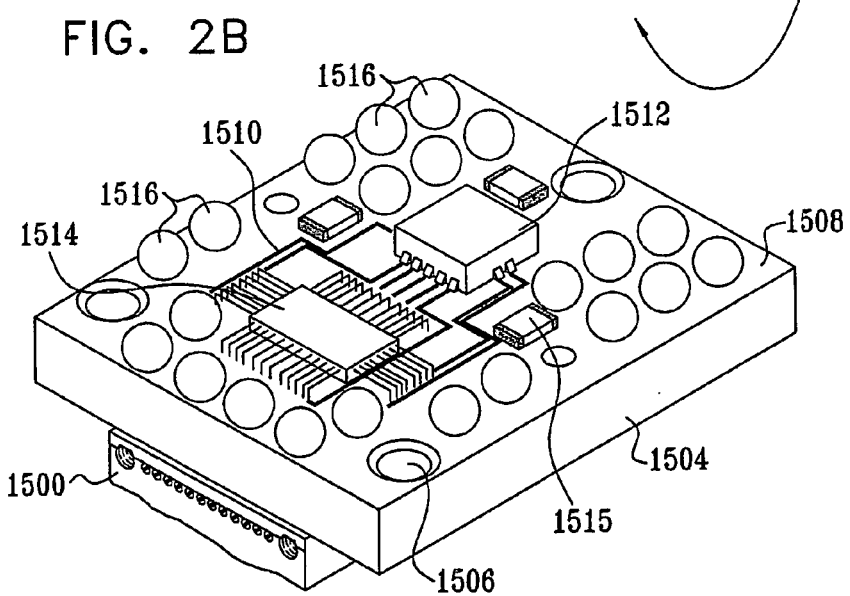

Reference is now made to FIGS. 2A, 2B, 2C and 2D, which are simplified pictorial illustrations of assembly of a multi-fiber connector constructed and operative in accordance with another preferred embodiment of the present invention. As seen in FIGS. 2A and 2B, a packaged electro-optic integrated circuit and connector chip 1500 is surface mounted onto a first surface 1502 of a printed circuit board 1504 preferably having formed therein passive components 1505 such as resistors or capacitors. A plurality of mounting apertures 1506 are preferably formed in printed circuit board 1504. An opposite surface 1508 of printed circuit board 1504 has formed thereon electrical circuitry 1510, preferably including both passive and active components, such as a microcontroller 1512, a laser driving circuit 1514 and resistors and capacitors 1515. Solder balls 1516 are also preferably formed on surface 1508 and have a height which exceeds the height of the highest component of the electrical circuitry 1510. As will be described hereinbelow with reference to FIGS. 5A and 5B, solder balls 1516 are preferably employed for mounting the multi-fiber connector onto a printed circuit board (not shown).

Figure 2C:
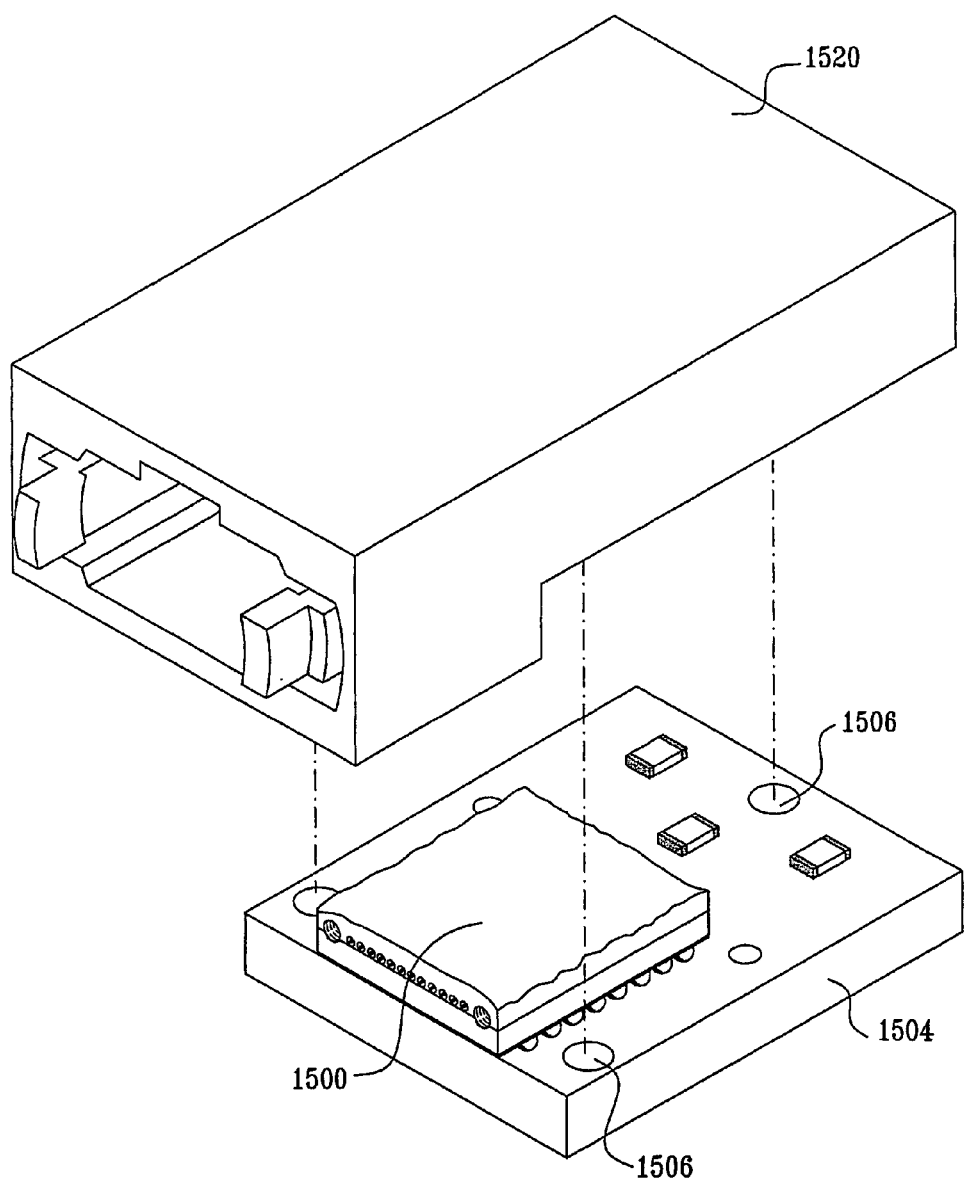
Figure 2D:
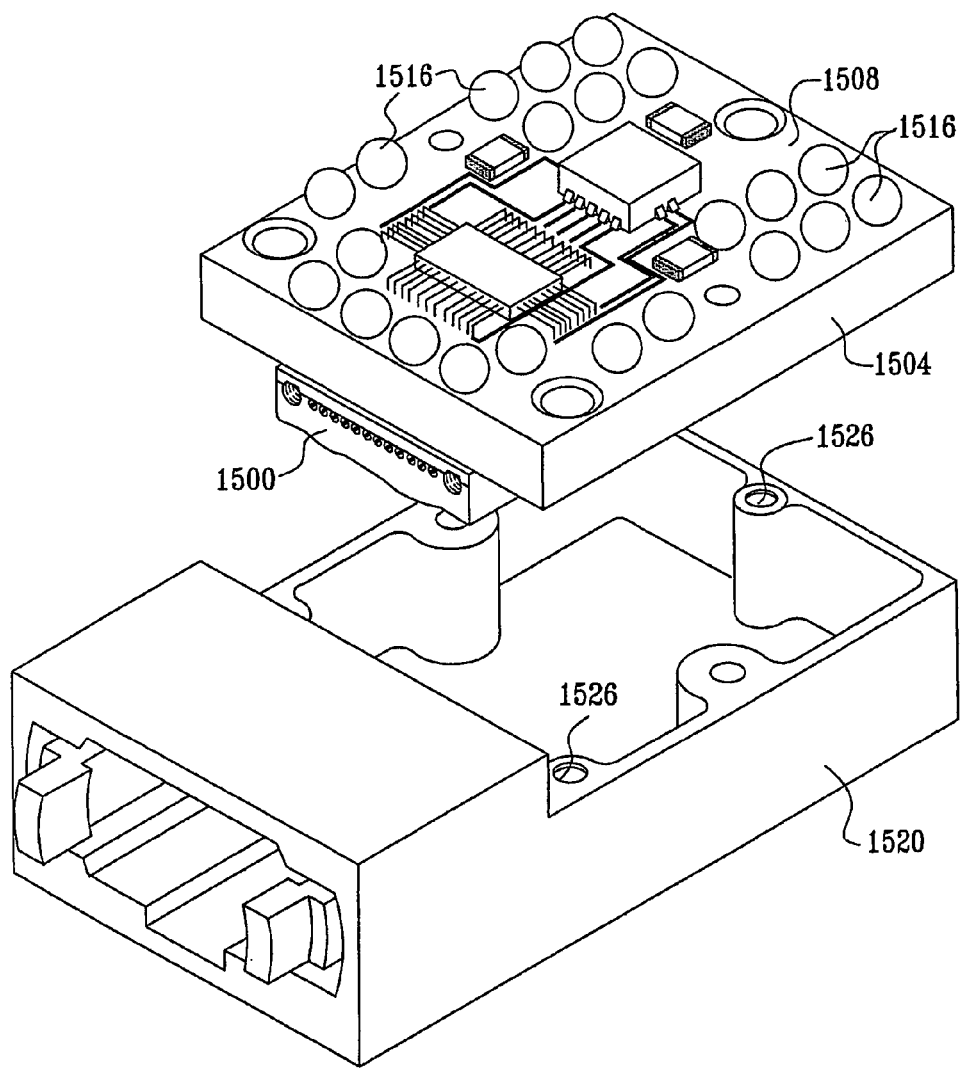

Reference is now made to FIGS. 2C and 2D, which show the assembly of printed circuit board 1504, having chip 1500 mounted thereon, into a standard MPO type fiber optic connector housing 1520. Rivets or other fasteners (not shown) are preferably employed for engaging mounting apertures 1506 and corresponding mounting apertures 1526 formed in housing 1520. It is seen that surface 1508 and its solder balls 1516 are exposed.

Figure 3A:
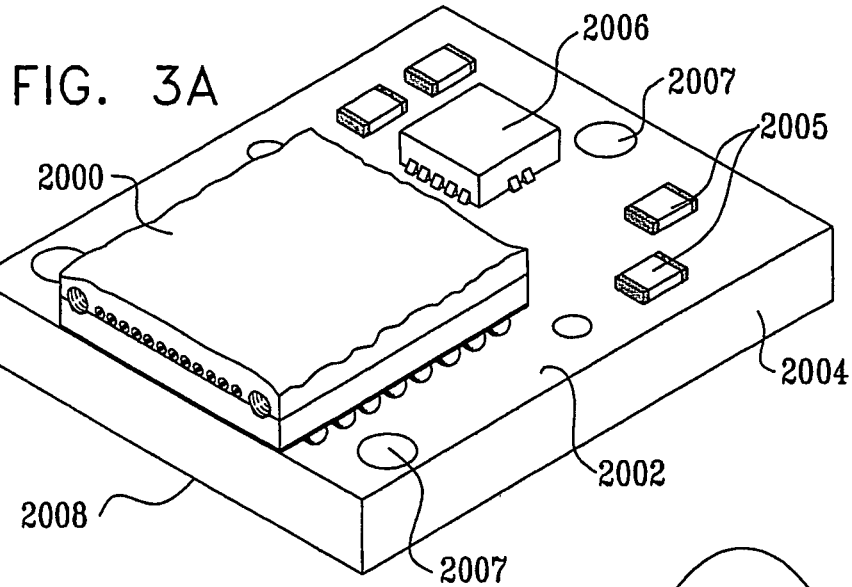
FIGS. 3A, 3B, 3C and 3D are simplified pictorial illustrations of assembly of a multi-fiber connector constructed and operative in accordance with still another preferred embodiment of the present invention.
Figure 3B:
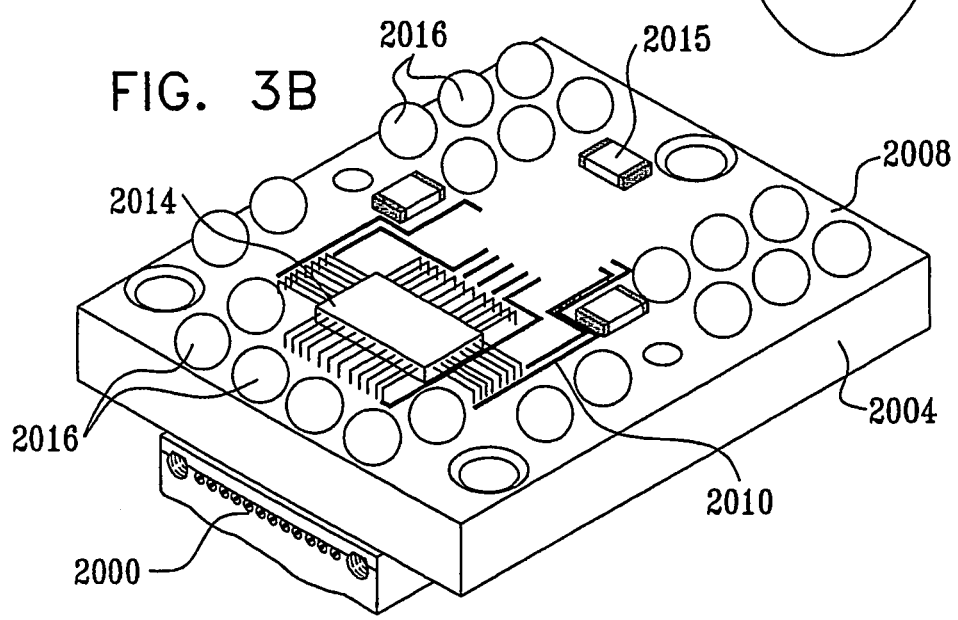

Reference is now made to FIGS. 3A, 3B, 3C and 3D, which are simplified pictorial illustrations of assembly of a multi-fiber connector constructed and operative in accordance with another preferred embodiment of the present invention. As seen in FIGS. 3A and 3B, a packaged electro-optic integrated circuit and connector chip 2000 is surface mounted onto a first surface 2002 of a printed circuit board 2004, preferably having formed therein passive components 2005, such as resistors or capacitors and active components such as a microcontroller 2006. A plurality of mounting apertures 2007 are preferably formed in printed circuit board 2004. An opposite surface 2008 of printed circuit board 2004 has formed thereon electrical circuitry 2010, preferably including both passive and active components, such as a laser driving circuit 2014 and resistors and capacitors 2015. Solder balls 2016 are also preferably formed on surface 2008 and have a height which exceeds the height of the highest component of the electrical circuitry 2010. As will be described hereinbelow with reference to FIGS. 5A and 5B, solder balls 2016 are preferably employed for mounting the multi-fiber connector onto a printed circuit board (not shown).

Figure 3C:
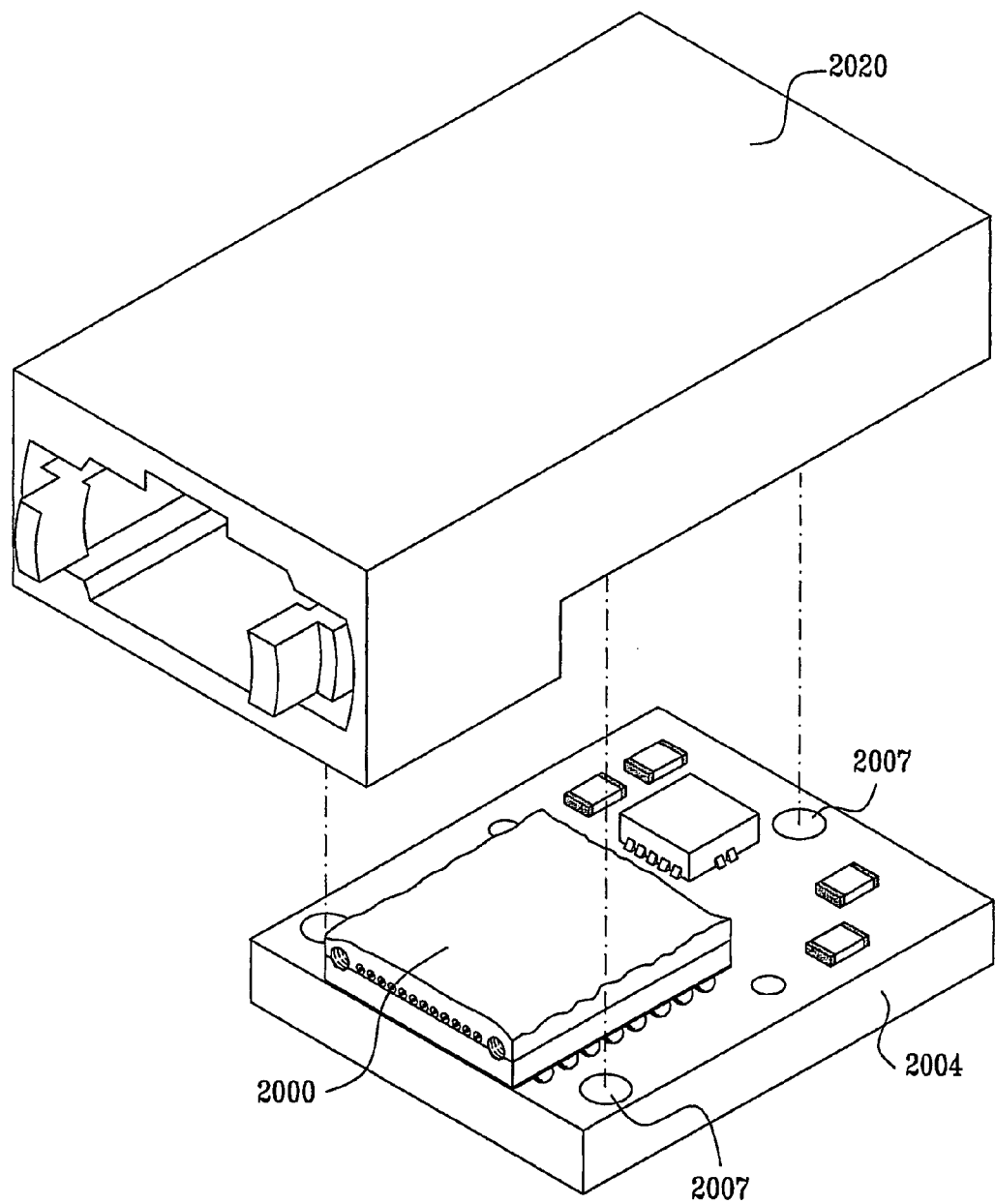
Figure 3D:
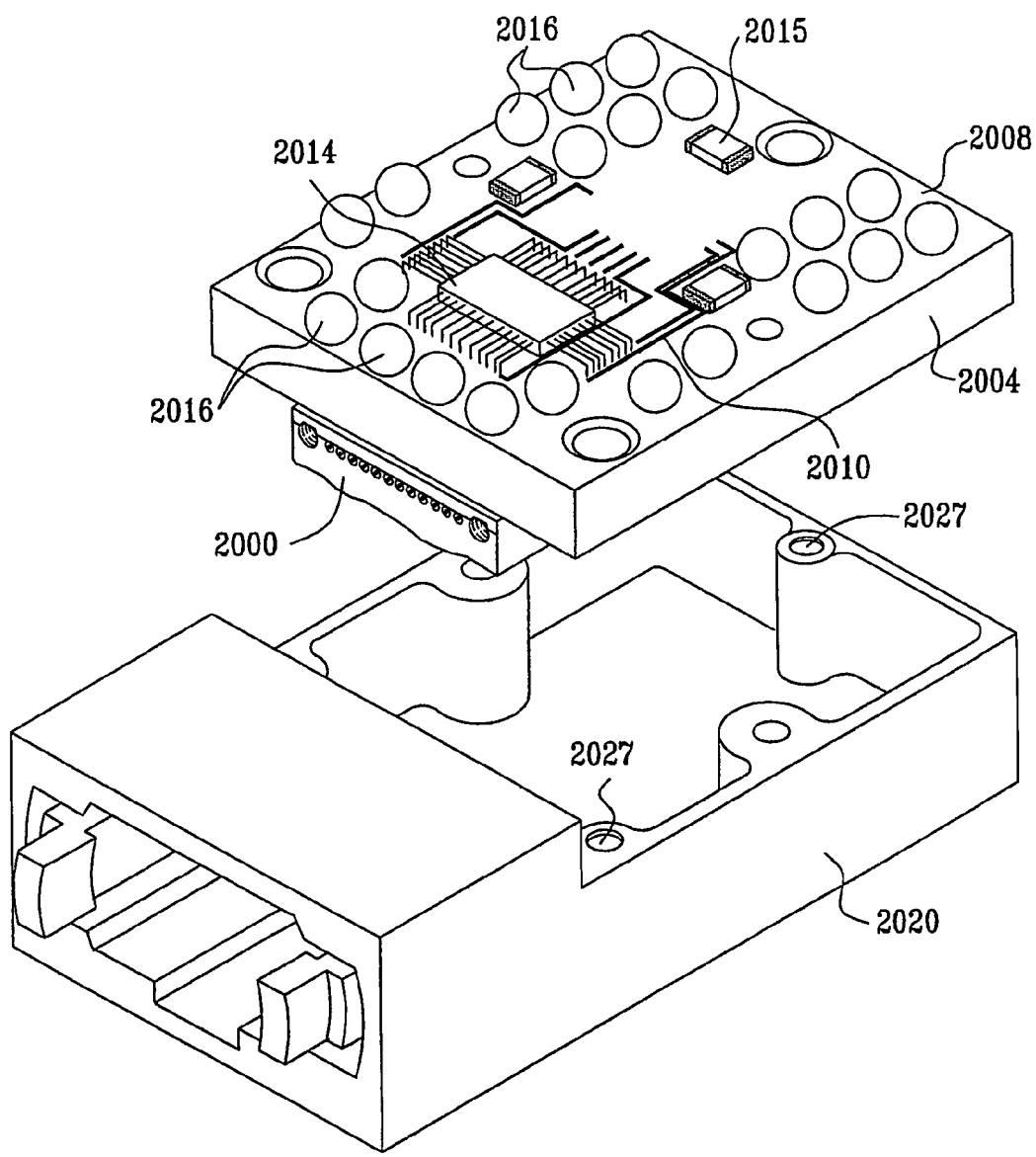

Reference is now made to FIGS. 3C and 3D, which shows the assembly of printed circuit board 2004, having chip 2000 mounted thereon, into a standard MPO type fiber optic connector housing 2020. Rivets or other fasteners (not shown) are preferably employed for engaging mounting apertures 2007 and corresponding mounting apertures 2027 formed in housing 2020. It is seen that surface 2008 and its solder balls 2016 are exposed.

Figure 4A:
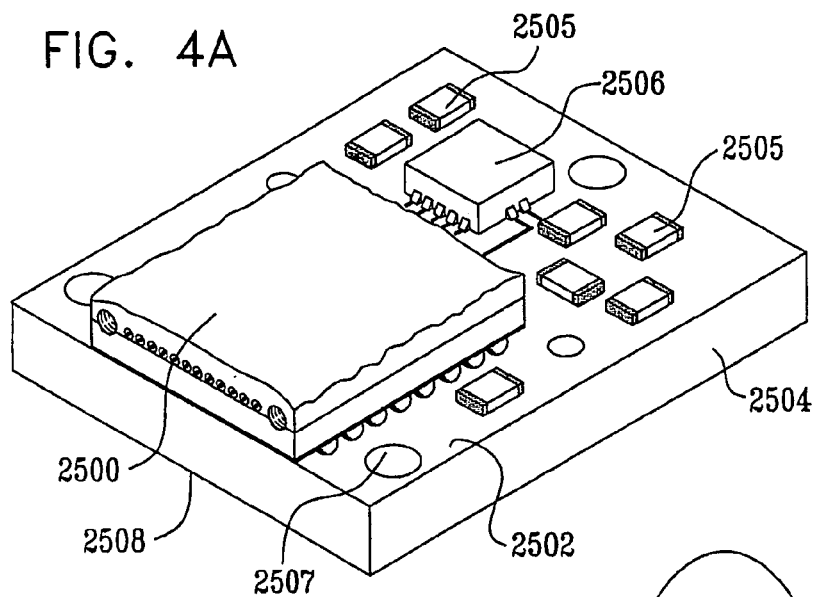
FIGS. 4A, 4B, 4C, and 4D are simplified pictorial illustrations of assembly of a multi-fiber connector constructed and operative in accordance with yet another preferred embodiment of the present invention.
Figure 4B:
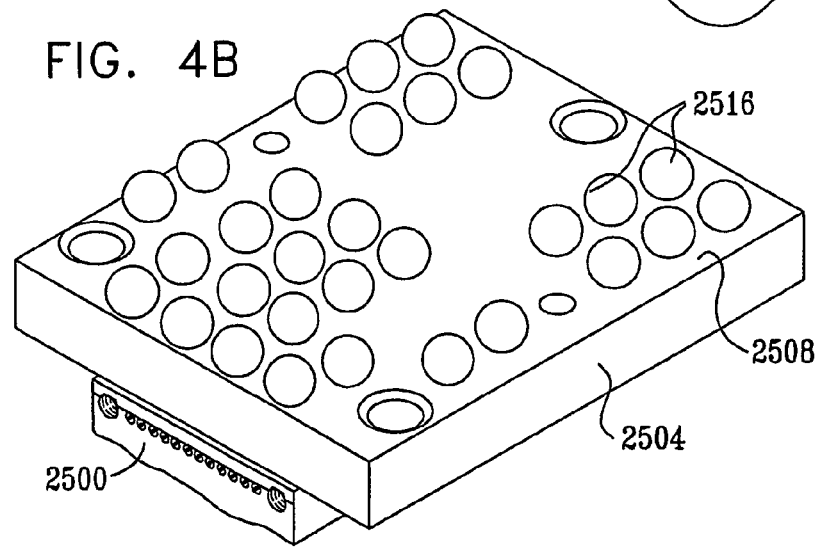

Reference is now made to FIGS. 4A, 4B, 4C and 4D, which are simplified pictorial illustrations of assembly of a multi-fiber connector constructed and operative in accordance with another preferred embodiment of the present invention. As seen in FIGS. 4A and 4B, a packaged electro-optic integrated circuit and connector chip 2500 is surface mounted onto a first surface 2502 of a printed circuit board 2504, preferably having formed therein passive components, such as resistors or capacitors 2505 and active components such as a microcontroller 2506. A laser driver and/or other active components which are mounted onto the printed circuit board in the embodiments of FIGS. 1A-3D may be embedded into the chip 2500. A plurality of mounting apertures 2507 are preferably formed in printed circuit board 2504. An opposite surface 2508 of printed circuit board 2504 has formed thereon solder balls 2516. As will be described hereinbelow with reference to FIGS. 5A and 5B, solder balls 2516 are preferably employed for mounting the multi-fiber connector onto a printed circuit board.

Figure 4C:
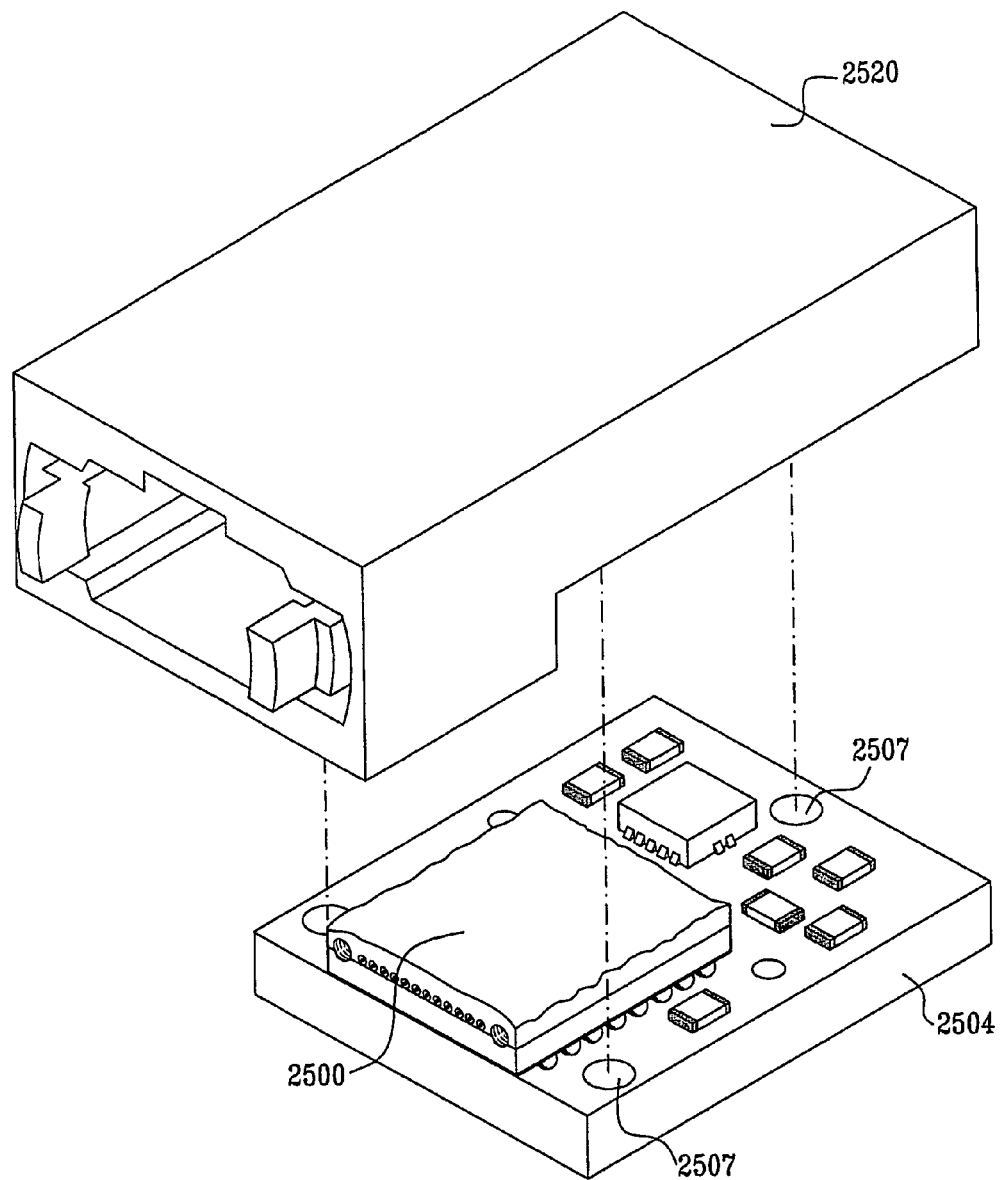
Figure 4D:
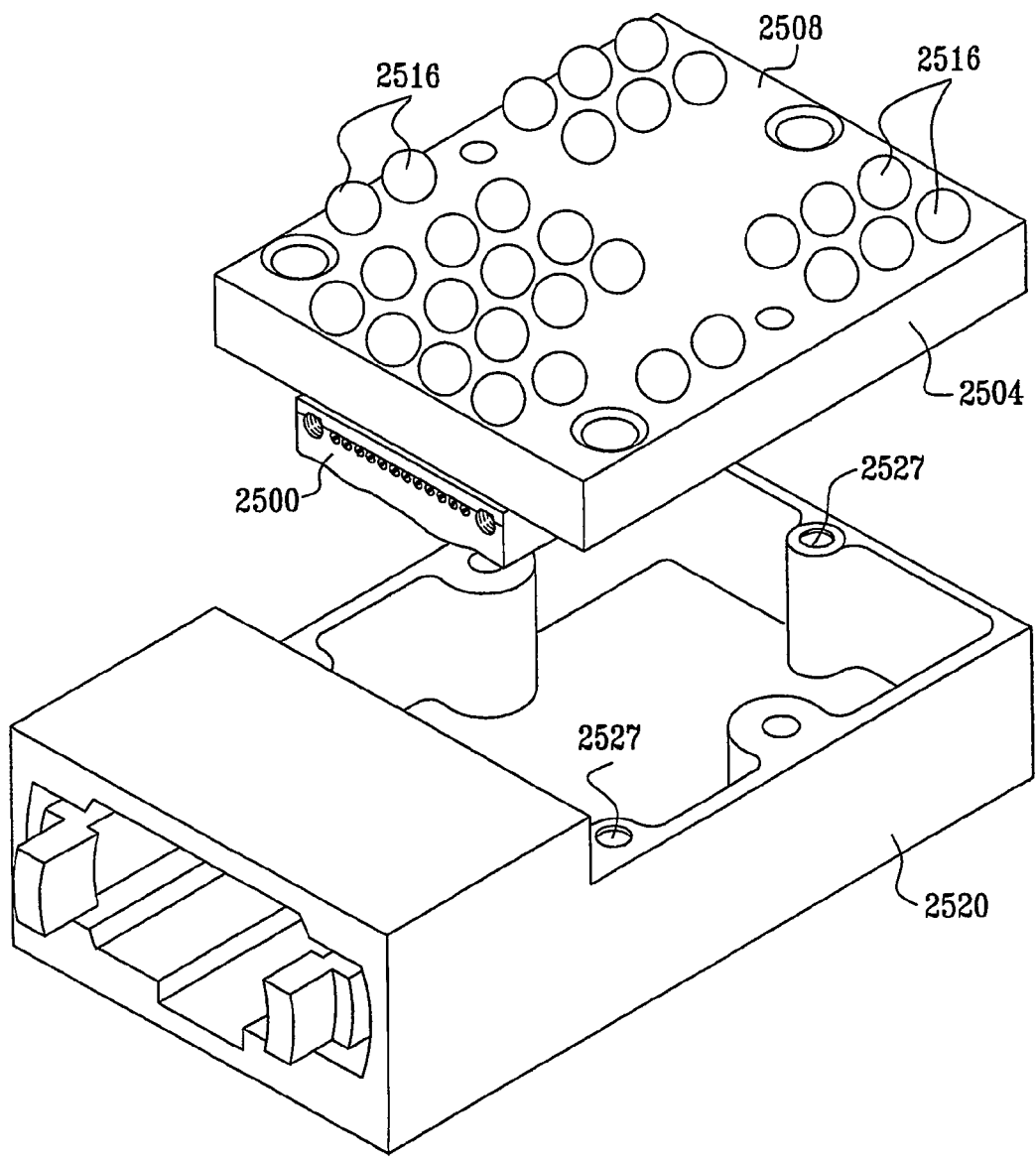

Reference is now made to FIGS. 4C and 4D, which show the assembly of printed circuit board 2504, having chip 2500 mounted thereon, into a standard MPO type fiber optic connector housing 2520. Rivets or other fasteners (not shown) are preferably employed for engaging mounting apertures 2507 and corresponding mounting apertures 2527 formed in housing 2520. It is seen that surface 2508 and its solder balls 2516 are exposed.

Figure 5A:
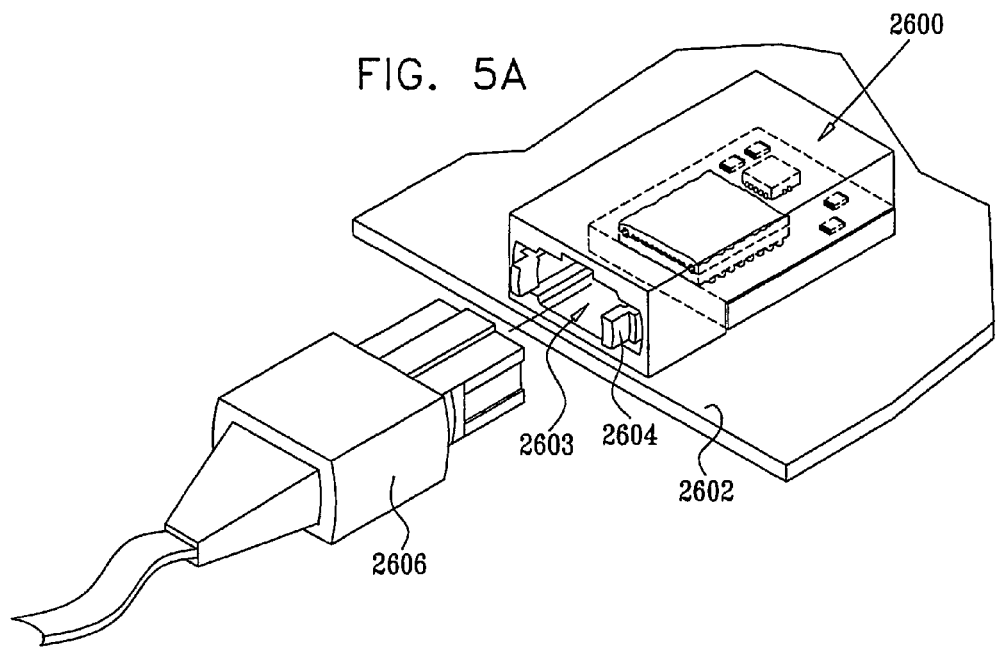
FIGS. 5A and 5B are illustrations of a PCB mounted MPO type fiber optic connector, constructed as shown in any of FIGS. 1A-4D, and a corresponding plug respectively in mutually unconnected and connected orientations.
Figure 5B:
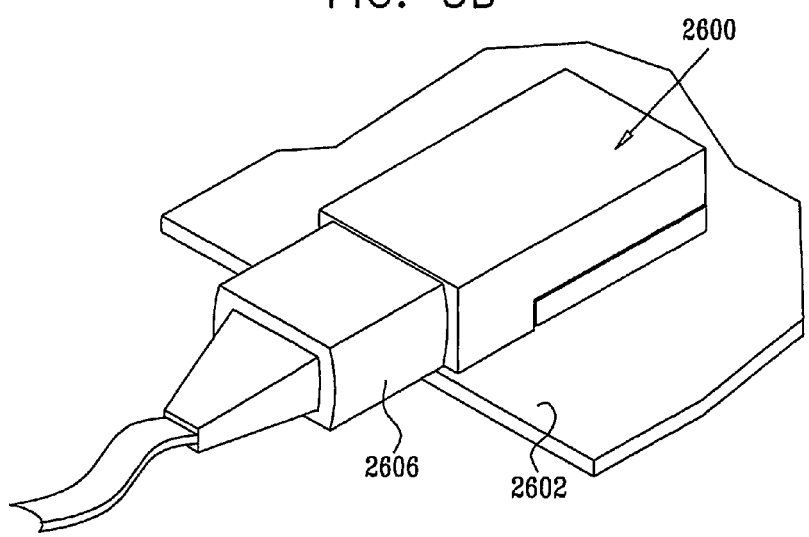

Reference is now made to FIGS. 5A and 5B, which are illustrations of an MPO type fiber optic connector 2600, constructed as shown in any of FIGS. 1A-4D, mounted onto a printed circuit board 2602, preferably by means of solder balls (not shown) corresponding to solder balls 1016, 1516, 2016 and 2516, in the embodiments of FIGS. 1A-1D, 2A-2D, 3A-3D and 4A-4D, respectively. It is seen that the standard connector housing, here designated by reference numeral 2603, is preferably integrally formed with side latches 2604 for selectably retaining a corresponding plug 2606.

Reference is now made to FIGS. 6A-41 which illustrate preferred embodiments of a packaged electro-optic integrated circuit and connector chip, such as chips 1000, 1500, 2000 and 2500, in the embodiments of FIGS. 1A-1D, 2A-2D, 3A-3D and 4A-4D, respectively.

Figure 6A:
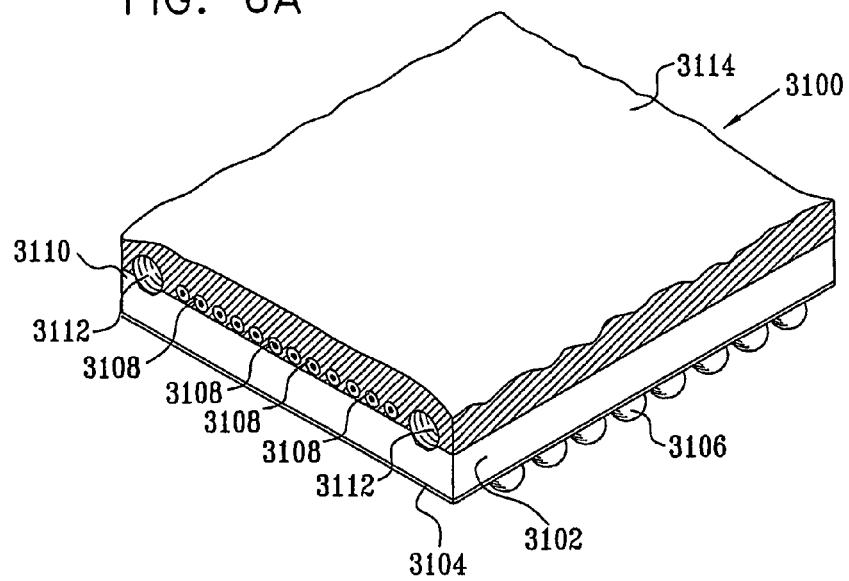
FIGS. 6A and 6B are simplified pictorial illustrations of a packaged electro-optic integrated circuit having integrally formed therein an optical connector and electrical connections, alone and in conjunction with a conventional optical connector.

Reference is now made to FIGS. 6A and B, which are simplified pictorial illustrations of a packaged electro-optic integrated circuit 3100, having integrally formed therein an optical connector and electrical connections, alone and in conjunction with a conventional optical connector.

Figure 6B:
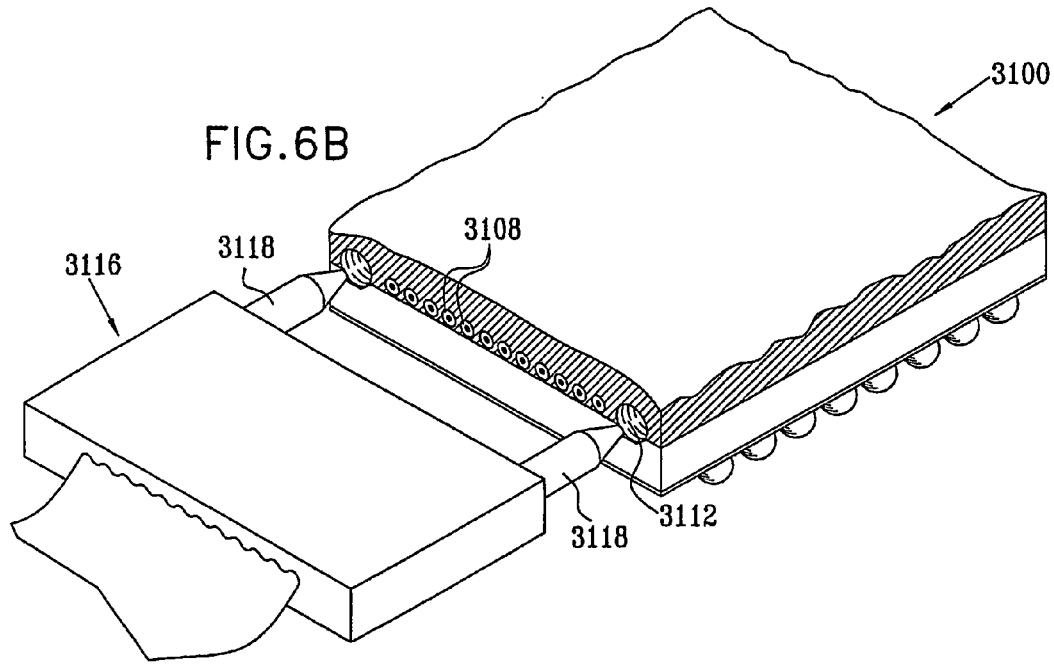

As seen in FIGS. 6A and 6B, a packaged electro-optic integrated circuit 3100 is provided in accordance with a preferred embodiment of the present invention and includes an at least partially transparent substrate 3102, typically glass. Electrical circuitry (not shown) is formed, as by conventional photolithographic techniques, over one surface of substrate 3102 and is encapsulated by a layer 3104 of a protective material, such as BCB, commercially available from Dow Corning of the U.S.A. An array 3106 of electrical connections, preferably in the form of conventional solder bumps, communicates with the electrical circuitry via conductive pathways (not shown) extending through the protective material of layer 3104.

Formed on a surface of substrate 3102 opposite to that adjacent layer 3104 there are defined optical pathways (not shown) which communicate with an array of optical fibers 3108, whose ends are aligned along an edge 3110 of the substrate 3102. Preferably, physical alignment bores 3112 are aligned with the array of optical fibers 3108. The bores 3112 are preferably defined by cylindrical elements, which, together with the optical fibers 3108 and the optical pathways, are encapsulated by a layer 3114 of protective material, preferably epoxy.

FIG. 6B shows a conventional MPO type optical connector 3116, such as an MPO connector manufactured by SENKO Advanced Components, Inc. of Marlborough, Mass., USA., arranged for mating contact with the packaged electro-optic circuit 3100, wherein alignment pins 3118 of connector 3116 are arranged to seat in alignment bores 3112 of the electro-optic circuit 3100 and optical fiber ends (not shown) of connector 3116 are arranged in butting aligned relationship with the ends of the array 3108 of optical fibers in packaged electro-optic circuit 3100.

Figure 7A:
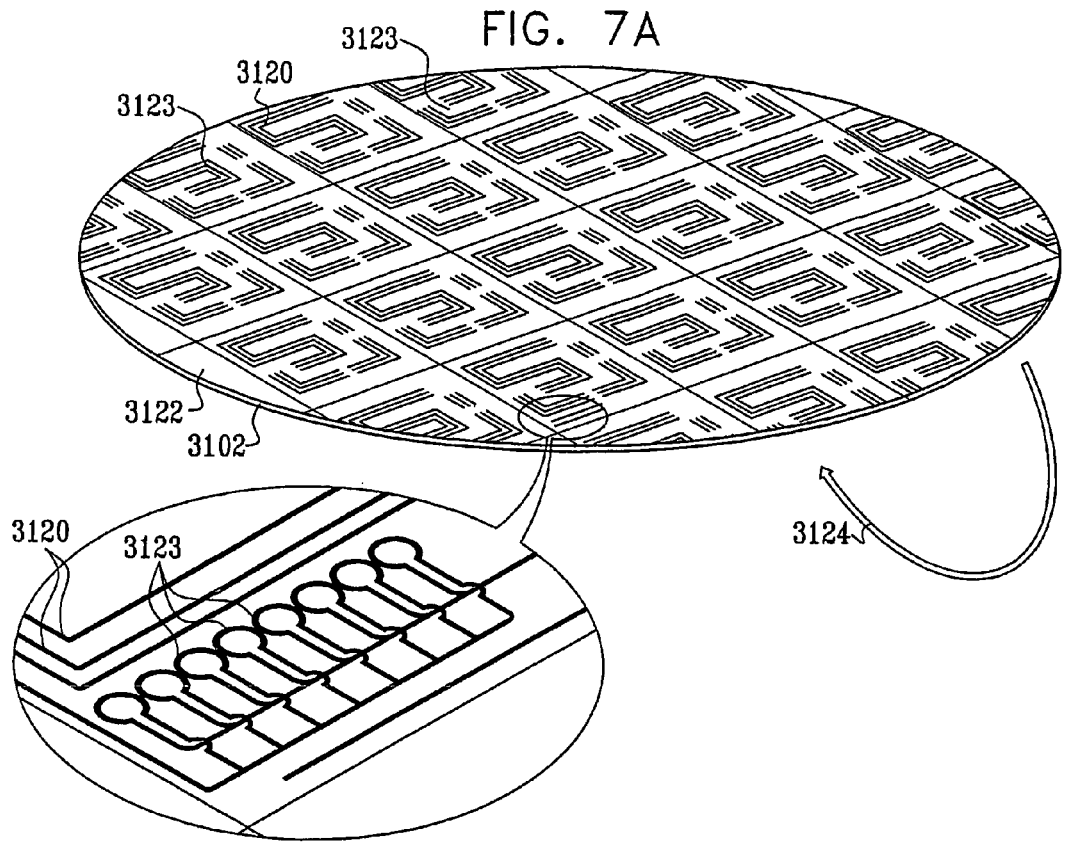

Reference is now made to FIGS. 7A, 7B, 7C, 7D, 7E and 7F, which are simplified pictorial and sectional illustrations of a first plurality of stages in the manufacture of the packaged electro-optic circuit of FIGS. 6A and 6B. Turning to FIG. 7A, it is seen that electrical circuits 3120 are preferably formed onto a first surface 3122 of substrate 3102, at least part of which is transparent to light within at least part of the wavelength range of 600-1650 nm. Preferably light detector arrays 3123 are also formed on surface 3122 of substrate 3102 and connected to electrical circuits 3120. Substrate 3102 is preferably of thickness between 200-800 microns. The electrical circuits 3120 are preferably formed by conventional photolithographic techniques employed in the production of integrated circuits. The light detector arrays 3123 are preferably formed by chemical deposition and lithography and may comprise, for example, poly-silicon, amorphous silicon, lead sulfide, lead selenide and HgCdTe. The light detector arrays 3123 may advantageously be employed to monitor individual outputs of individual lasers in a laser array embedded in a packaged electro-optic integrated circuit and connector chip, such as chips 1000, 1500, 2000 and 2500, in the embodiments of FIGS. 1A-1D, 2A-2D, 3A-3D and 4A-4D, respectively.

Figure 7B:
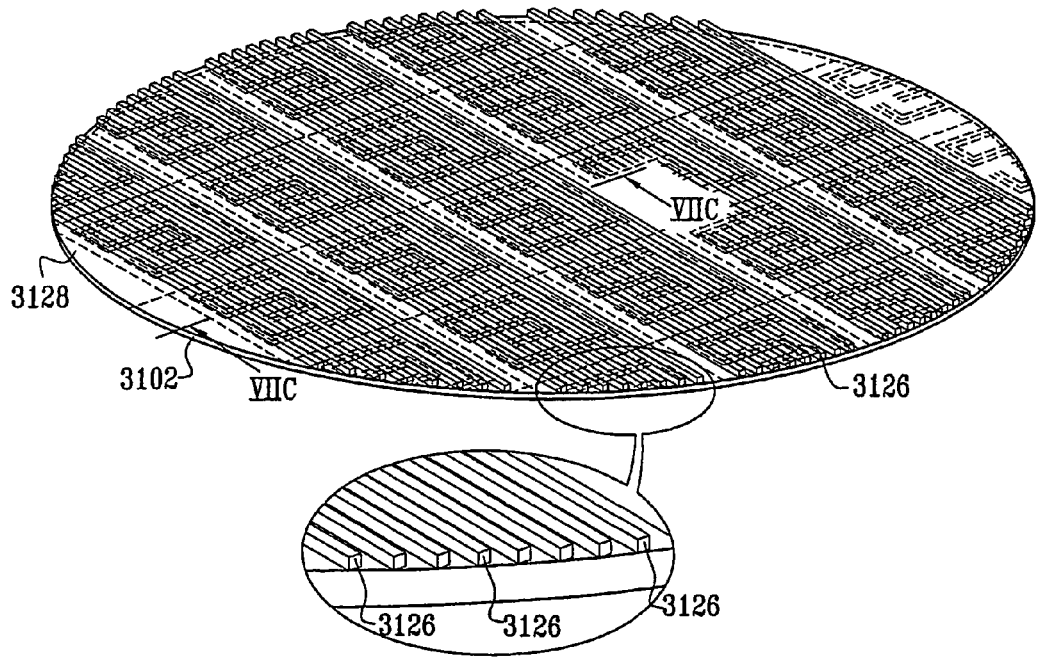

The substrate shown in FIG. 7A is turned over, as indicated by an arrow 3124 and, as seen in FIG. 7B, an array of parallel, spaced, elongate optical fiber positioning elements 3126 is preferably formed, such as by conventional photolithographic techniques, over an opposite surface 3128 of substrate 3102. It is appreciated that the positions of the array of elements 3126 on surface 3128 are preferably precisely coordinated with the positions of the electrical circuits 3120 on first surface 3122 of the substrate 3102, as shown in FIG. 7C.

Turning to FIG. 7D, it is seen that notches 3130 are preferably formed on surface 3128, as by means of a dicing blade 3132, to precisely position and accommodate alignment bore defining cylinders 3134, as shown in FIG. 7E. FIG. 7E illustrates that the centers of alignment bore defining cylinders 3134 preferably lie in the same plane as the centers 3136 of optical fibers 3108 which are precisely positioned between elements 3126 on surface 3128. FIG. 7F illustrates encapsulation of the fibers 3108, the cylinders 3134 and the positioning elements 3126 by layer 3114 of protective material, preferably epoxy.

Figure 8A:
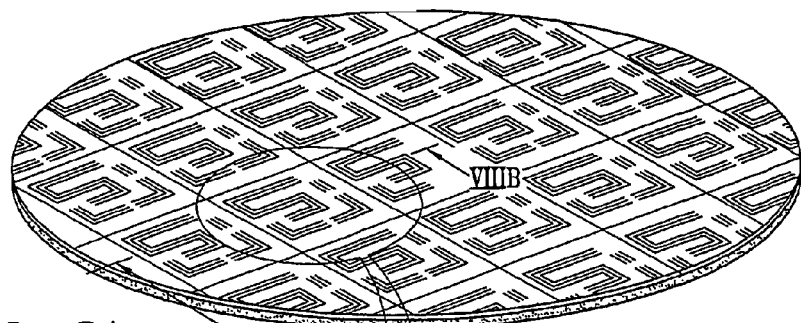

Reference is now made to FIGS. 8A, 8B, 8C, 8D, 8E, 8F, 8G, 8H, 8I and 8J, which are simplified pictorial and sectional illustrations of a second plurality of stages in the manufacture of the packaged electro-optic circuit of FIGS. 6A and 6B. FIG. 8A shows the wafer of FIG. 7F turned over.

Figure 8B:
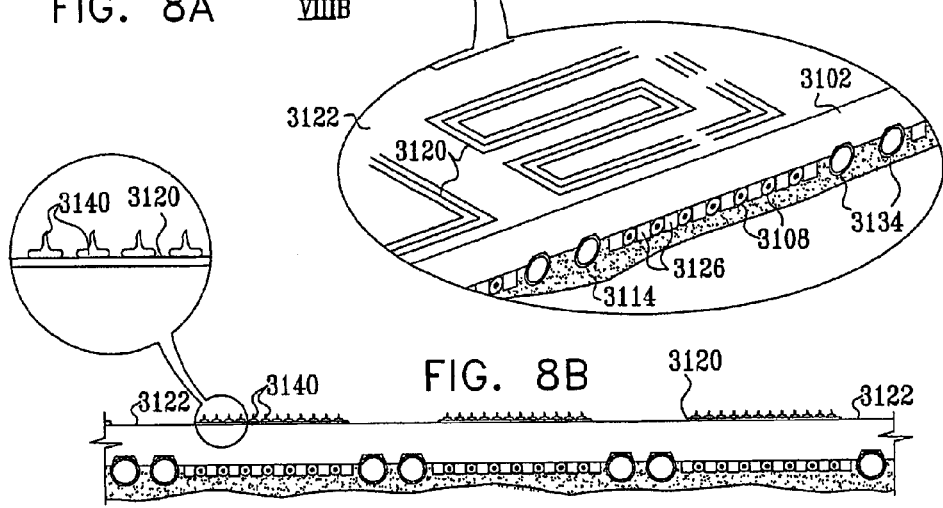
Figure 8C:
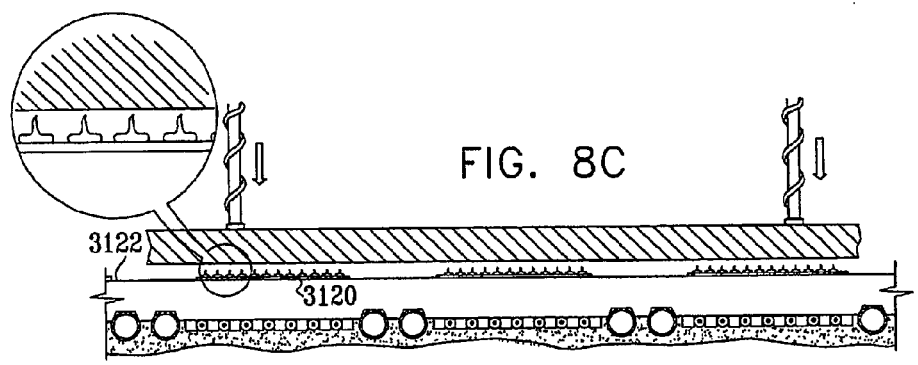

As shown in FIG. 8B, a multiplicity of studs 3140, preferably gold studs, are formed onto electrical circuits 3120 lying on surface 3122. The studs 3140 are preferably flattened or "coined", as shown schematically in FIG. 8C, to yield a multiplicity of flattened electrical contacts 3142, as shown in FIG. 8D.

Figure 8D:
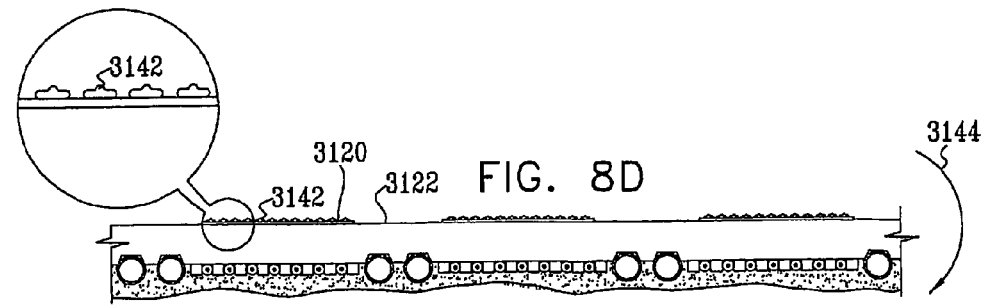
Figure 8E:
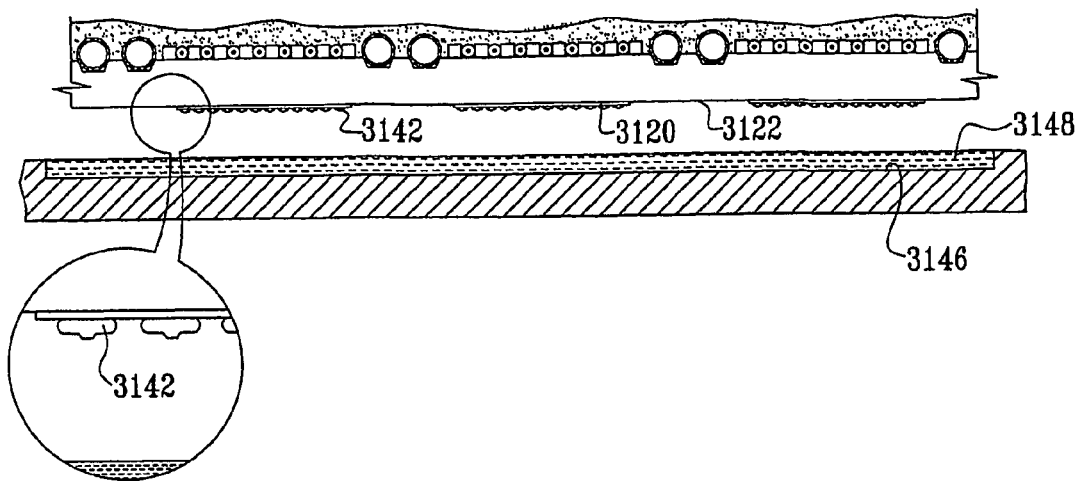
Figure 8F:
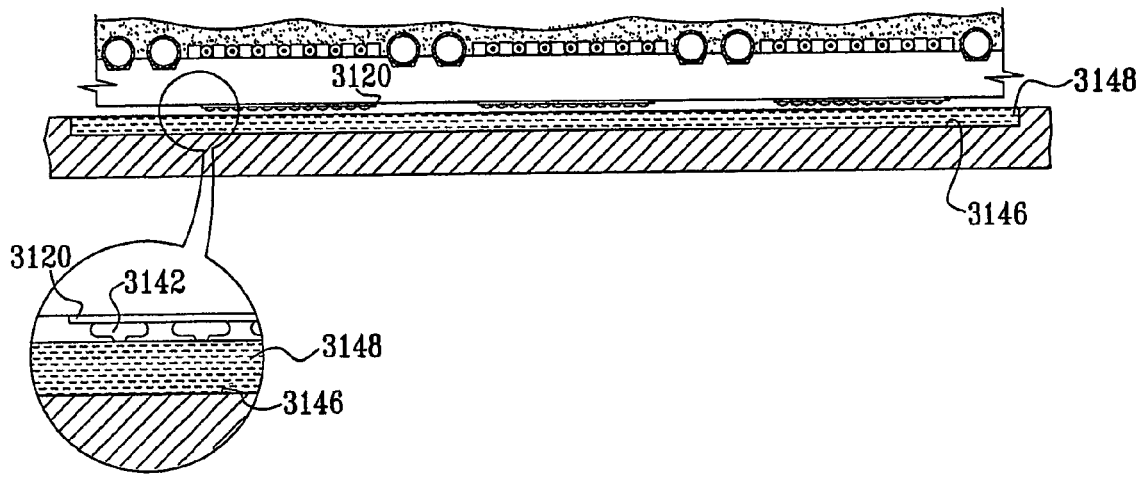
Figure 8G:
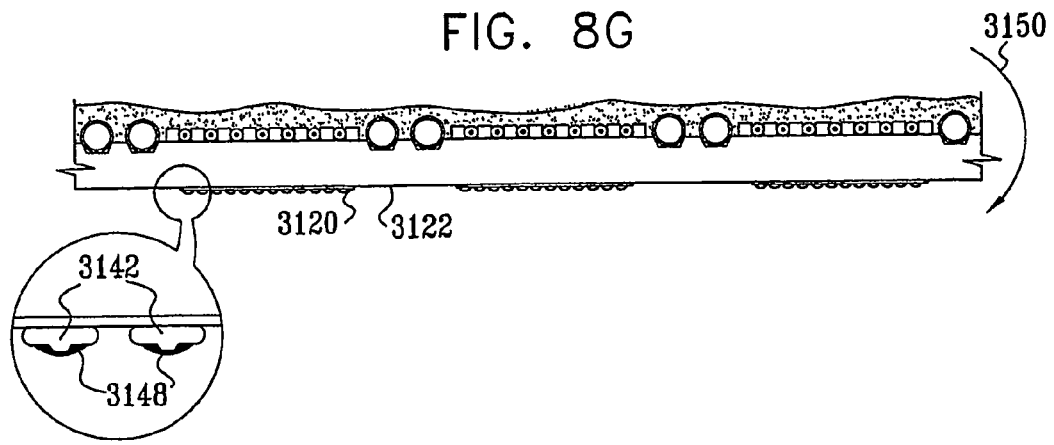

As shown in FIGS. 8E, 8F and 8G, the wafer of FIG. 8D is turned over, as indicated by an arrow 3144, and the electrical contacts 3142 are dipped into a shallow bath 3146 of a conductive adhesive 3148, such as H20E silver filled epoxy, manufactured by Epoxy Technology, 14 Fortune Drive, Billerica, Mass. 01821, USA, so as to coat the tip of each contact 3142 with adhesive 3148, as shown. The wafer of FIG. 8G is then turned over, as indicated by an arrow 3150, and a plurality of integrated circuits 3152 is mounted onto the multiplicity of contacts 3142, as seen in FIG. 8H. Integrated circuits 3152 may be electrical or electro-optic integrated circuits as appropriate.

FIG. 8I illustrates the application of underfill material 3154, such as OG 146, manufactured by Epoxy Technology, 14 Fortune Drive, Billerica, Mass. 01821, USA, at the gap between integrated circuits 3152 and electrical circuits 3120 as well as substrate 3102. If integrated circuits 3152 include electro-optic devices, the underfill material 3154 should be transparent as appropriate.

As shown in FIG. 8J, an encapsulation layer 3156, such as a layer of solder mask, is preferably formed over integrated circuits 3152, electrical circuits 3120, substrate 3102 and underfill material 3154.

For the purposes of the discussion which follows, it is assumed that at least some, if not all, of the integrated circuits 3152 are electro-optic devices. It is appreciated that additional integrated circuits (not shown) which are not electro-optic devices, may be electrically connected to the electrical circuits 3120 on substrate 3102 by other techniques, such as wire bonding.

Reference is now made to FIGS. 9A, 9B, 9C and 9D, which are simplified pictorial and sectional illustrations of a third plurality of stages in the manufacture of the packaged electro-optic circuit of FIGS. 6A and 6B.

Figure 9A:
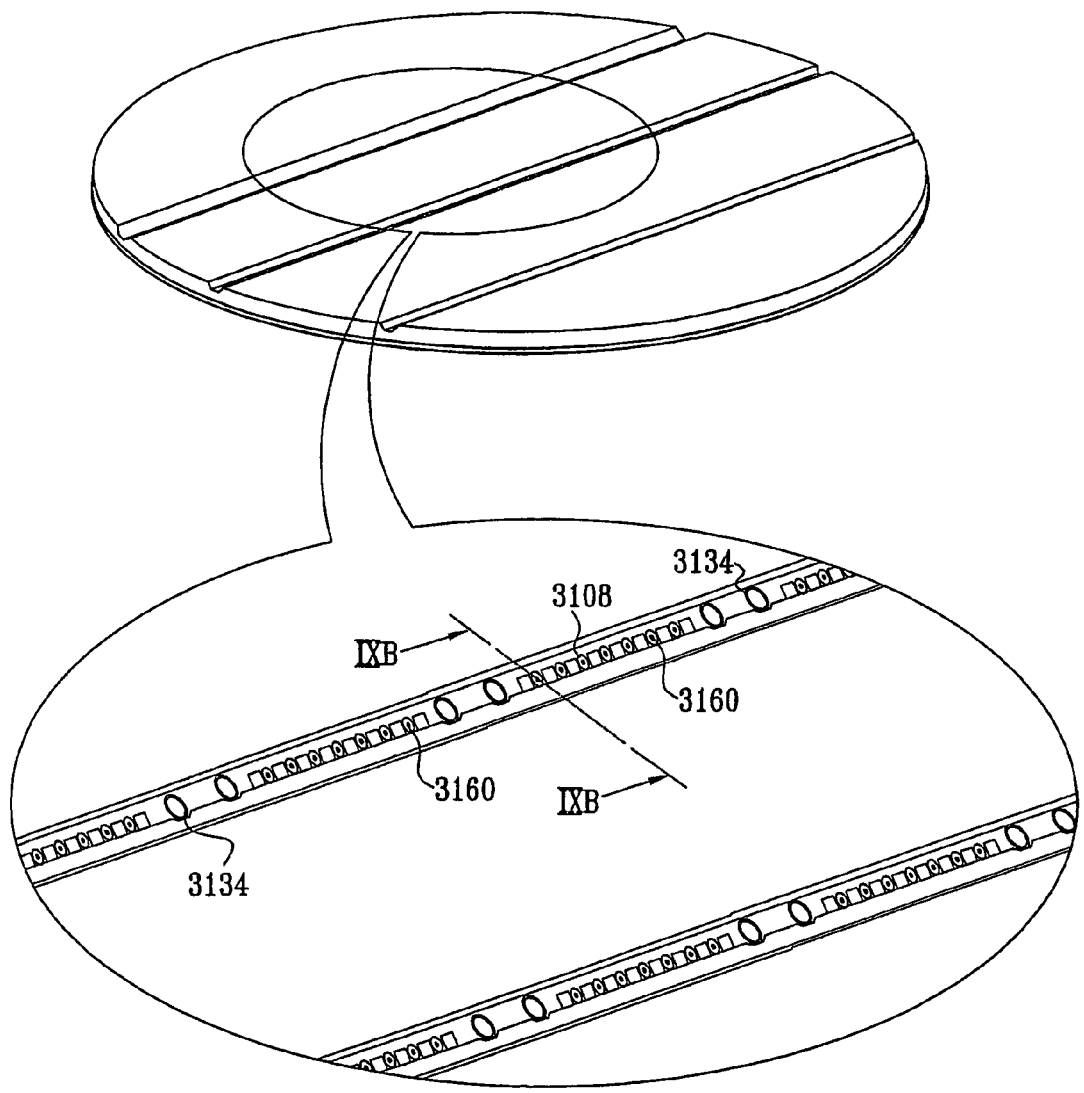
FIGS. 9A, 9B, 9C and 9D are simplified pictorial and sectional illustrations of a third plurality of stages in the manufacture of the packaged electro-optic circuit of FIGS. 6A and 6B.

FIG. 9A illustrates the wafer of FIG. 8J, turned over and notched along lines extending perpendicularly to the array of optical fibers 3108, producing an inclined cut extending entirely through at least the core 3160 of each fiber 3108 and extending at least partially through cylindrical elements 3134.

Figure 9B:
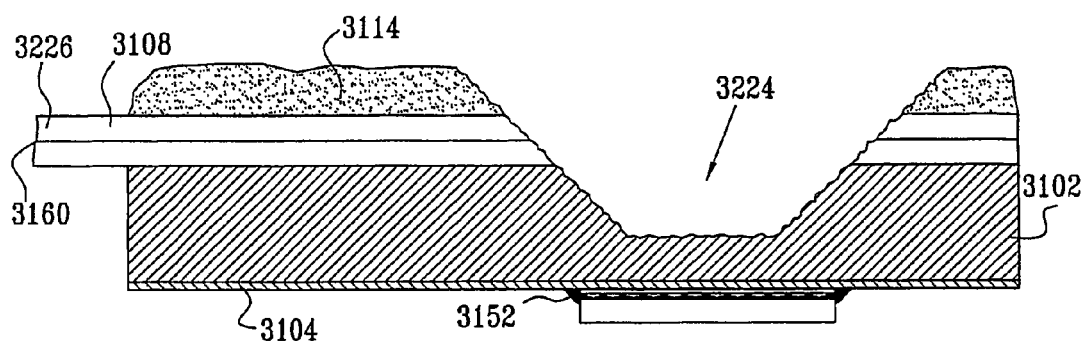
Figure 9C:
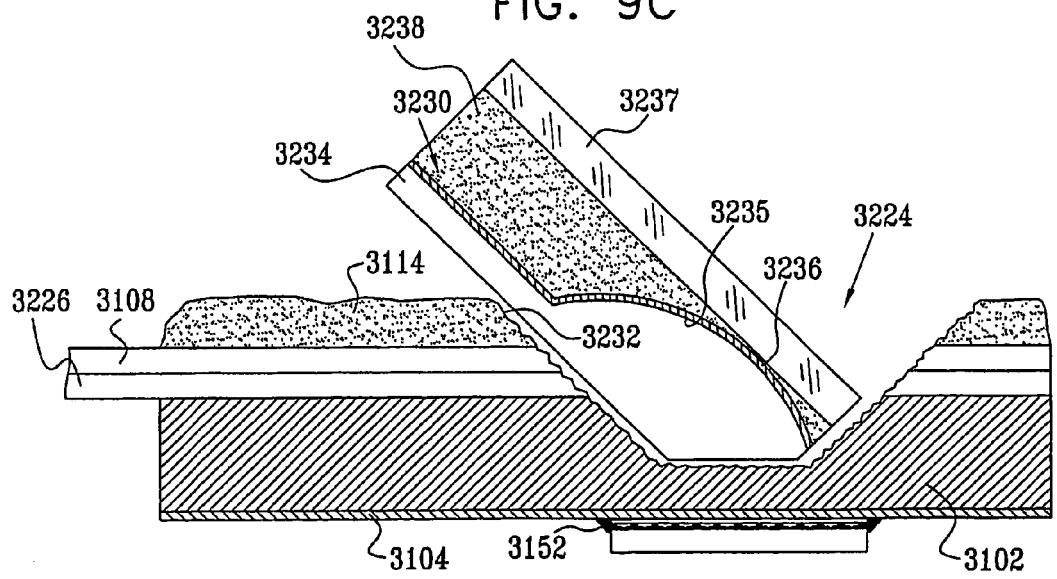
Figure 9D:
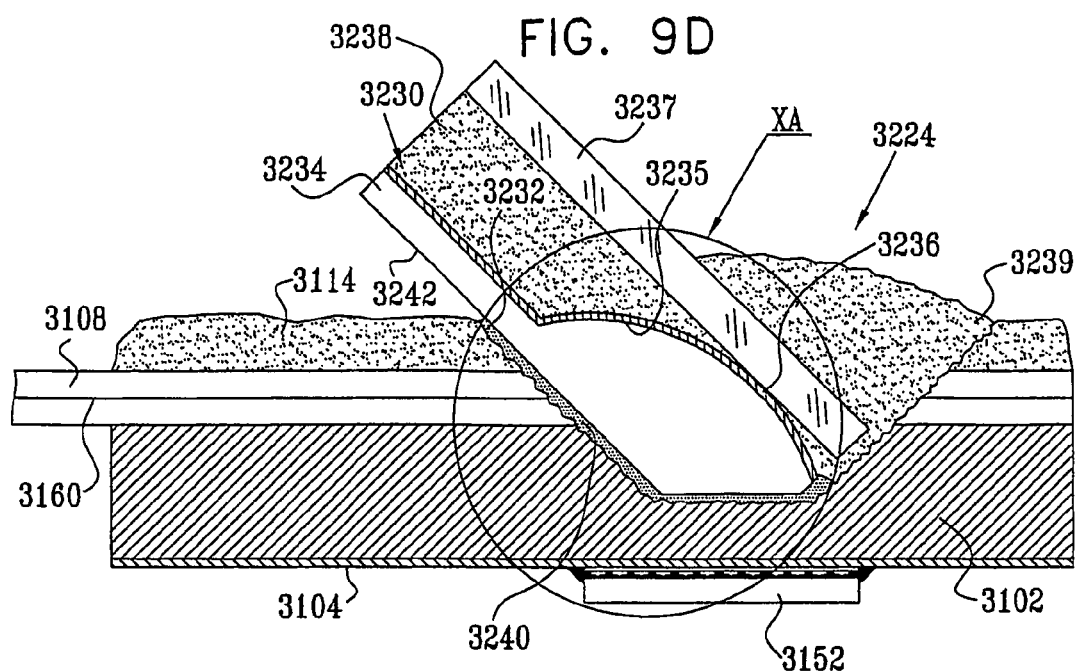

FIG. 9B-9D are simplified sectional illustrations, taken along the lines IXB-IXB in FIG. 9A, of further stages in the production of the electro-optic integrated circuit.

As shown in FIG. 9B, the notching preferably forms a notch 3224, at least partially overlapping the locations of the integrated circuits 3152, at least some, if not all, of which are electro-optic devices, and extending through the layer 3114 of protective material, entirely through each optical fiber 3108 and partially into substrate 3102. Specifically, in this embodiment, the notch 3224 extends through all of cladding 3226 of each fiber 3108 and entirely through the core 3160 of each fiber. It is appreciated that the surfaces defined by the notch 3224 are relatively rough, as shown.

Turning now to FIG. 9C, it is seen that a partially flat and partially concave mirror assembly 3230 is preferably mounted parallel to one of the rough inclined surfaces 3232 defined by notch 3224. Mirror assembly 3230 preferably comprises a glass substrate 3234 having formed thereon a curved portion 3235 over which is formed a curved metallic layer or a dichroic filter layer 3236. A glass cover 3237 is attached to the back of curved portion 3235, preferably by a suitable adhesive 3238. A preferred method of fabrication of mirror assembly 3230 is described hereinbelow with reference to FIGS. 28A-29F. As seen in FIG. 9D, preferably, the mirror assembly 3230 is securely held in place partially by any suitable adhesive 3239, such as epoxy, and partially by an optical adhesive 3240, such as OG 146, manufactured by Epoxy Technology, 14 Fortune Drive, Billerica, Mass. 01821, USA, whose refractive index preferably is precisely matched to that of the cores 3160 of the optical fibers 3108. It is appreciated that optical adhesive 3240 may be employed throughout instead of adhesive 3239. Optical adhesive 3240 preferably fills the interstices between the roughened surface 3232 defined by notch 3224 and a surface 3242 of mirror assembly 3230.

Figure 10B:
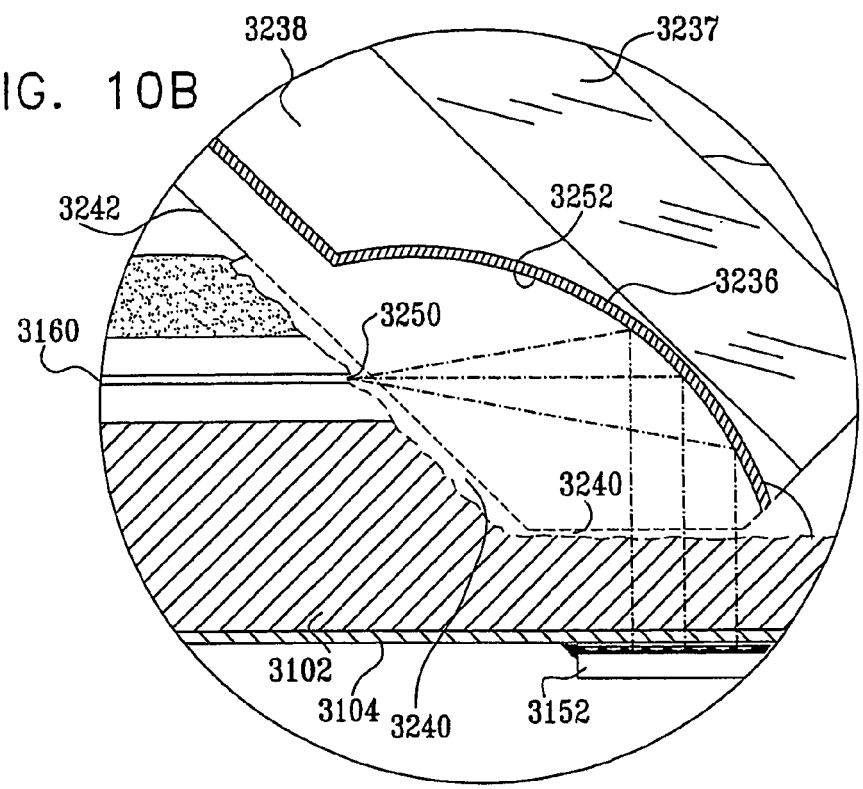
Figure 10C:
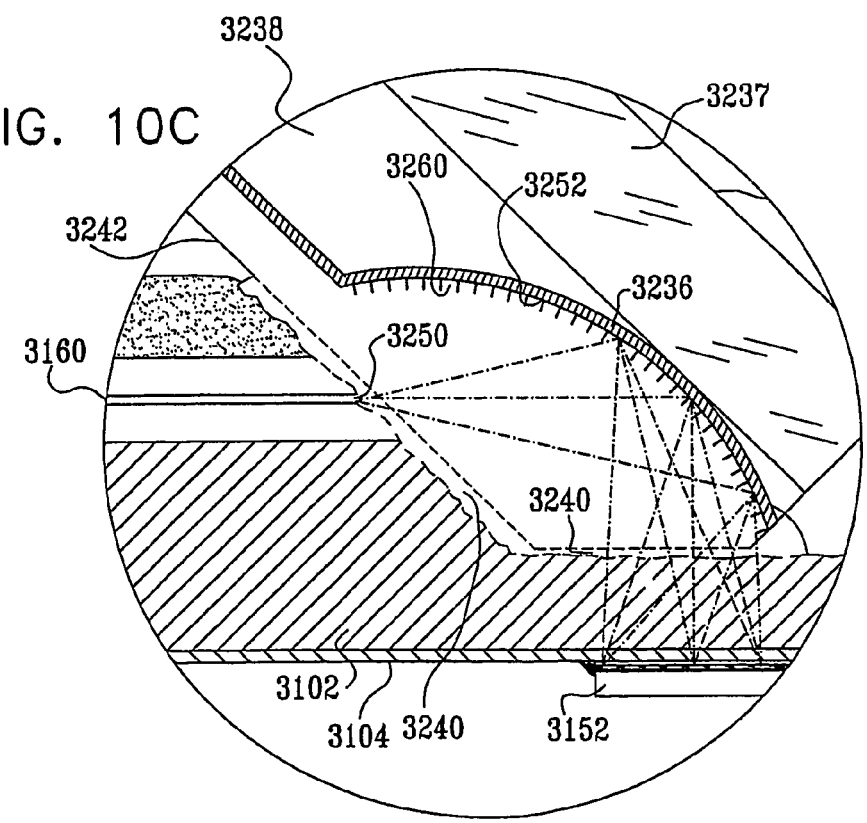

Reference is now made to FIGS. 10A, 10B and 10C, which are enlarged simplified optical illustrations of a portion of FIG. 9D in accordance with preferred embodiments of the present invention. FIG. 10A is an enlarged simplified optical illustration of a portion of FIG. 9D. Here it is seen that a generally uninterrupted optical path is defined for light, preferably in the wavelength range of 400-1650 nm, from an end 3250 of a core 3160, through adhesive 3240, substrate 3234 and curved portion 3235 to a reflective surface 3252 of layer 3236 and thence through curved portion 3235, adhesive 3240 and substrate 3102 and layer 3104 which are substantially transparent to this light. It is noted that the index of refraction of adhesive 3240 is close to but not identical to that of curved portion 3235 and substrates 3102 and 3234. In the embodiment of FIG. 10A, the operation of curved layer 3236 is to focus light exiting from end 3250 of core 3160 onto the electro-optic component 3152.

FIG. 10B is an enlarged simplified optical illustration of a portion of FIG. 9D in accordance with a further embodiment of the present invention. In this embodiment, the curvature of curved layer 3236 produces collimation rather than focusing of the light exiting from end 3250 of core 3160 onto the electro-optic component 3152.

FIG. 10C is an enlarged simplified optical illustration of a portion of FIG. 9D in accordance with yet another embodiment of the present invention wherein a grating 3260 is added to curved layer 3236. The additional provision of grating 3260 causes separation of light impinging thereon according to its wavelength, such that multispectral light exiting from end 3250 of core 3160 is focused at multiple locations on electro-optic component 3152 in accordance with the wavelengths of components thereof.

Figure 11:
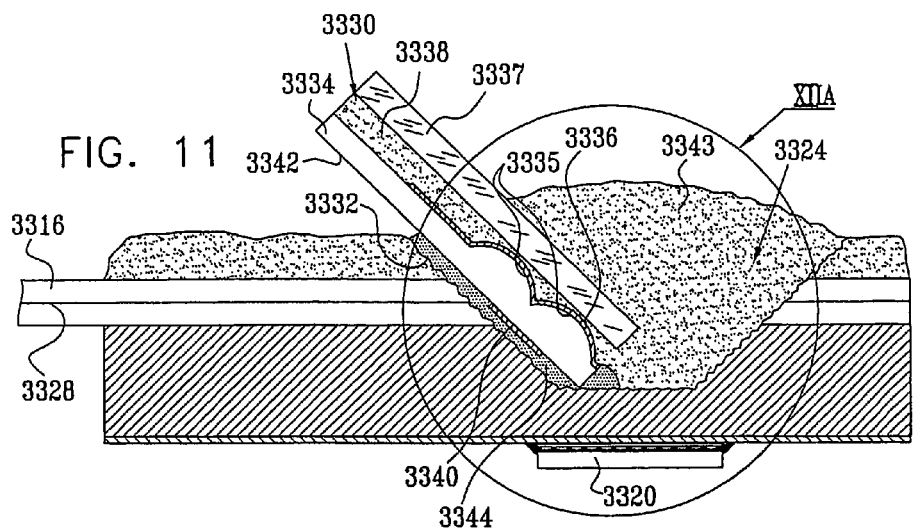
FIG. 11 is a simplified sectional illustration of an electro-optic circuit constructed and operative in accordance with another preferred embodiment of the present invention.

Reference is now made to FIG. 11, which is a simplified sectional illustration of a packaged electro-optic integrated circuit constructed and operative in accordance with yet another preferred embodiment of the present invention. The embodiment of FIG. 11 corresponds generally to that described hereinabove with respect to FIG. 9D other than in that a mirror with multiple concave reflective surfaces is provided rather than a mirror with a single such reflective surface. As seen in FIG. 11, it is seen that light from an optical fiber 3316 is directed onto an electro-optic component 3320 by a partially flat and partially concave mirror assembly 3330, preferably mounted parallel to one of the rough inclined surfaces 3332 defined by notch 3324. Mirror assembly 3330 preferably comprises a glass substrate 3334 having formed thereon a plurality of curved portions 3335 over which are formed a curved metallic layer or a dichroic filter layer 3336. A glass cover 3337 is attached to the back of curved portion 3335, preferably by a suitable adhesive 3338. Mirror assembly 3330 also defines a reflective surface 3340, which is disposed on a planar surface 3342 generally opposite layer 3336. A preferred method of fabrication of mirror assembly 3330 is described hereinbelow with reference to FIGS. 30A-32H. Preferably, the mirror assembly 3330 is securely held in place partially by any suitable adhesive 3343, such as epoxy, and partially by an optical adhesive 3344, such as OG 146, manufactured by Epoxy Technology, 14 Fortune Drive, Billerica, Mass. 01821, USA, whose refractive index preferably is precisely matched to that of the cores 3328 of the optical fibers 3316. It is appreciated that optical adhesive 3344 may be employed throughout instead of adhesive 3343. The optical adhesive 3344 preferably fills the interstices between the roughened surface 3332 defined by notch 3324 and surface 3342 of mirror assembly 3330.

Figure 12A:
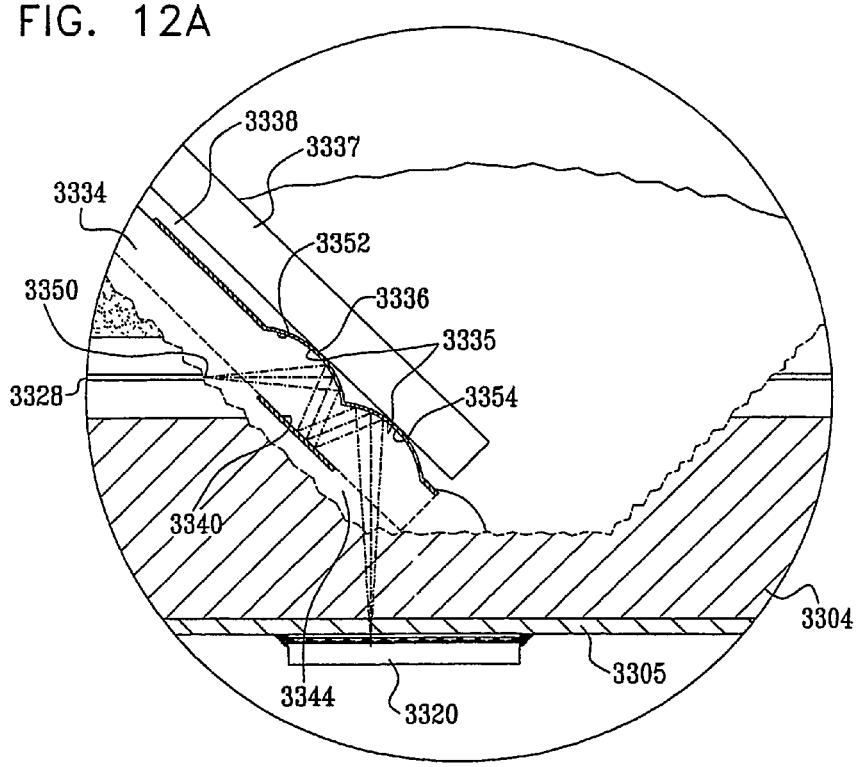
FIGS. 12A, 12B and 12C are enlarged simplified optical illustrations of a portion of FIG. 11 in accordance with various other preferred embodiments of the present invention.

Reference is now made to FIG. 12A, which is an enlarged simplified optical illustration of a portion of FIG. 11. Here it is seen that a generally uninterrupted optical path is defined for light, preferably in the wavelength range of 400-1650 nm, from an end 3350 of core 3328, through adhesive 3344, substrate 3334 and first curved portion 3335, to a curved reflective surface 3352 of layer 3336 and thence through first curved portion 3335 and substrate 3334 to reflective surface 3340, from reflective surface 3340 through substrate 3334 and second curved portion 3335 to another curved reflective surface 3354 of layer 3336 and thence through second curved portion 3335, substrate 3334, adhesive 3344 and substrate 3304 and a layer 3305, which are substantially transparent to this light. It is noted that the index of refraction of adhesive 3344 is close to but not identical to that of substrates 3304 and 3334. In the embodiment of FIG. 12A, the operation of curved layer 3336 and reflective surface 3340 is to focus light exiting from end 3350 of core 3328 onto the electro-optic component 3320.

Figure 12B:
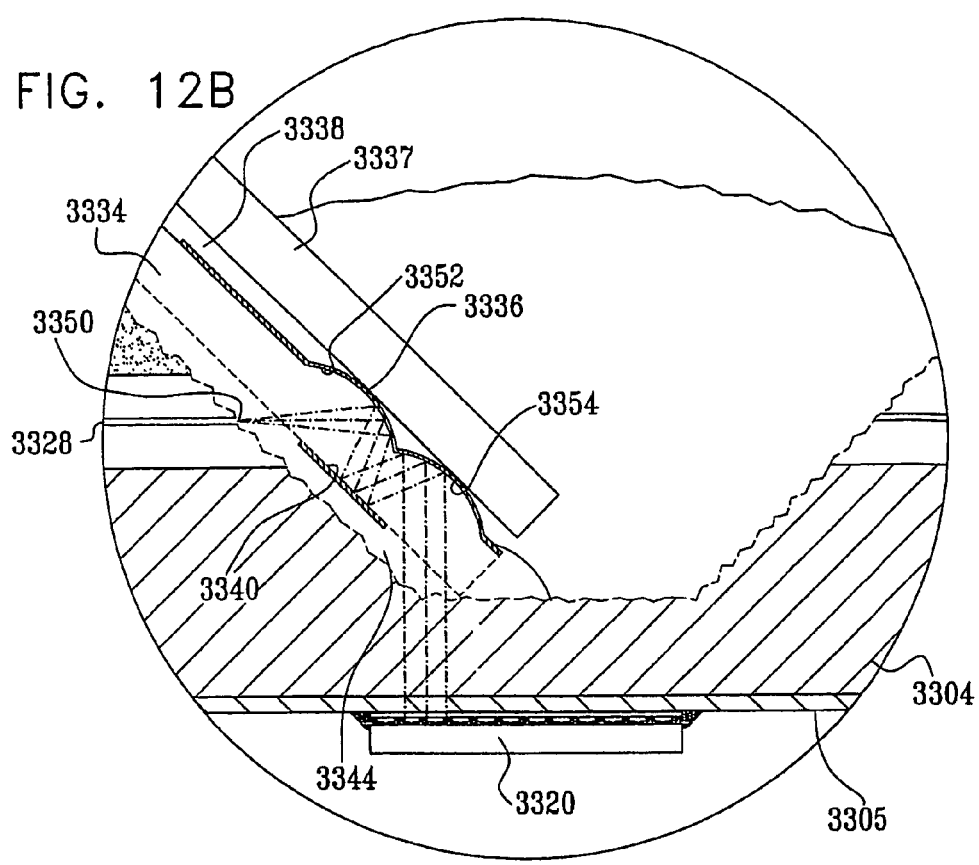

Reference is now made to FIG. 12B, which is an enlarged simplified optical illustration of a portion of FIG. 11 in accordance with a further embodiment of the present invention. In this embodiment, the curvature of curved layer 3336 produces collimation rather than focusing of the light exiting from end 3350 of core 3328 onto the electro-optic component 3320.

Figure 12C:
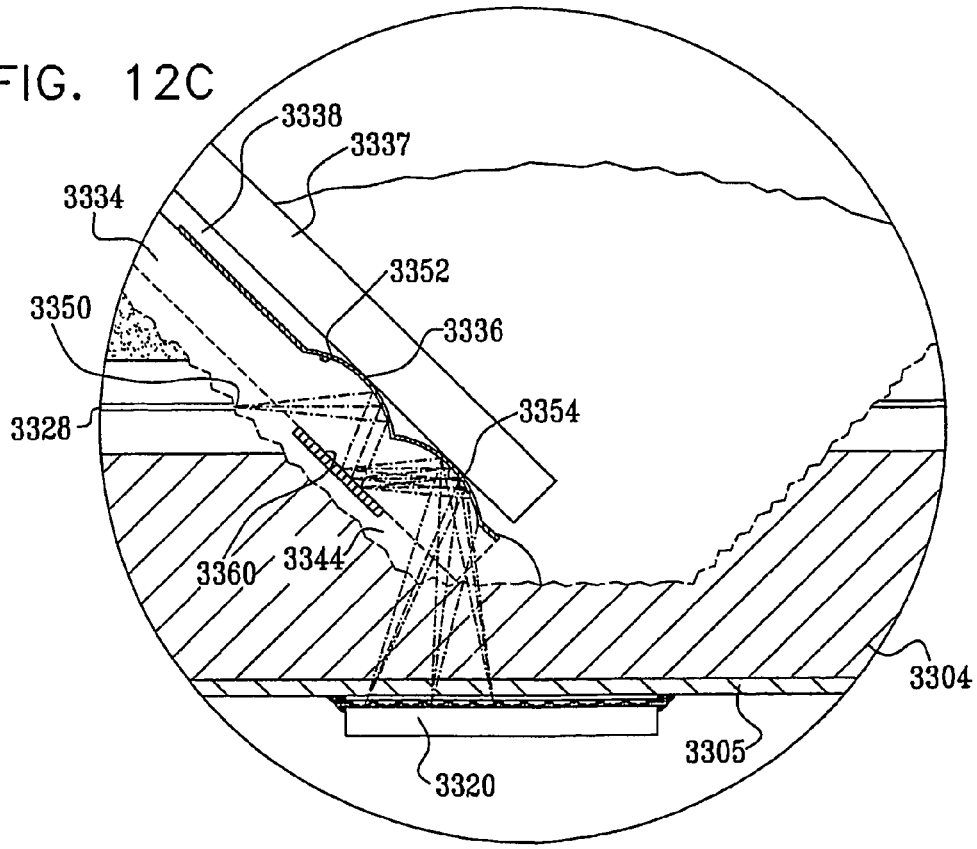

Reference is now made to FIG. 12C, which is an enlarged simplified optical illustration of a portion of FIG. 11 in accordance with yet another embodiment of the present invention wherein a reflective grating 3360 replaces reflective surface 3340 (FIG. 12A). A preferred method of fabrication of mirror assembly 3330 with grating 3360 is described hereinbelow with reference to FIGS. 32A-32G. The additional provision of grating 3360 causes separation of light impinging thereon according to its wavelength, such that multispectral light existing from end 3350 of core 3328 is focused at multiple locations on electro-optic component 3320 in accordance with the wavelengths of components thereof.

It is appreciated that, even though the illustrated embodiments of FIGS. 9C-12C utilize the mirror assemblies whose fabrications are described hereinbelow with reference to FIGS. 28A-29F and 30A-32H, any of the mirror assemblies whose fabrications are described hereinbelow with reference to FIGS. 28A-34H may alternatively be utilized.

Figure 13:
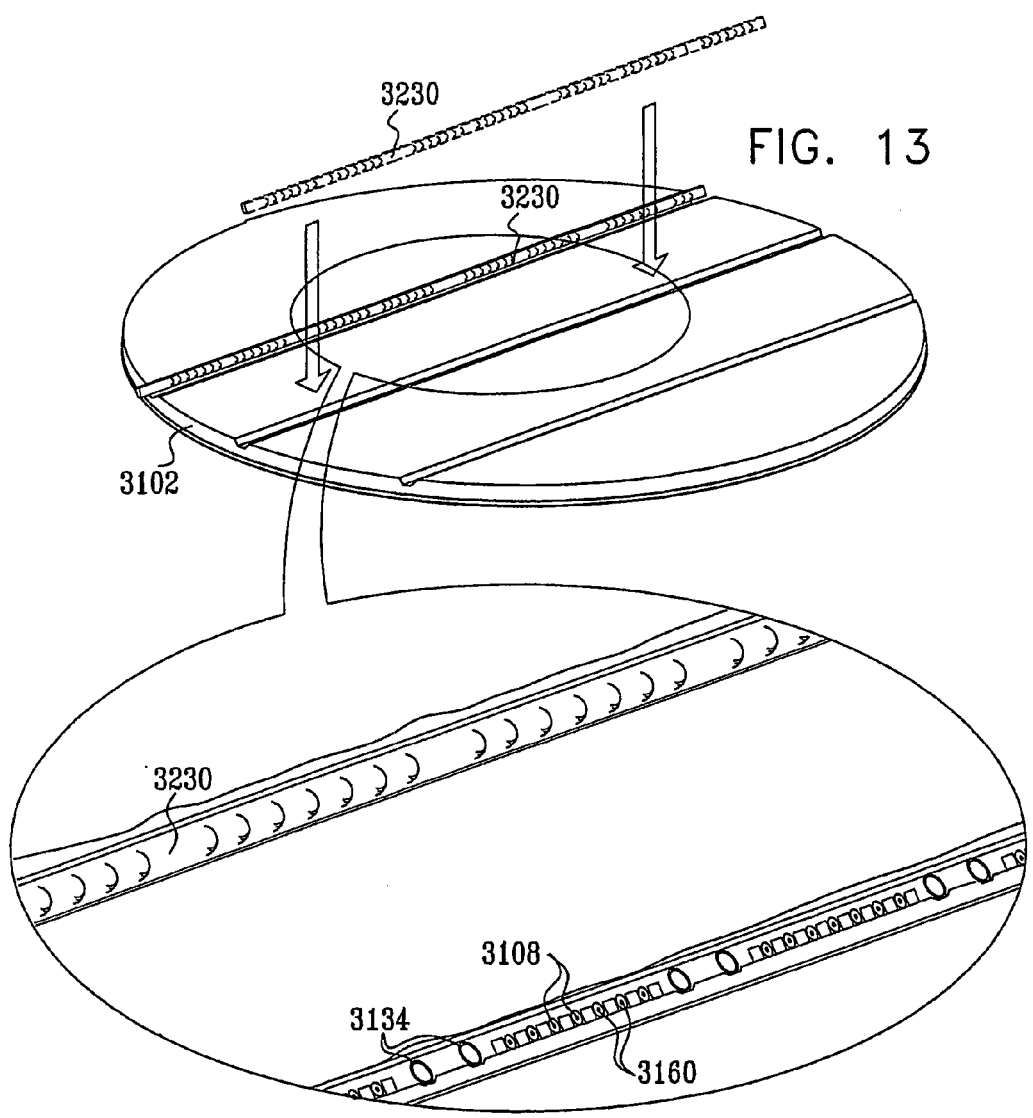
FIG. 13 is a simplified pictorial illustration corresponding to sectional illustration FIG. 9D.

Reference is now made to FIG. 13, which is a simplified pictorial illustration corresponding to sectional illustration FIG. 9D. FIG. 13 illustrates the wafer of FIG. 9A, with partially flat and partially concave mirror assembly 3230 mounted thereon, parallel to one of the rough inclined surfaces 3232 defined by notch 3224, as described hereinabove with reference to FIG. 9D. It is appreciated that mirror assembly 3230 extends along the entire length of substrate 3102.

Figure 14A:
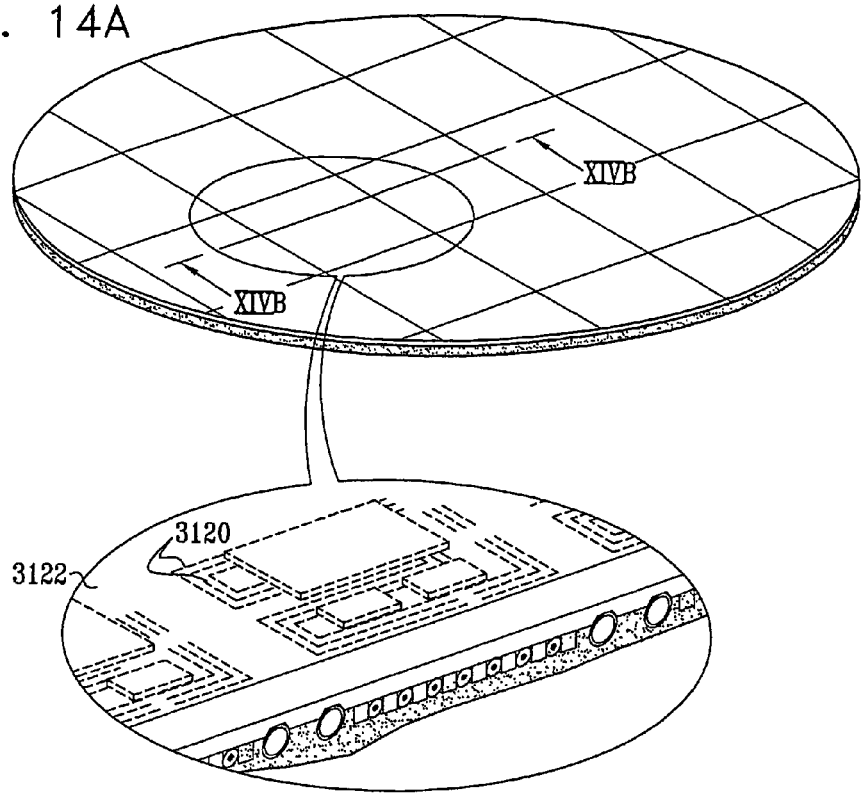
FIGS. 14A, 14B, 14C, 14D, 14E and 14F are simplified pictorial and sectional illustrations of a fourth plurality of stages in the manufacture of the packaged electro-optic circuit of FIGS. 6A and 6B.
Figure 14B:
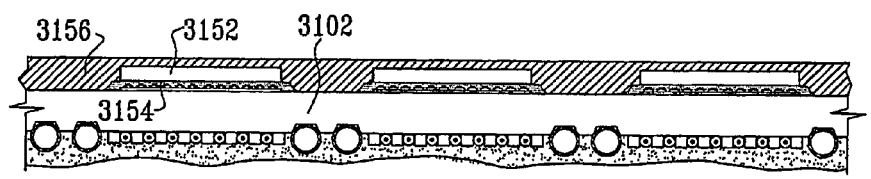
Figure 14C:
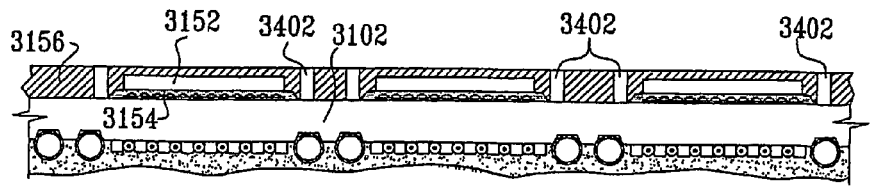
Figure 14D:
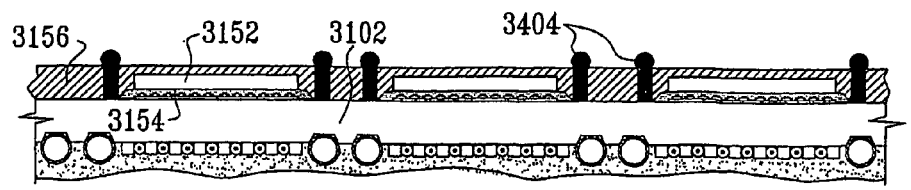

Reference is now made to FIGS. 14A, 14B, 14C, 14D, 14E and 14F, which are simplified pictorial and sectional illustrations of a fourth plurality of stages in the manufacture of the packaged electro-optic circuit of FIGS. 6A and 6B. FIG. 14A shows the wafer of FIG. 13 turned over. FIG. 14B is a sectional illustration of the wafer of FIG. 14A along lines XIVB-XIVB. FIG. 14C illustrates the formation of holes 3402 by conventional techniques, such as the use of lasers or photolithography, which communicate with electrical circuits 3120 (FIG. 7A) on substrate 3102. FIG. 14D shows the formation of solder bumps 3404 in holes 3402.

Figure 14E:
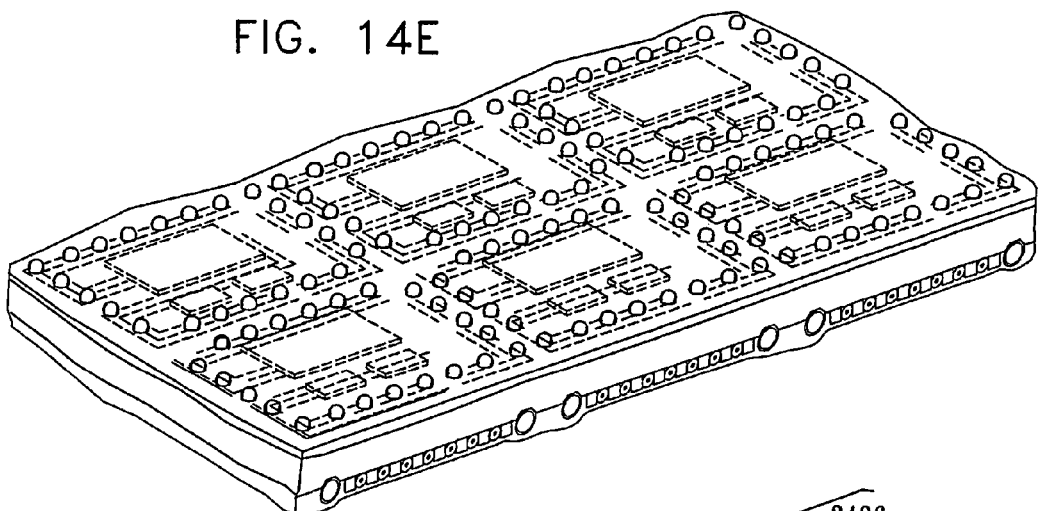
Figure 14F:
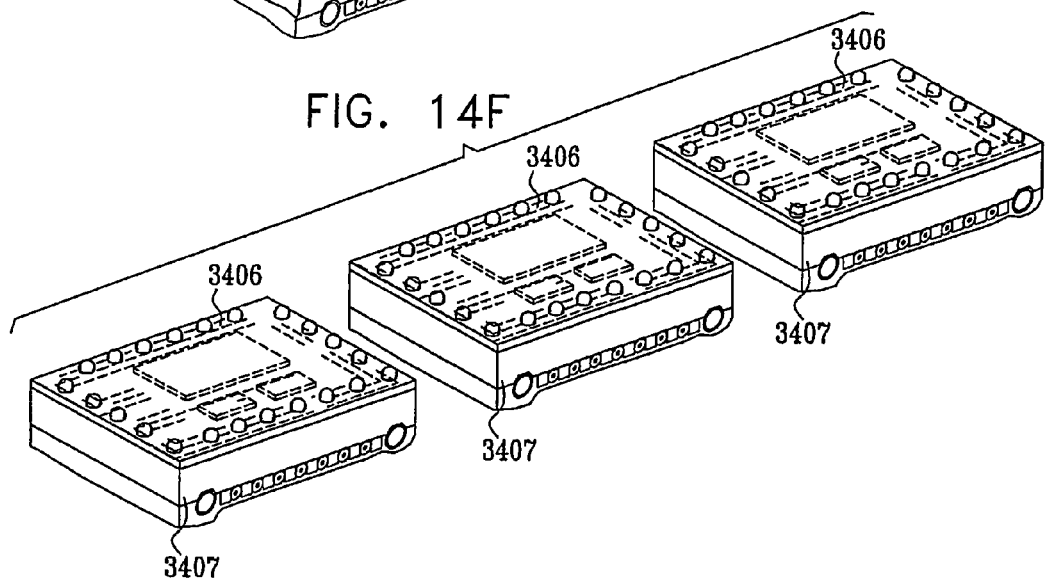

Following the formation of solder bumps 3404 in holes 3402, the wafer, as shown in FIG. 14E, is preferably diced, providing a plurality of packaged electro-optic circuit chips 3406, as illustrated in FIG. 14F. Following dicing of substrate 3102 into a plurality of packaged electro-optic circuit chips 3406, an optical edge surface 3407 of each of the plurality of packaged electro-optic circuit chips 3406 is polished to provide an optical quality planar surface. It is appreciated that the planar surface defined by the polishing may be either parallel, or at any suitable angle, to the plane defined by the dicing.

Figure 15:
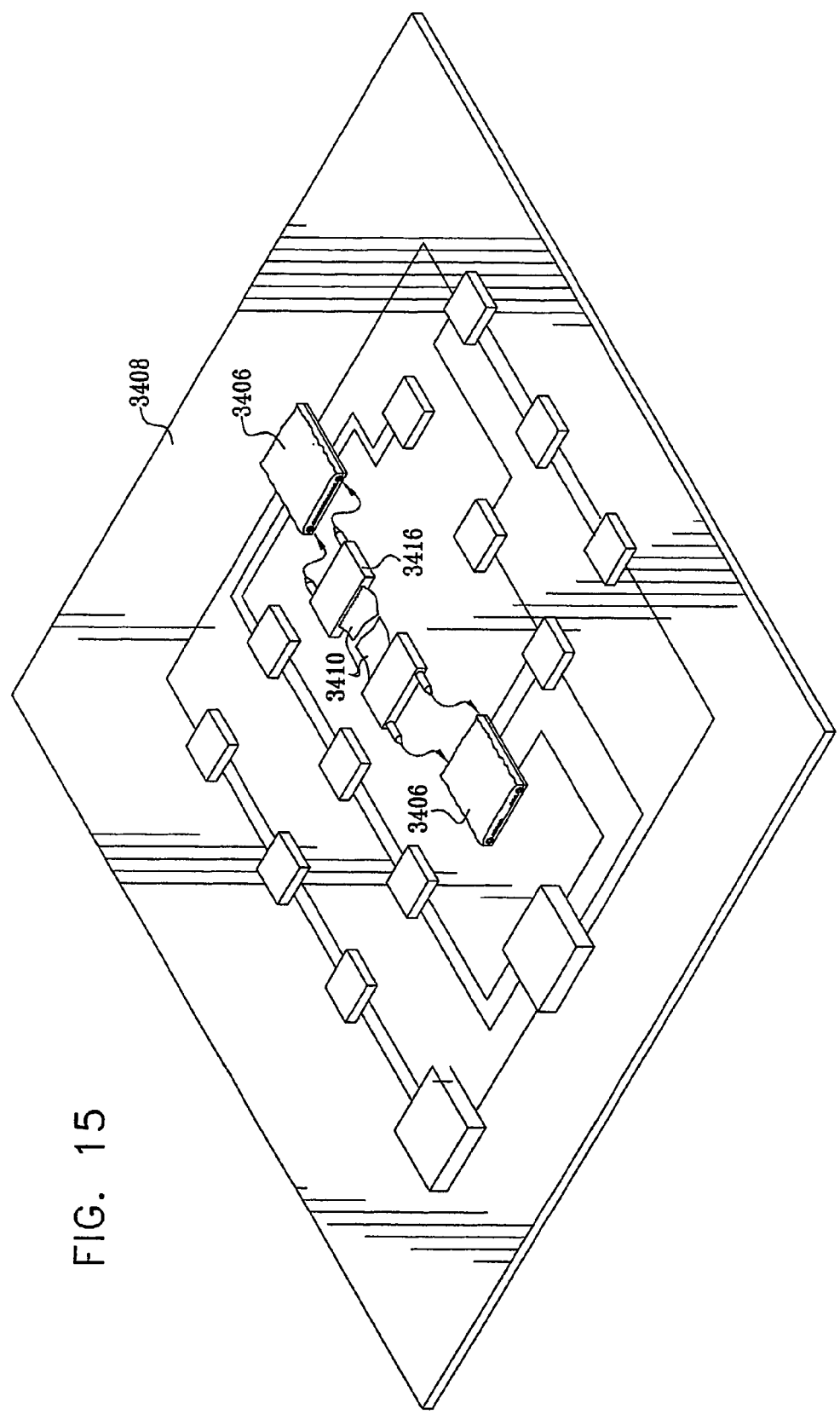
FIG. 15 is a simplified illustration of incorporation of packaged electro-optic circuits of the type shown in FIGS. 6A-6B as parts of a larger electrical circuit.

Reference is now made to FIG. 15, which shows packaged electro-optic circuit chips 3406 mounted on a conventional electrical circuit board 3408 and being interconnected by a conventional optical fiber ribbon 3410 and associated conventional optical fiber connectors 3416.

Figure 16:
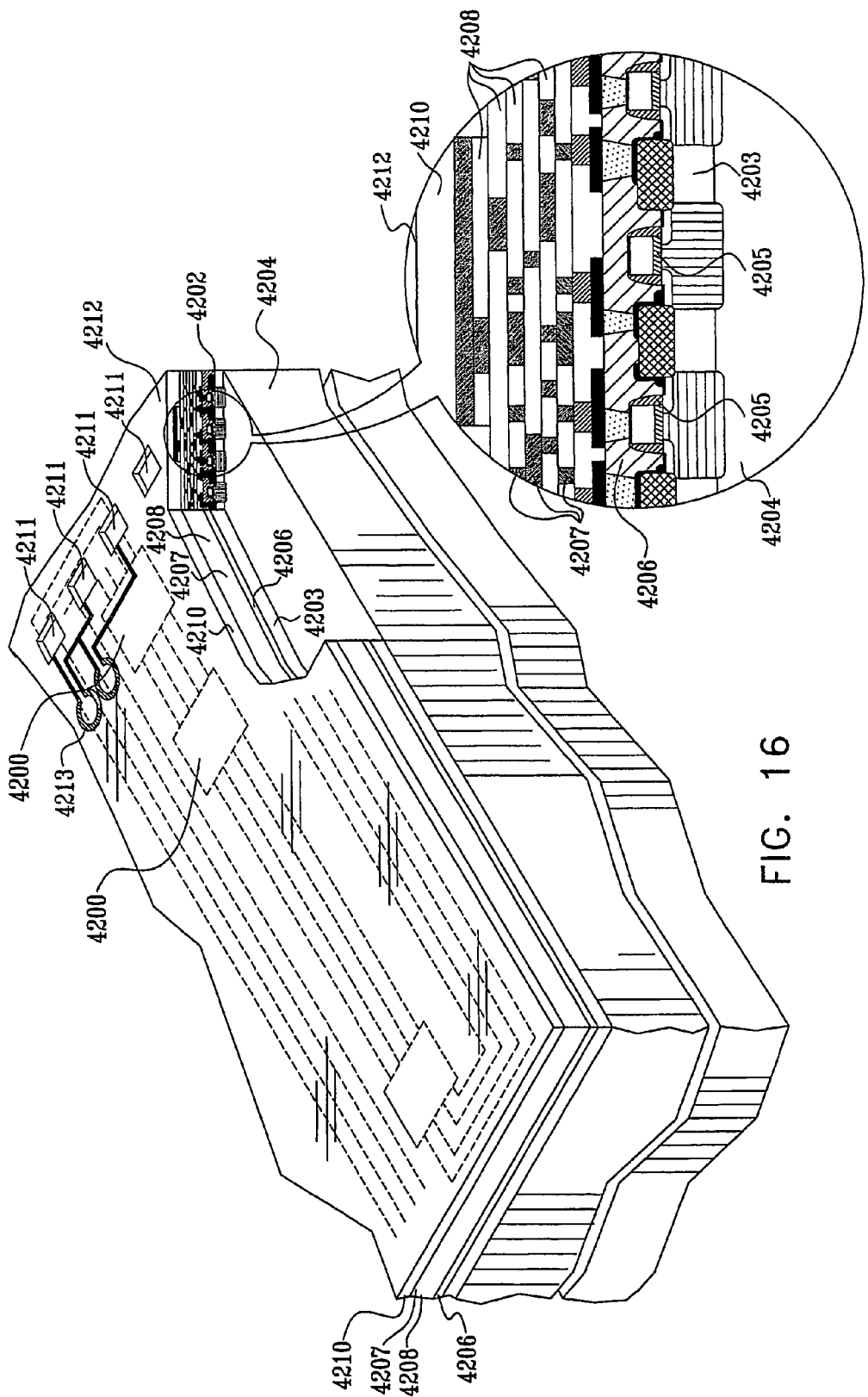
FIG. 16 is a simplified pictorial illustration of an initial stage in the production of a packaged electro-optic integrated circuit constructed and operative in accordance with a preferred embodiment of the present invention.

Reference is now made to FIG. 16, which is a simplified pictorial illustration of an initial stage in the production of an electro-optic integrated circuit, constructed and operative in accordance with a preferred embodiment of the present invention. As seen in FIG. 16, one or more electrical circuits 4200 are preferably formed onto a first surface 4202 of an optional epitaxial layer 4203 of a substrate 4204. The epitaxial layer 4203 is typically formed of silicon and has a thickness of between 2-10 microns, while the substrate 4204 is typically formed of silicon and has a thickness of 200-1000 microns. Electrical circuits 4200 are preferably formed onto substrate 4204 by conventional photolithographic and thin film processing techniques employed in the production of integrated circuits. Circuits 4200 preferably include transistors 4205 formed in layer 4203, covered by a dielectric layer 4206, over which is typically formed a plurality of metal conductive layers 4207 interspersed with dielectric layers 4208, covered by a top passivation layer 4210. The dielectric layers are preferably transparent to light preferably in both the visible and the infrared bands within at least part of the wavelength range of 400-1650 nm. Vias 4211, connected to at least one conductive layer 4207, extend through layer 4210 to the top surface 4212.

Preferably light detector arrays 4213 are also formed on surface 4202 of substrate 4204 and connected to electrical circuits 4200. The light detector arrays 4213 are preferably formed by chemical deposition and lithography and may comprise, for example, poly-silicon, amorphous silicon, lead sulfide, lead selenide and HgCdTe. The light detector arrays 4213 may advantageously be employed to monitor individual outputs of individual lasers in a laser array embedded in a packaged electro-optic integrated circuit and connector chip, such as chips 1000, 1500, 2000 and 2500, in the embodiments of FIGS. 1A-1D, 2A-2D, 3A-3D and 4A-4D, respectively.

Figure 17A:
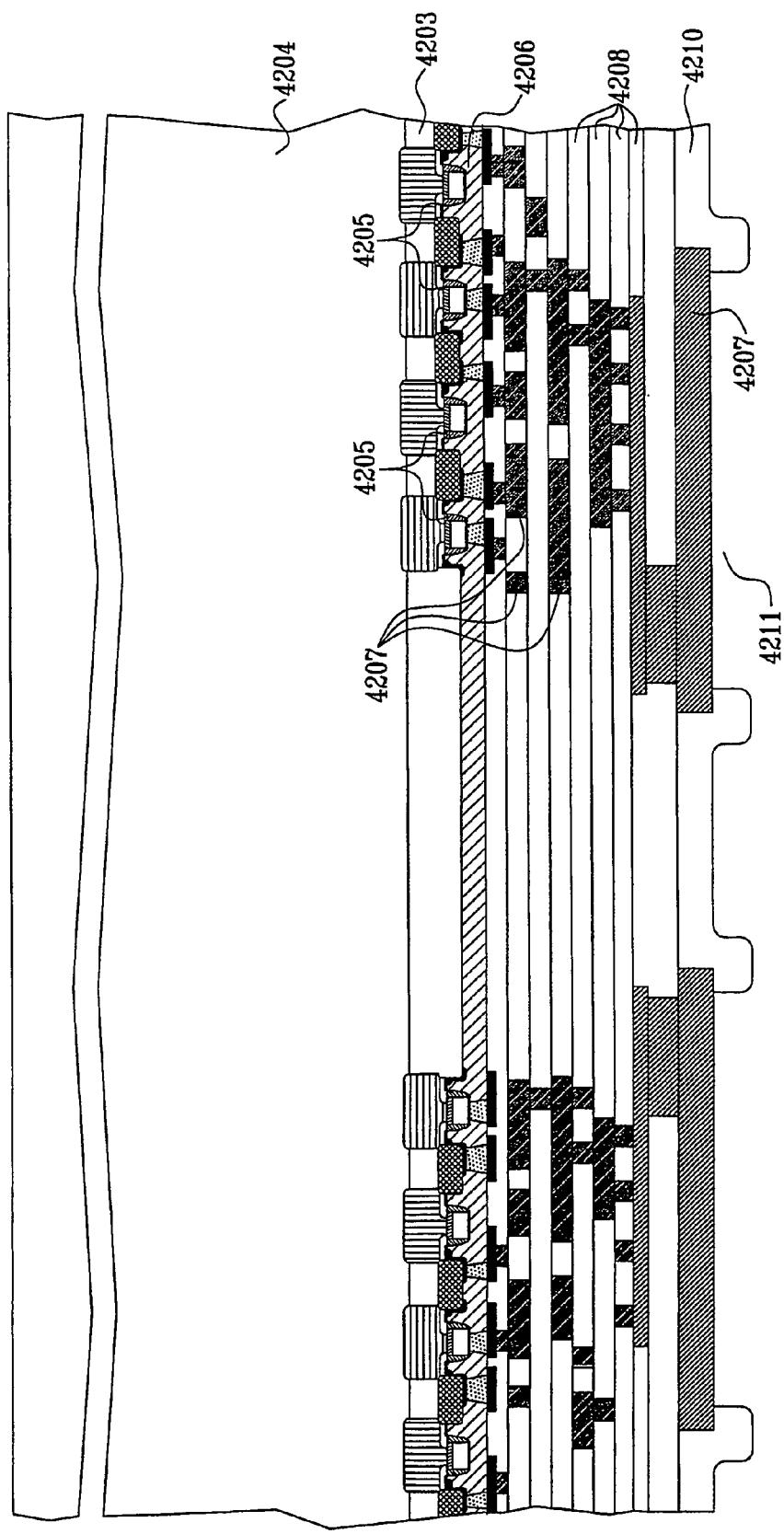

Reference is now made to FIGS. 17A, 17B, 17C, 17D and 17E, which are simplified illustrations of the initial stages in the production of an electro optical integrated circuit in accordance with the embodiment of FIG. 16. FIG. 17A shows the substrate of FIG. 16 after it has been turned over.

Figure 17B:
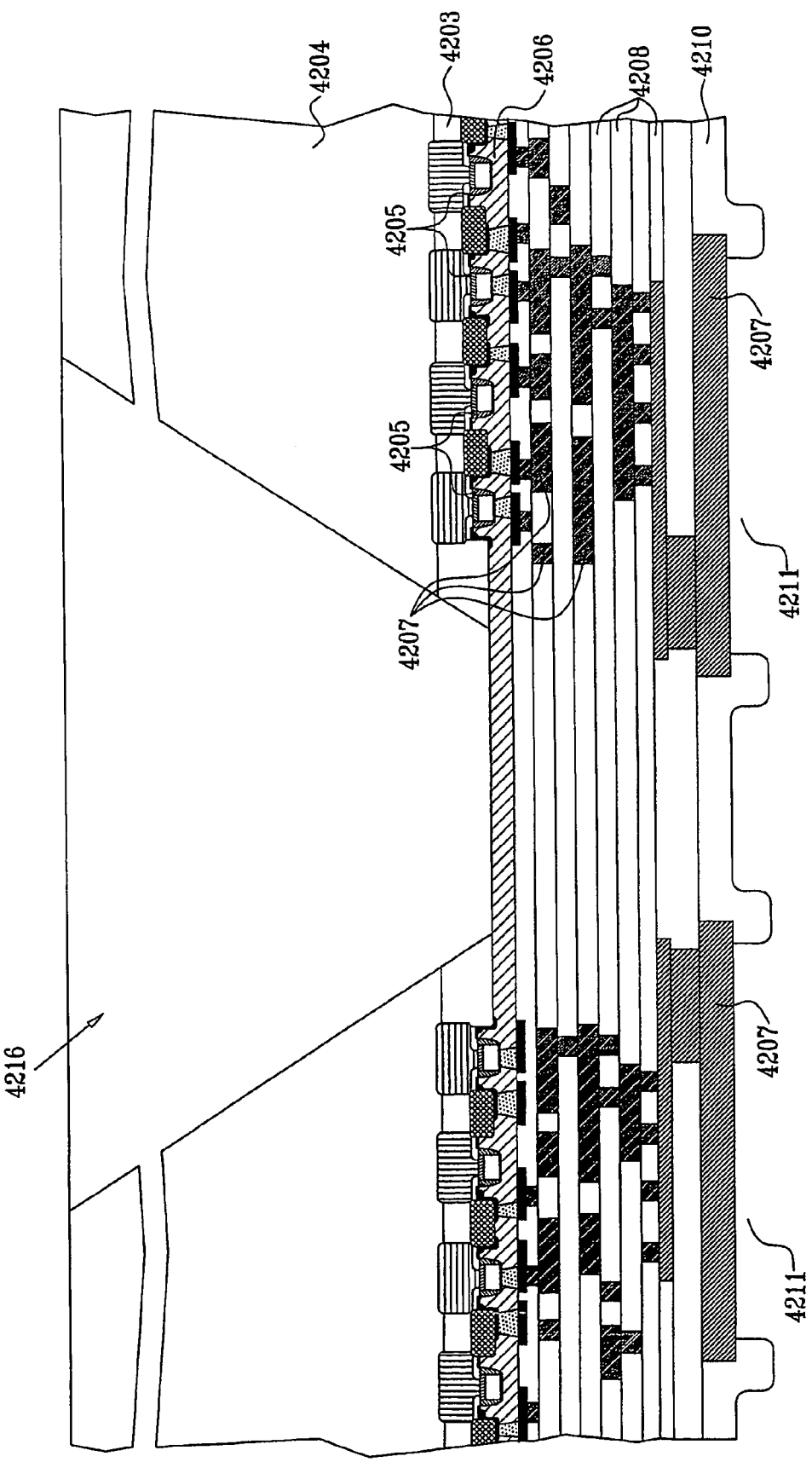

As seen in FIG. 17B, an opening 4216 is formed by removing portions of substrate 4204 at locations not underlying vias 4211. Preferably, the entire thickness of the substrate 4204 is removed, leaving dielectric layers 4206, 4208, conductive layers 4207 and top passivation layer 4210 intact. Alternatively, dielectric layer 4206 may also be removed, leaving some or all of dielectric layers 4208 and top passivation layer 4210 intact. The removal of substrate 4204 may be achieved by using conventional etching techniques and, preferably, provides a volume of dimensions of around 100 to 200 microns in width and 1000 to 3000 microns in length.

Figure 17C:
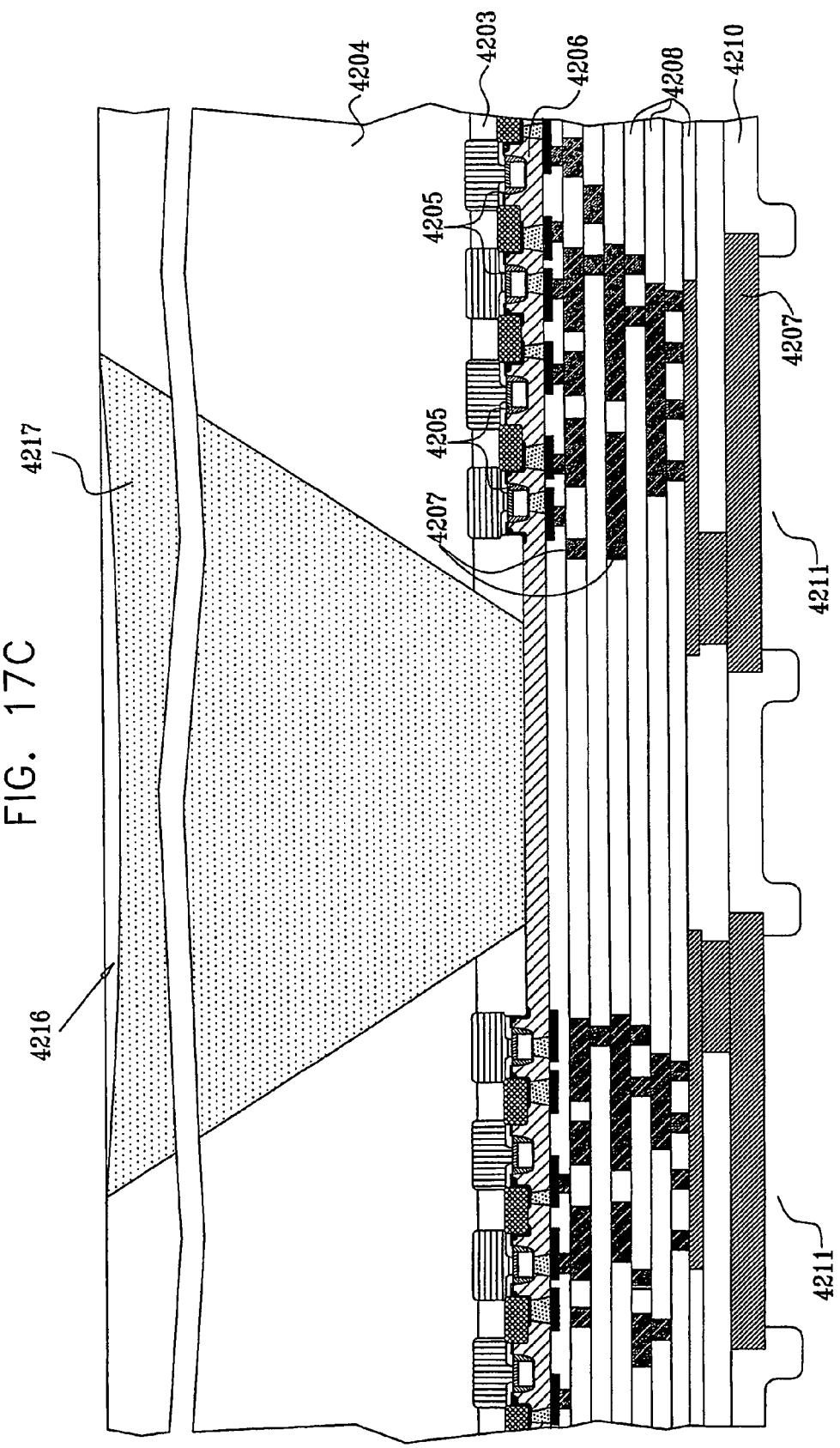

As seen in FIG. 17C, the openings 4216 are filled by a suitable transparent optical adhesive 4217, such as OG 146, manufactured by Epoxy Technology, 14 Fortune Drive, Billerica, Mass. 01821, USA, whose refractive index preferably is precisely matched to that of cores of conventionally manufactured optical fibers, commercially available from manufacturers, such as Dow Corning of the U.S.A.

Figure 17D:
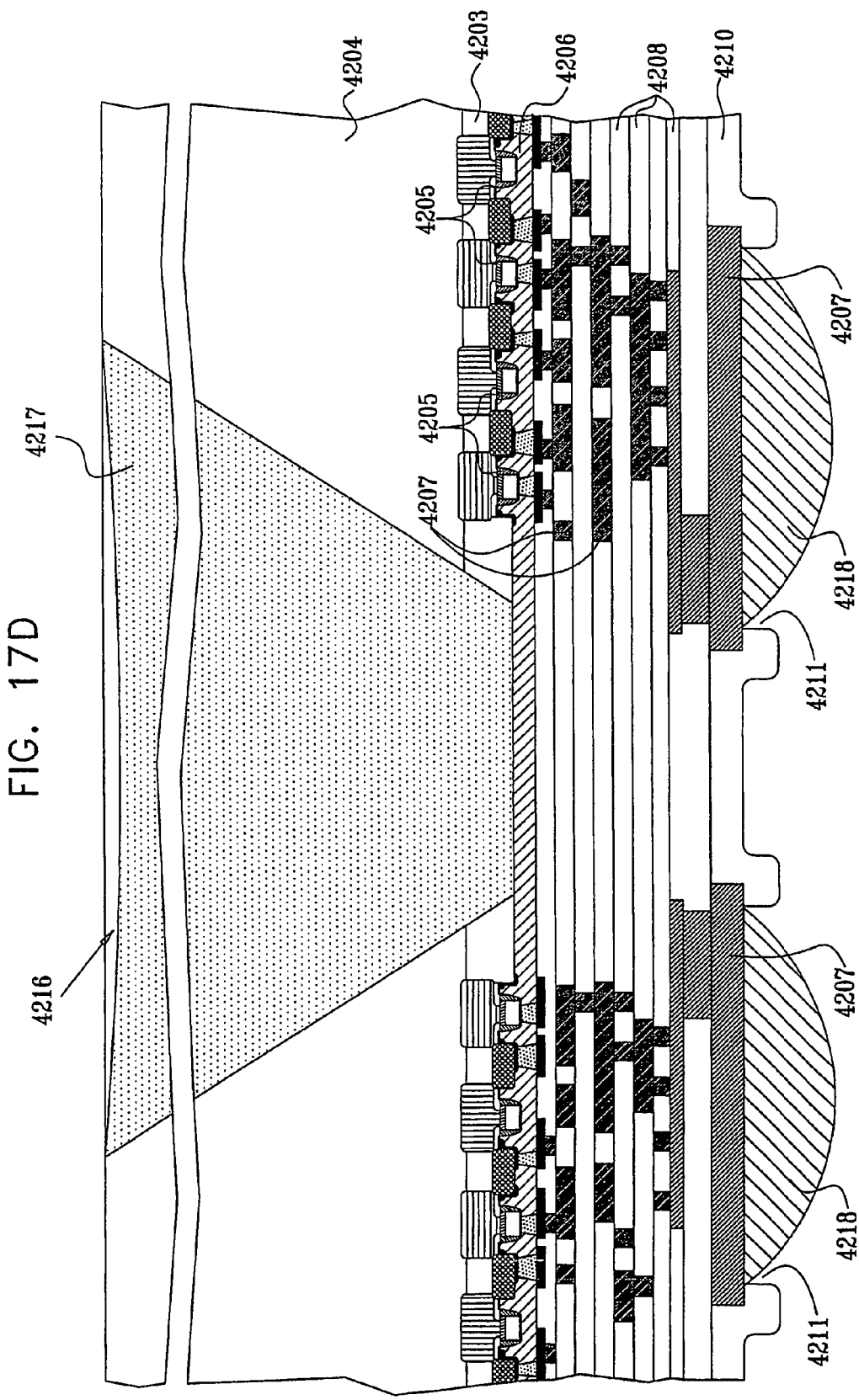

As seen in FIG. 17D, conductive bumps 4218, preferably metal bumps, such as solder bumps, are preferably formed onto the exposed surfaces of vias 4211. As seen in FIG. 17E, conductive bumps 4220, preferably metal bumps, such as solder bumps, are preferably formed onto the surfaces of integrated circuit chips 4222, which are preferably located below openings 4216. Integrated circuit chips 4222 are in conductive engagement with vias 4211 by the soldering of bumps 4218 to bumps 4220.

Figure 18:
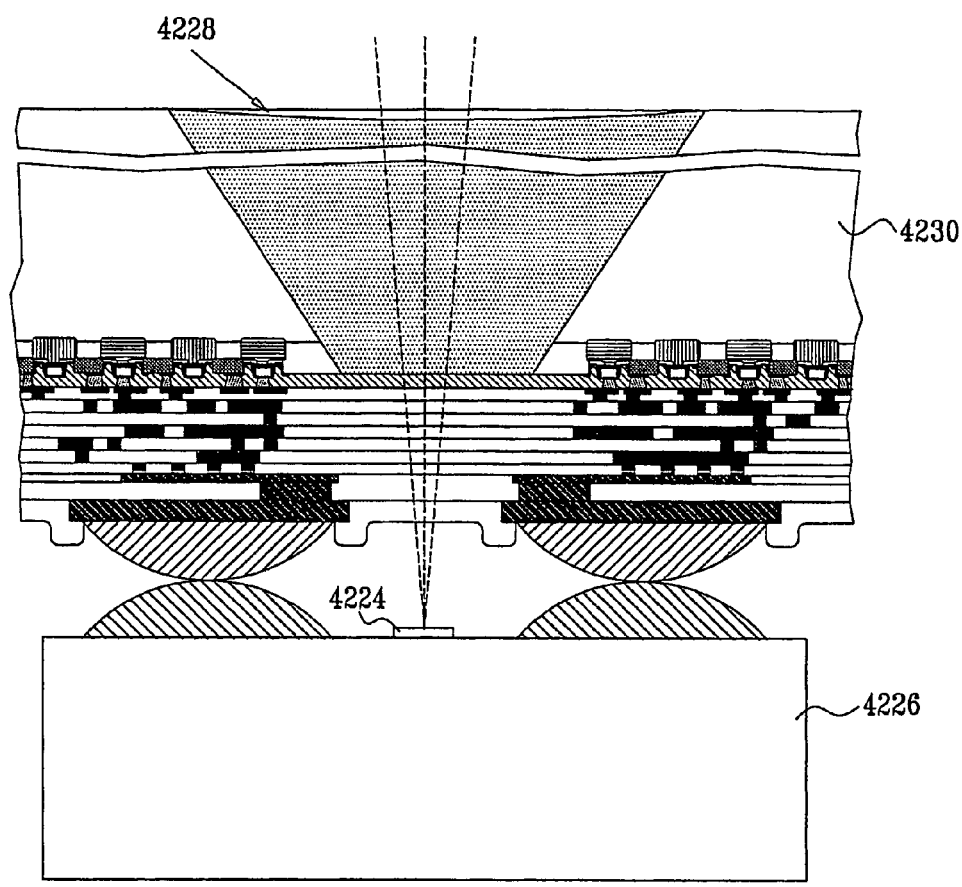
FIG. 18 is a simplified illustration of an integrated circuit module of the type referenced in FIGS. 17A-17E, including a laser light source.

Reference is now made to FIG. 18, which is a simplified illustration of an integrated circuit of the type referenced in FIGS. 17A-17E, including a laser light source 4224 formed on an integrated circuit chip 4226, located below an opening 4228 formed in an integrated circuit substrate 4230.

Figure 19:
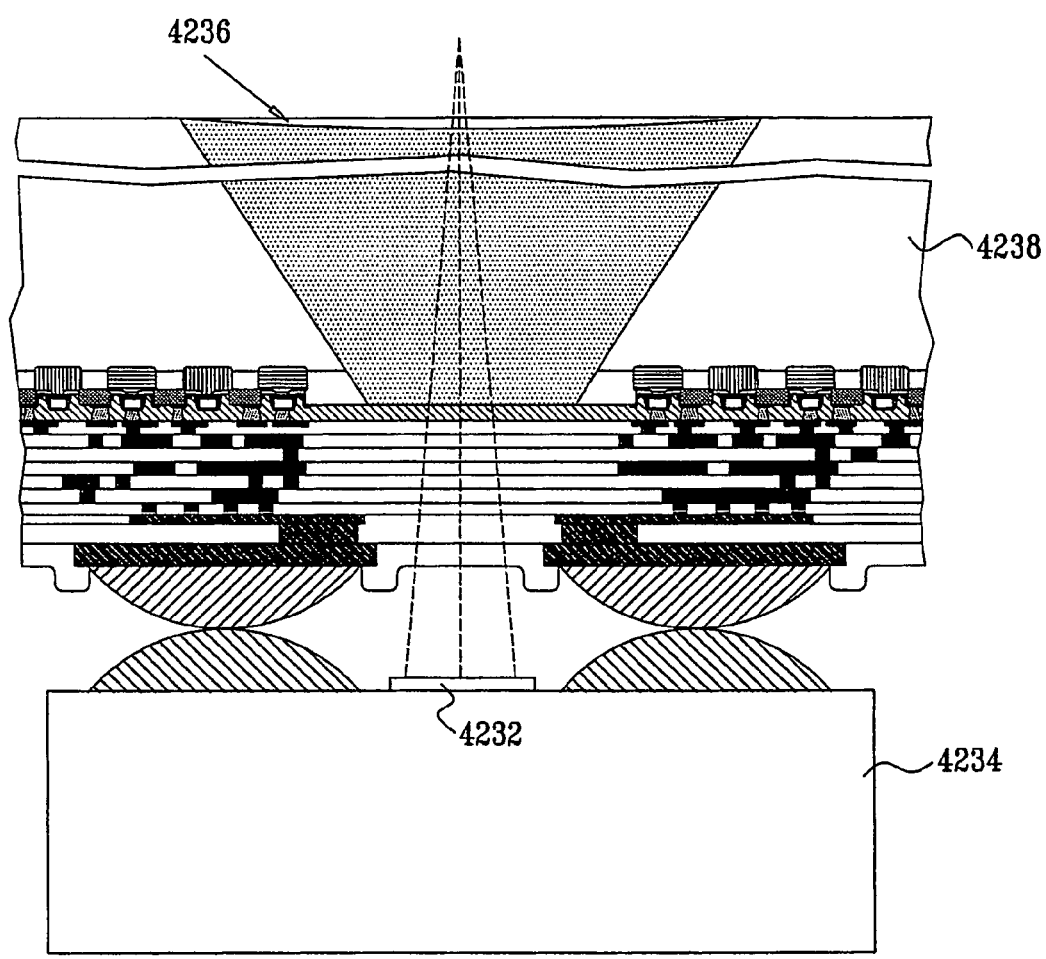
FIG. 19 is a simplified illustration of an integrated circuit module of the type referenced in FIGS. 17A-17E, including an optical detector.

Reference is now made to FIG. 19, which is a simplified illustration of an integrated circuit of the type referenced in FIGS. 17A-17E, including an optical detector 4232 formed on an integrated circuit chip 4234, located below an opening 4236 formed in an integrated circuit substrate 4238.

Figure 20:
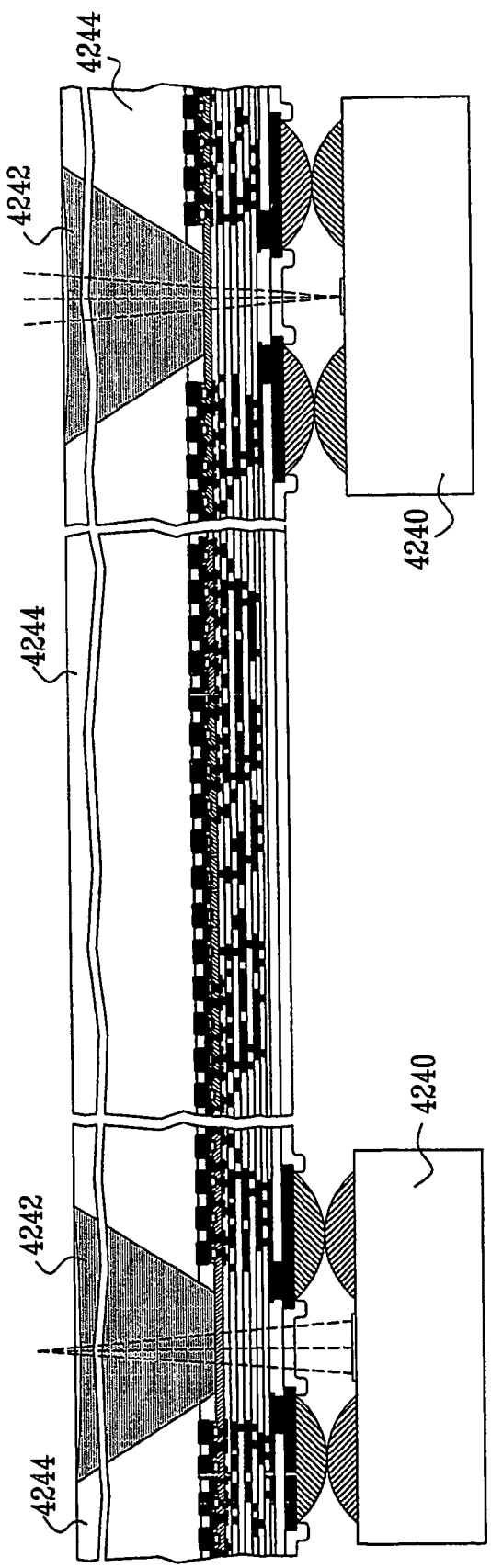
FIG. 20 is a simplified illustration of an integrated circuit module of the type referenced in FIGS. 17A-17E, including multiple elements located in multiple recesses formed within a substrate.

Reference is now made to FIG. 20, which is a simplified illustration of an integrated circuit of the type referenced in FIGS. 17A-17E, including multiple elements 4240 located below multiple openings 4242 formed within a substrate 4244. These elements may by any suitable electrical or electro-optic element.

Figure 21A:
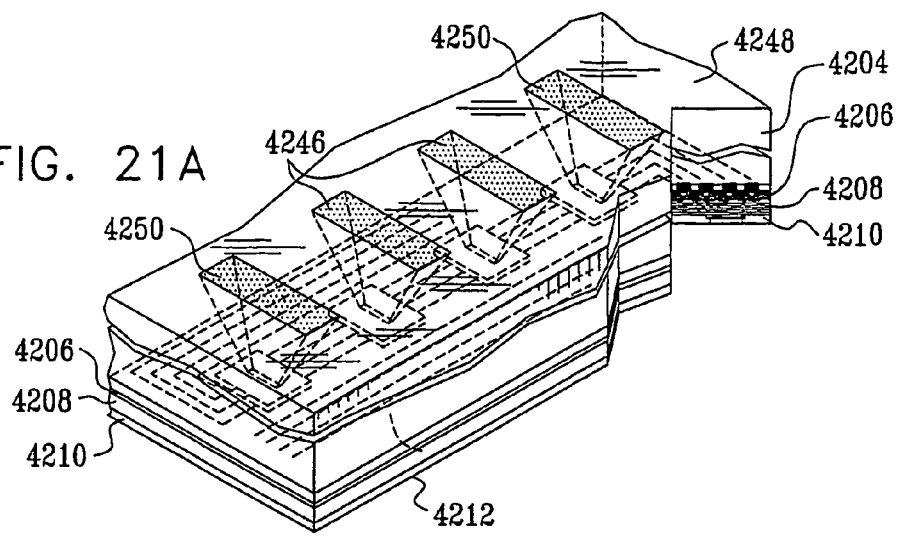
FIGS. 21A, 21B, 21C and 21D are simplified pictorial illustrations of additional stages in the production of a packaged electro-optic integrated circuit constructed and operative in accordance with the preferred embodiment of the present invention.

Reference is now made to FIGS. 21A, 21B, 21C and 21D, which are simplified pictorial illustrations of further stages in the production of a packaged electro-optic integrated circuit. FIG. 21A shows the substrate of FIG. 16 after it has been turned over. Openings 4246 are formed on portions of substrate 4204 and filled by a transparent optical adhesive 4250, such as OG 146, manufactured by Epoxy Technology, 14 Fortune Drive, Billerica, Mass. 01821, USA, whose refractive index preferably is precisely matched to that of cores of optical fibers, commercially available from manufacturers such as Dow Corning of the U.S.A. Openings 4246 preferably extend from a second surface 4248 of substrate 4204, which is opposite first surface 4212, to dielectric layer 4206. Alternatively, openings 4246 extend through dielectric layer 4206 and partially or fully through dielectric layers 4208 to passivation layer 4210. After openings 4246 are filled with optical adhesive 4250, multiple electro-optical elements are assembled onto integrated circuit substrate 4204, as described hereinabove with reference to FIGS. 17E-20.

Figure 21B:
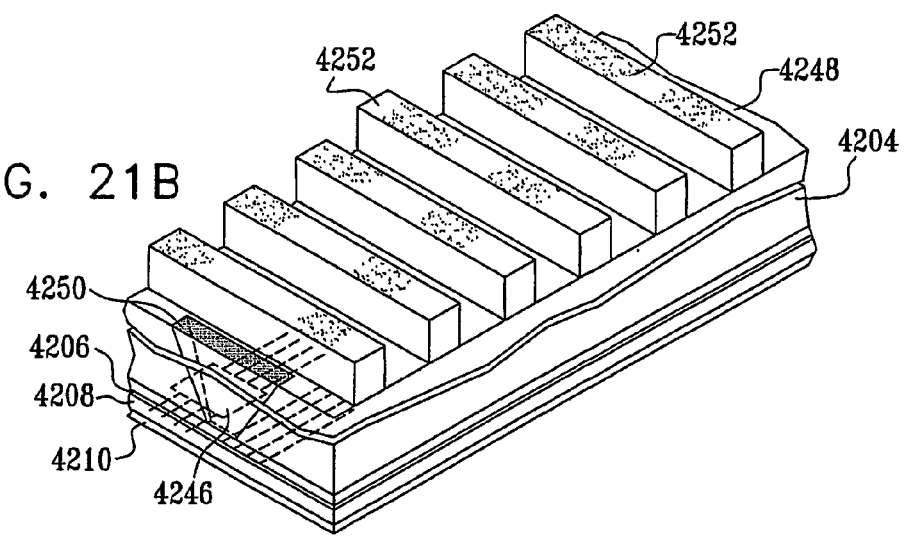

FIG. 21B shows an array of parallel, spaced, elongated optical fiber positioning elements 4252 that is preferably formed, such as by conventional photolithographic and etching techniques, over second surface 4248 of substrate 4204. Preferably, positioning elements 4252 are disposed intermediate openings 4246 filled with optical adhesive 4250.

Figure 21C:
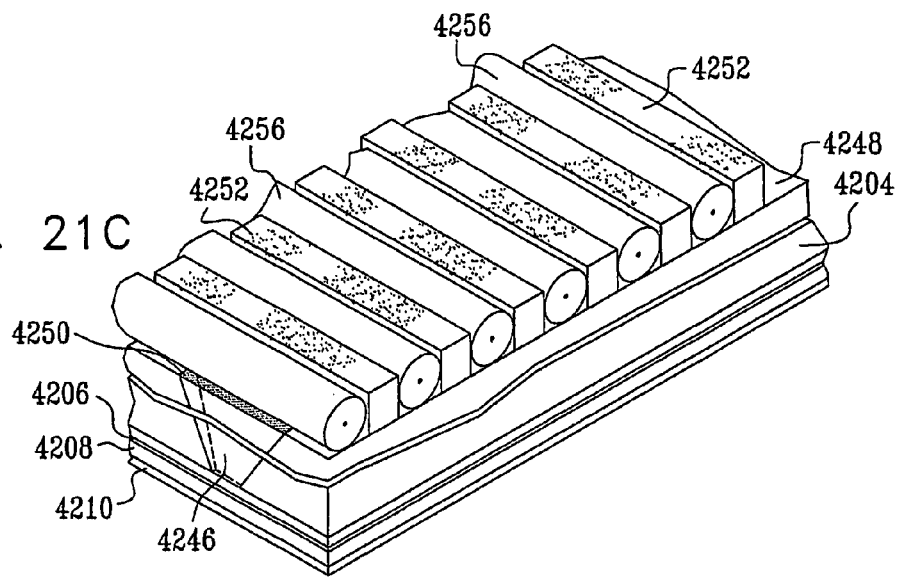

As seen in FIG. 21C, an array of optical fibers 4256 is disposed over surface 4248 of substrate 4204, each fiber being positioned between adjacent positioning elements 4252. The fibers 4256 are fixed in place, relative to positioning elements 4252 and to surface 4248 of substrate 4204, by means of a suitable adhesive 4258, preferably epoxy, as seen in FIG. 21D, and preferably overlie openings 4246 filled with optical adhesive 4250.

Figure 21D:
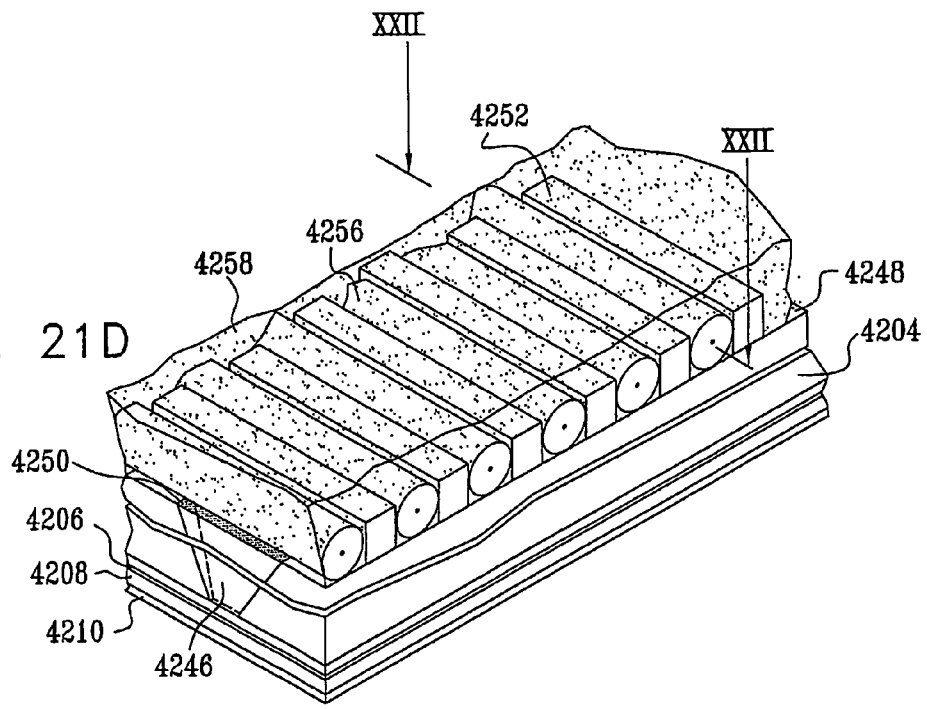
Figure 22A:
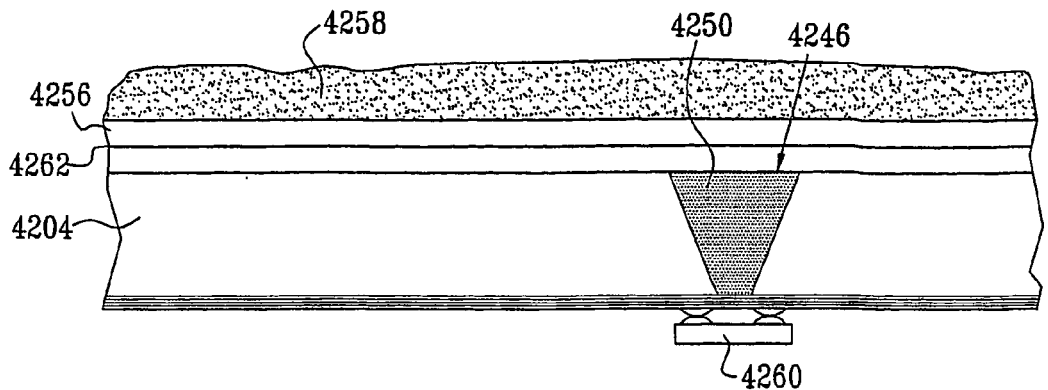
FIGS. 22A, 22B, 22C and 22D are simplified sectional illustrations of additional stages in the production of the packaged electro-optic integrated circuit referenced in FIGS. 21A-21D.

Reference is now made to FIGS. 22A, 22B, 22C, and 22D, which are simplified sectional illustrations, taken along the lines XXII-XXII in FIG. 21D, of additional stages in the production of a packaged electro-optic integrated circuit. As seen in FIG. 22A, electro-optic components 4260, such as diode lasers, are mounted onto electrical circuits 4200 (FIG. 16). It is appreciated that electro-optic components 4260 may include any suitable electro-optic components, such as laser diodes, diode detectors, waveguides, array waveguide gratings or semiconductor optical amplifiers. As described hereinabove with reference to FIG. 21A, optical opening 4246 is formed by removing portions of substrate 4204 across the entire thickness of the substrate 4204, and filling the opening 4246 with transparent optical adhesive 4250, such as OG 146, manufactured by Epoxy Technology, 14 Fortune Drive, Billerica, Mass. 01821, USA, whose refractive index preferably is precisely matched to that of cores 4262 of the optical fibers 4256.

Figure 22B:
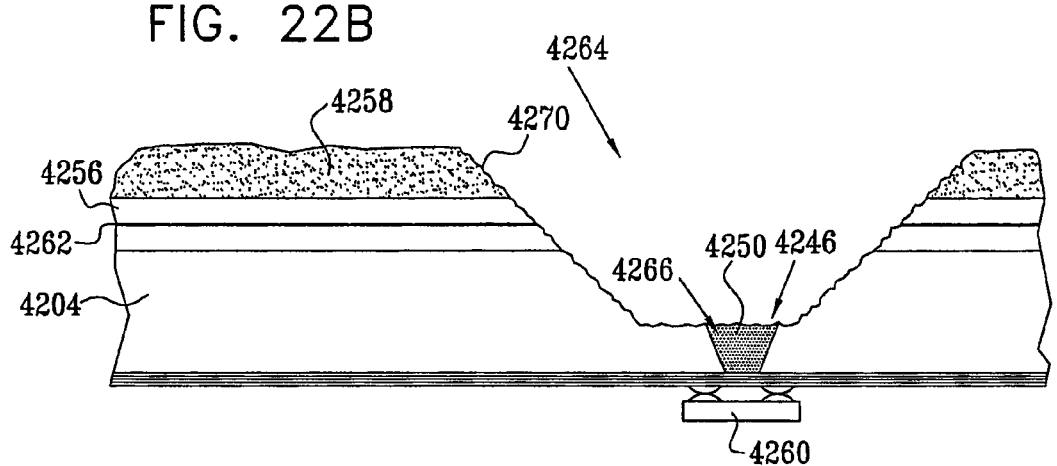

As shown in FIG. 22B, a transverse notch 4264 is preferably formed, at least partially overlapping the locations of the electro-optic components 4260 and extending through the adhesive 4258, entirely through each optical fiber 4256 and partially into both substrate 4204 and the optical adhesive 4250 in opening 4246. Specifically, the notch 4264 extends partly through openings 4246, defining an optical via 4266 filled with optically clear epoxy at the bottom of the notch 4264. It is appreciated that the surfaces 4270 defined by the notch 4264 are relatively rough, as shown.

Figure 22C:
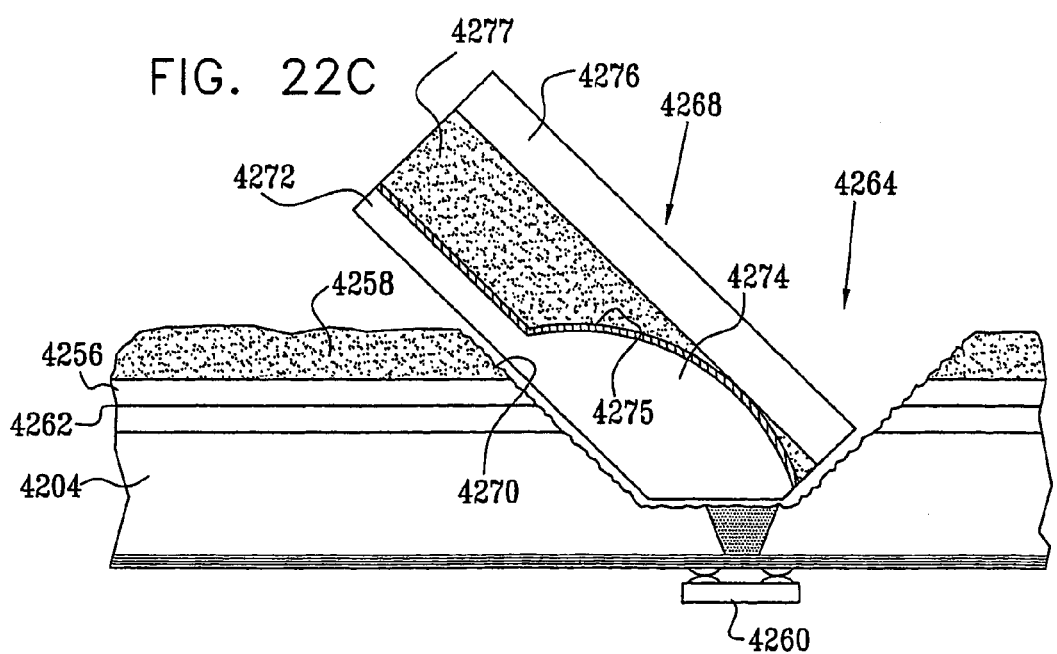
Figure 22D:
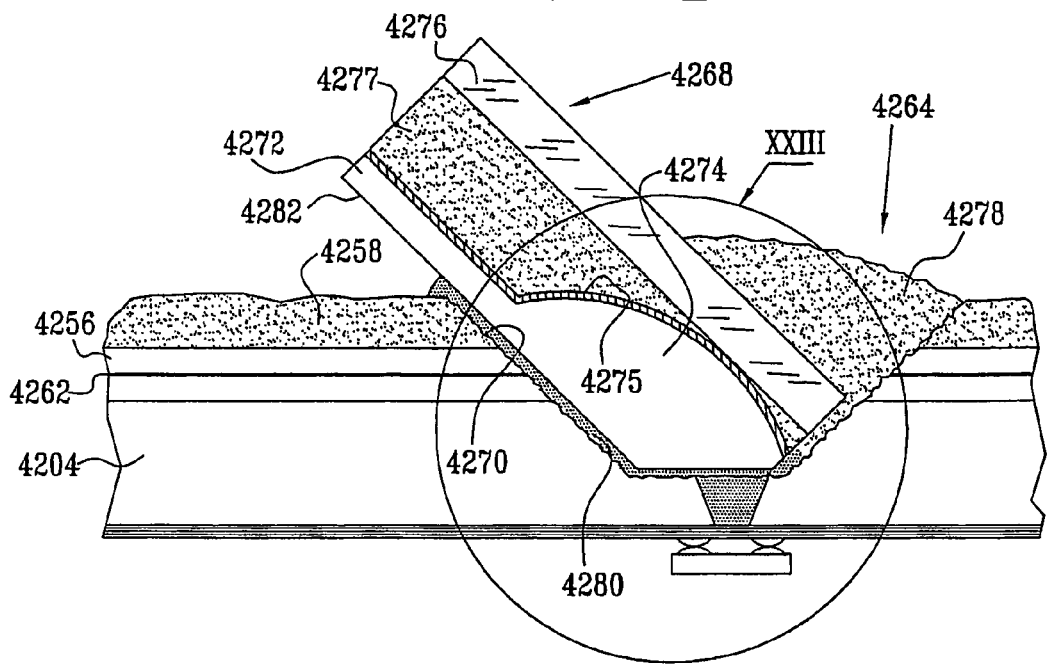

Turning now to FIG. 22C, it is seen that a partially flat and partially concave mirror 4268 is preferably mounted parallel to one of the rough inclined surfaces 4270 defined by notch 4264. Mirror 4268 preferably comprises a glass substrate 4272 having formed thereon a curved portion 4274 over which is formed a curved metallic layer or a dichroic filter layer 4275. A glass cover 4276 is attached to the back of curved portion 4274, preferably by a suitable adhesive 4277. As seen in FIG. 22D, preferably, the mirror 4268 is securely held in place partially by any suitable adhesive 4278, such as epoxy, and partially by an optical adhesive 4280, such as OG 146, manufactured by Epoxy Technology, 14 Fortune Drive, Billerica, Mass. 01821, USA, whose refractive index preferably is precisely matched to that of the cores 4262 of the optical fibers 4256. It is appreciated that optical adhesive 4280 may be employed throughout instead of adhesive 4278. Optical adhesive 4280 preferably fills the interstices between the roughened surface 4270 defined by notch 4264 and a surface 4282 of mirror 4268.

Figure 23A:
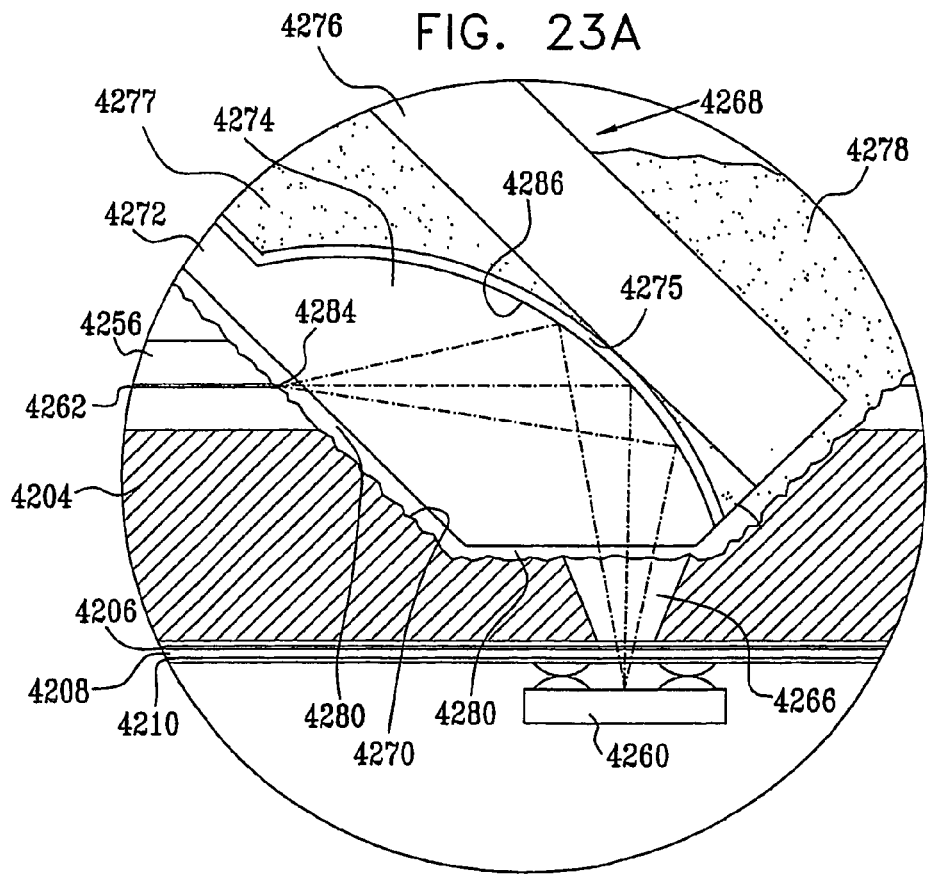
FIGS. 23A, 23B and 23C are enlarged simplified optical illustrations of a portion of FIG. 22D in accordance with a preferred embodiment of the present invention.

Reference is now made to FIG. 23A, which is an enlarged simplified optical illustration of a portion of FIG. 22D. Here it is seen that a generally uninterrupted optical path is defined for light, preferably in the wavelength range of 400-1650 nm, from an end 4284 of core 4262 of fiber 4256, through adhesive 4280, substrate 4272 and curved portion 4274 to a reflective surface 4286 of layer 4275 and thence through curved portion 4274, adhesive 4280, optical via 4266 and layers 4206, 4208 and 4210 which are substantially transparent to this light. It is noted that the index of refraction of adhesive 4280 is identical to that of optical via 4266 and precisely matched to the index of refraction of the core 4262. In the embodiment of FIG. 23A, the operation of the curved reflective surface 4286 is to focus light exiting from end 4284 of core 4262 onto the electro-optic component 4260 or similarly to focus light exiting from the electro-optic component 4260 onto the end 4284 of core 4262.

Figure 23B:
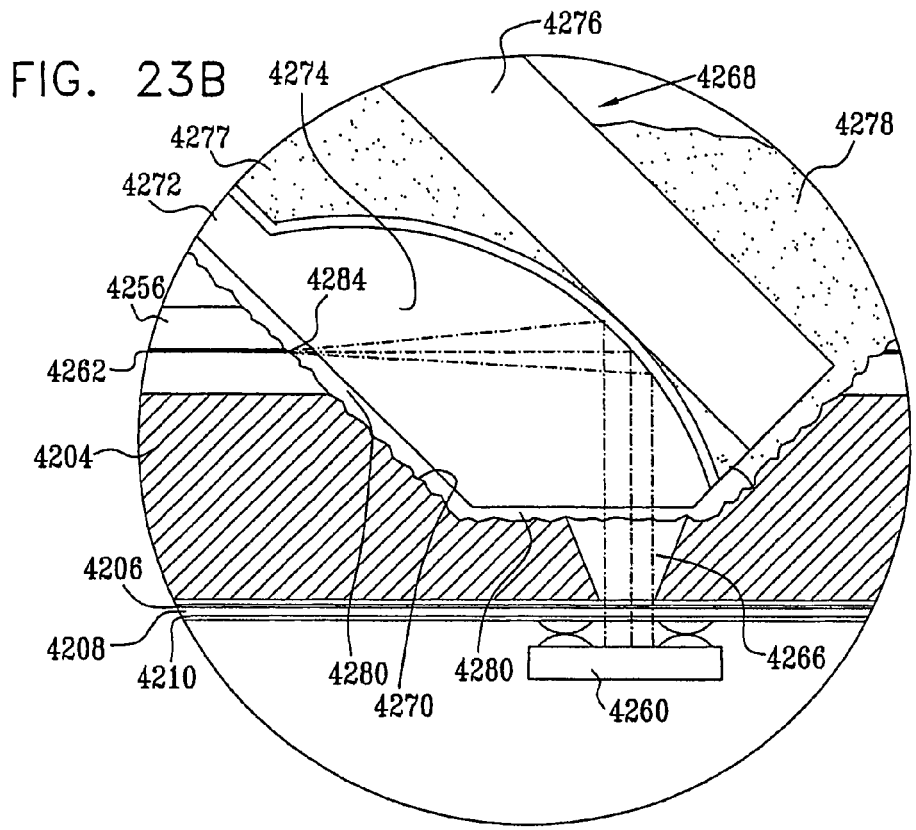

Reference is now made to FIG. 23B, which is an enlarged simplified optical illustration of a portion of FIG. 22D, in accordance with a further embodiment of the present invention. In this embodiment, the curvature of curved layer 4274 produces collimation rather than focusing of the light exiting from end 4284 of core 4262 onto the electro-optic component 4260.

Figure 23C:
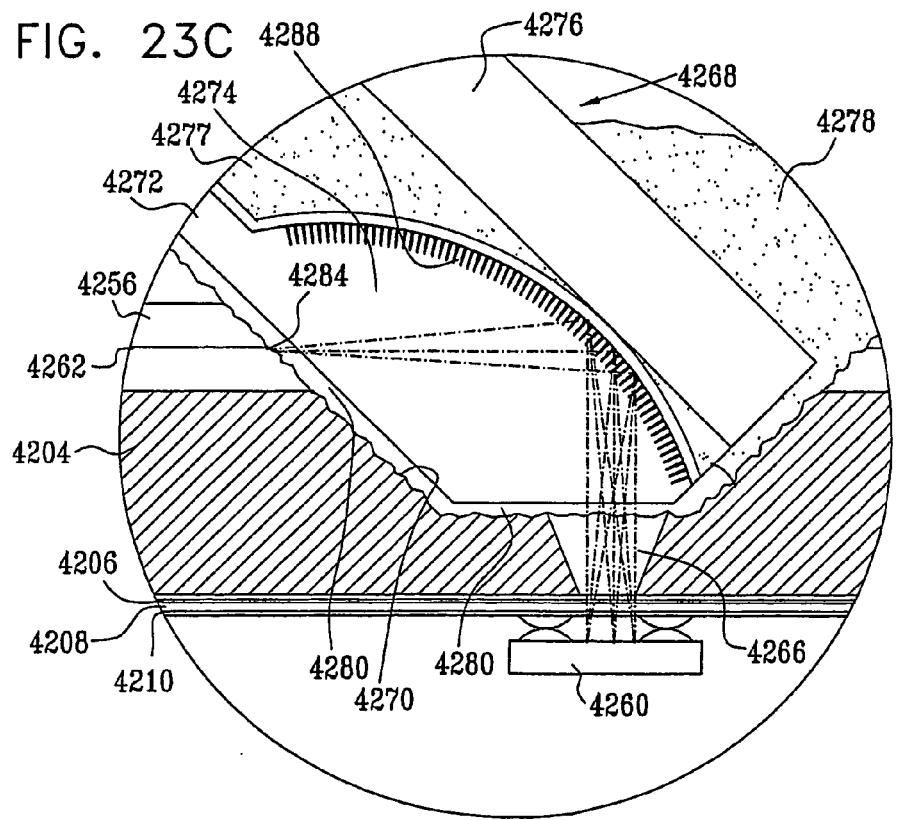

Reference is now made to FIG. 23C, which is an enlarged simplified optical illustration of a portion of FIG. 22D, in accordance with yet another embodiment of the present invention, wherein a grating 4288 is added to curved portion 4274. The additional provision of grating 4288 causes separation of light impinging thereon according to its wavelength, such that multi-spectral light exiting from end 4284 of core 4262 is focused at multiple locations on electro-optic component 4260 in accordance with the wavelengths of components thereof.

Figure 24:
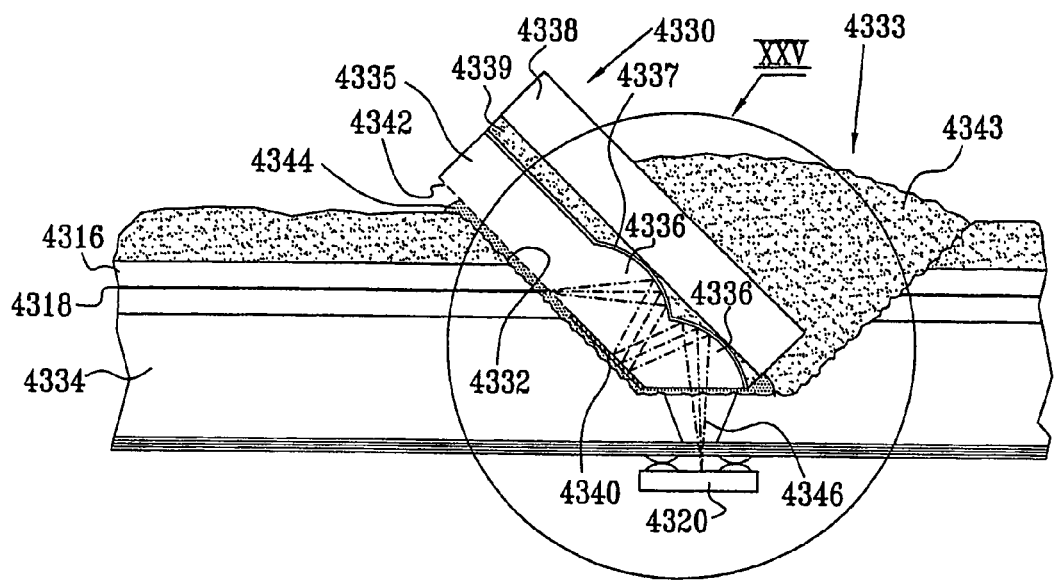
FIG. 24 is a simplified sectional illustration of a packaged electro-optic integrated circuit constructed and operative in accordance with yet another preferred embodiment of the present invention.

Reference is now made to FIG. 24, which is a simplified sectional illustration of A packaged electro-optic integrated circuit constructed and operative in accordance with yet another preferred embodiment of the present invention. The embodiment of FIG. 24 corresponds generally to that described hereinabove with respect to FIG. 22D, other than in that a mirror with multiple concave reflective surfaces is provided rather than a mirror with a single such reflective surface. As seen in FIG. 24, light from an optical fiber 4316, having a core 4318, is directed onto an electro-optic component 4320 by a partially flat and partially concave mirror assembly 4330, preferably mounted parallel to one of the rough inclined surfaces 4332 defined by a notch 4333 in a substrate 4334.

Mirror assembly 4330 preferably comprises a glass substrate 4335 having formed thereon a plurality of curved portions 4336 over which is formed a curved metallic layer or a dichroic filter layer 4337. A glass cover 4338 is attached to the back of plurality of curved portions 4336, preferably by a suitable adhesive 4339. Mirror assembly 4330 also defines a reflective surface 4340, which is disposed on a planar surface 4342 generally opposite layer 4337. Preferably, the mirror assembly 4330 is securely held in place partially by any suitable adhesive 4343, such as epoxy, and partially by an optical adhesive 4344, such as OG 146, manufactured by Epoxy Technology, 14 Fortune Drive, Billerica, Mass. 01821, USA, whose refractive index preferably is precisely matched to that of core 4318 of the optical fiber 4316 and identical to an adhesive used to fill an optical via 4346. It is appreciated that optical adhesive 4344 may be employed throughout instead of adhesive 4343. The optical adhesive 4344 preferably fills the interstices between the roughened surface 4332 defined by notch 4333 and surface 4342 of mirror assembly 4330.

Figure 25A:
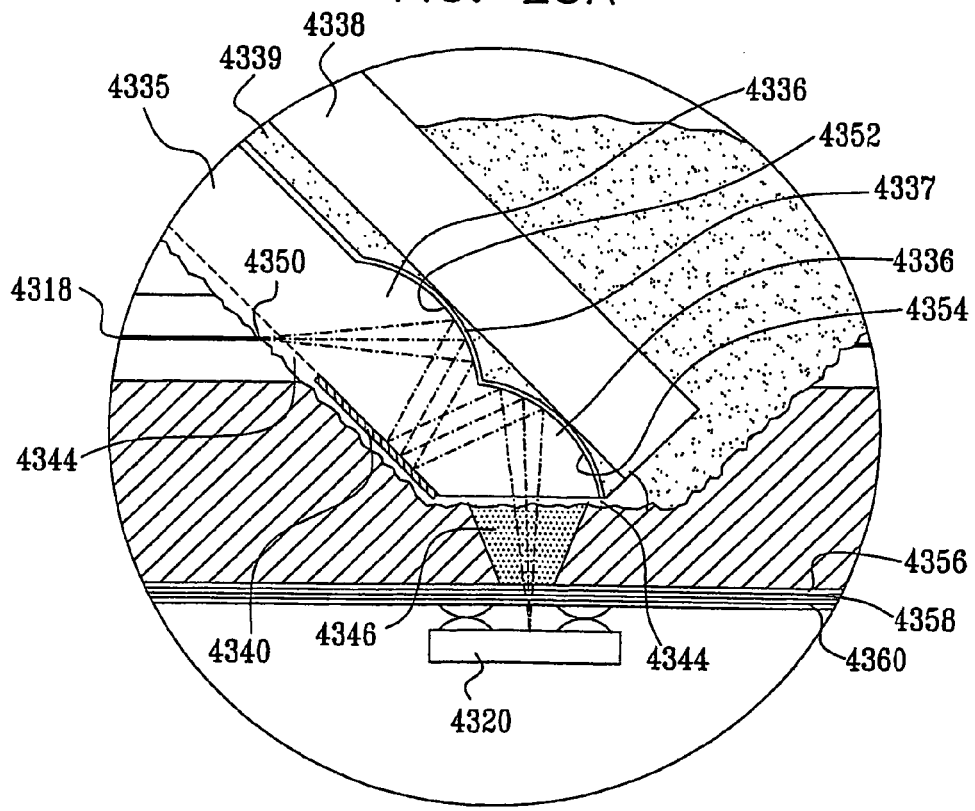

Reference is now made to FIG. 25A, which is an enlarged simplified optical illustration of a portion of FIG. 24. Here it is seen that a generally uninterrupted optical path is defined for light, preferably in the wavelength range of 400-1650 nm, from an end 4350 of core 4318, through adhesive 4344, substrate 4335 and first curved portion 4336, to a curved reflective surface 4352 of layer 4337 and thence through first curved portion 4336 and substrate 4335 to reflective surface 4340, from reflective surface 4340 through substrate 4335 and second curved portion 4336 to another curved reflective surface 4354 of layer 4337 and thence through second curved portion 4336, substrate 4335, adhesive 4344, optical via 4346 and dielectric layers 4356, 4358 and 4360, which are substantially transparent to this light.

It is noted that the index of refraction of adhesive 4344 is close to but not identical to that of substrate 4335. In the embodiment of FIG. 25A, the operation of curved layer 4337 and reflective surface 4340 is to focus light exiting from end 4350 of core 4318 onto the electro-optic component 4320.

Reference is now made to FIG. 25B, which is an enlarged simplified optical illustration of a portion of FIG. 24, in accordance with a further embodiment of the present invention. In this embodiment, the curvature of curved layer 4337 produces collimation rather than focusing of the light exiting from end 4350 of core 4318 onto the electro-optic component 4320.

Reference is now made to FIG. 25C, which is an enlarged simplified optical illustration of a portion of FIG. 24, in accordance with yet another embodiment of the present invention, wherein a reflective grating 4362 replaces reflective surface 4340 (FIG. 24). The additional provision of grating 4362 causes separation of light impinging thereon according to its wavelength, such that multi-spectral light exiting from end 4350 of core 4318 is focused at multiple locations on electro-optic component 4320 in accordance with the wavelengths of components thereof.

Reference is now made to FIGS. 26A, 26B, 26C, 26D and 26E, which are simplified pictorial illustrations of stages in the production of a packaged electro-optic integrated circuit, constructed and operative in accordance with still another preferred embodiment of the present invention.

As seen in FIG. 26A, one or more semiconductor functional blocks 4400 are preferably formed onto a first surface 4402 of an optional epitaxial layer 4403 of a substrate 4404. The epitaxial layer 4403 is typically formed of silicon and has a thickness of between 2-10 microns, while the substrate 4404 is typically formed of silicon and has a thickness of 200-1000 microns. Semiconductor functional blocks 4400 are preferably formed onto substrate 4404 by conventional photolithographic and thin film processing techniques employed in the production of integrated circuits. Semiconductor functional blocks 4400 preferably include transistors 4405 formed in layer 4403, covered by a dielectric layer 4406, over which are typically formed a plurality of metal conductive layers 4407 interspersed with dielectric layers 4408, covered by a top passivation layer 4410. The dielectric layers are preferably transparent to light preferably in both the visible and the infrared bands within at least part of the wavelength range of 400-1650 nm. Vias 4411, connected to at least one conductive layer 4407, extend through layer 4410 to the top surface 4412. One or more semiconductor functional blocks 4400 are preferably formed on substrate 4404.

FIG. 26A also shows locations 4414 of openings 4416 formed, as shown in FIG. 26B, by removing portions of substrate 4404. It is noted that locations 4414 do not underlie vias 4411. Preferably, the entire thickness of the substrate 4404 is removed at locations 4414, leaving dielectric layers 4406 and 4408 and conductive layers 4407 intact. Alternatively, dielectric layer 4406 may also be removed, leaving some or all of dielectric layers 4408 intact. The removal of substrate 4404 may be achieved by using conventional etching techniques and, preferably, provides a volume of dimensions of around 100 to 200 microns in width and 1000 to 3000 microns in length. The openings 4416 are filled with an optical adhesive 4418, such as OG 146, manufactured by Epoxy Technology, 14 Fortune Drive, Billerica, Mass. 01821, USA, whose refractive index preferably is precisely matched to that of the cores of optical fibers, commercially available from manufacturers such as Dow Corning of the U.S.A.

Figure 26C:
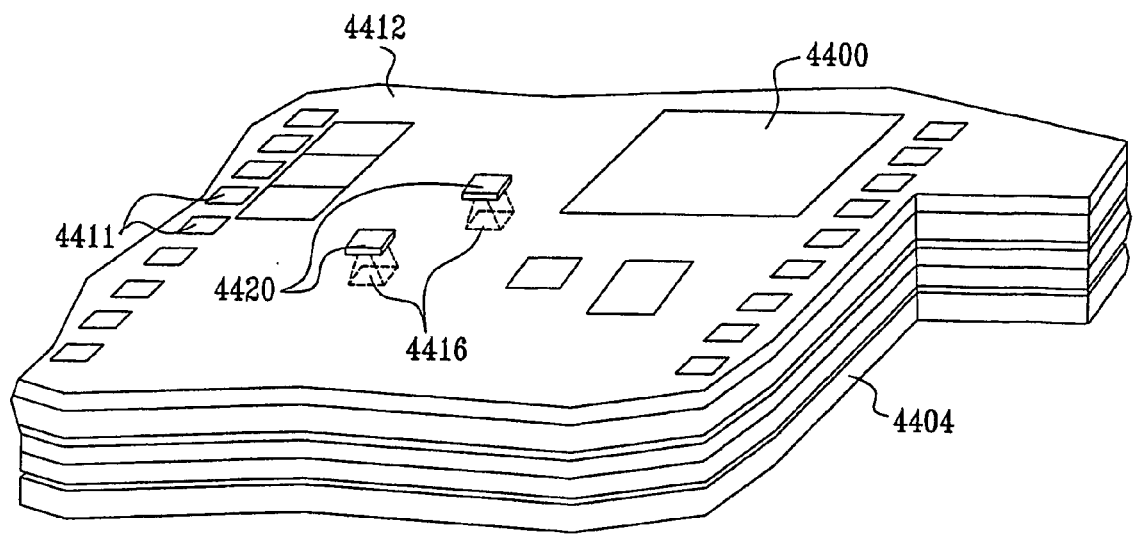

As seen in FIG. 26C, integrated circuit chips 4420 are preferably located above openings 4416. These chips may be operatively engaged with vias (not shown) by being soldered to bumps (not shown), as illustrated for example in FIG. 17E, thus creating an optoelectronic integrated circuit, wherein integrated circuit chips 4420 reside above the substrate of the integrated circuit.

Figure 26D:
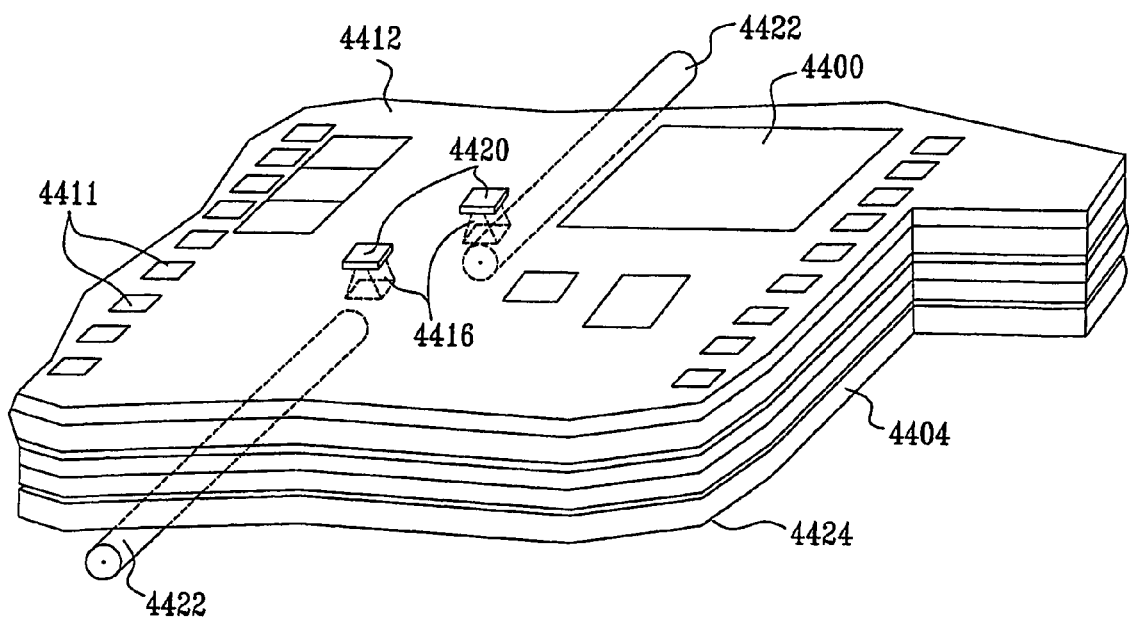

As seen in FIG. 26D, one or more fibers 4422 are fixed underneath a bottom surface 4424 of substrate 4404, preferably by an adhesive (not shown), similarly to that shown in FIGS. 21C and 21D. Multiple fibers 4422 may be identical, similar or different and need not be arranged in a mutually aligned spatial relationship.

Figure 26E:
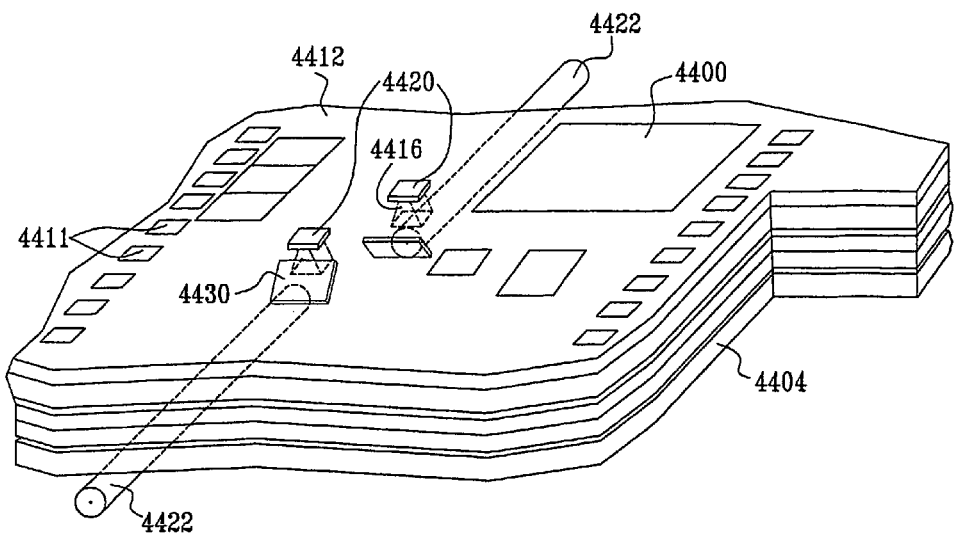

As shown in FIG. 26E, it is seen that a mirror 4430, typically of the type illustrated in any of FIGS. 22C-25C, is preferably mounted in operative engagement with each fiber 4422.

Figure 27:
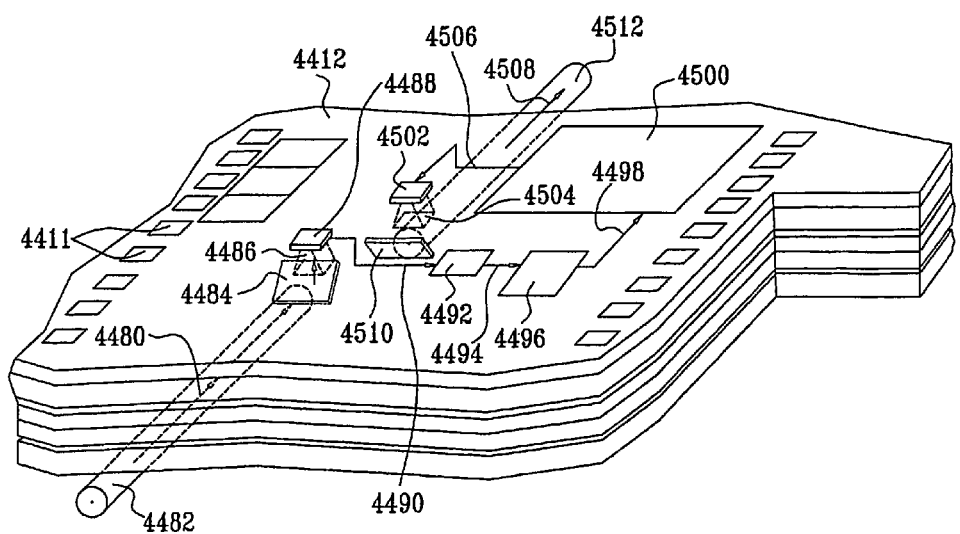
FIG. 27 is a simplified functional illustration of a preferred embodiment of the structure of FIG. 26E.

Reference is now made to FIG. 27, which is a simplified functional illustration of a preferred embodiment of the structure of FIG. 26E. As seen in FIG. 27, a high frequency optical signal 4480, typically of frequency 10 to 40 GHz, passes through an optical fiber 4482 and is reflected by a mirror 4484 through a recess 4486 onto a diode 4488, which is located above the recess 4486. An output electrical signal 4490 from diode 4488 may be supplied to an amplifier 4492, which may be formed on the silicon substrate circuitry. The amplified output 4494 of amplifier 4492 may be provided to a serializer/deserializer 4496, which may be formed on the silicon substrate circuitry.

An output signal 4498 from serializer/deserializer 4496 is preferably fed to one or more semiconductor functional blocks 4500 for further processing. A laser 4502, which may be located above a recess 4504, may employ an electrical output 4506 from functional block 4500 to produce a modulated light beam 4508, which is reflected by a mirror 4510 through recess 4504 to pass through a fiber 4512. It is appreciated that electro-optic integrated circuit devices 4488 and 4502 may be configured to operate as either a light transmitter or a light receiver or both.

It is appreciated that in addition to the substrate materials described hereinabove, the substrates may comprise silicon, silicon germanium, silicon on sapphire, silicon on insulator (SOI), gallium arsenide, indium phosphide or any other suitable material.

Figure 28A:
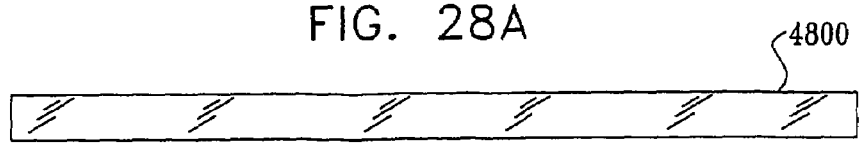
FIGS. 28A, 28B, 28C, 28D and 28E are simplified illustrations of a method for fabricating optical elements employed in the embodiments of FIGS. 16-27 and FIGS. 35A-41 in accordance with different embodiments of the present invention.
Figure 28B:
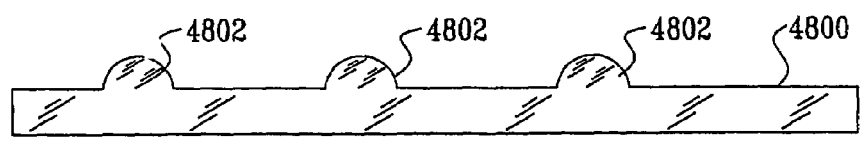

Reference is now made to FIGS. 28A, 28B, 28C, 28D and 28E, which are simplified illustrations of a method for fabricating micro optical elements employed in the embodiments of FIGS. 16-27 and FIGS. 35A-41 in accordance with one embodiment of the present invention. FIG. 28A shows a glass substrate 4800, typically of thickness 200-400 microns. Substrate 4800 has formed thereon an array of microlenses 4802, typically formed of photoresist, as seen in FIG. 28B. The microlenses 4802 preferably have an index of refraction that is identical or very close to that of substrate 4800. The microlenses may be formed by one or more conventional techniques, such as photolithography and thermal reflow, photolithography using of a grey scale mask, jet printing and pattern transfer onto the substrate by etching.

Figure 28C:
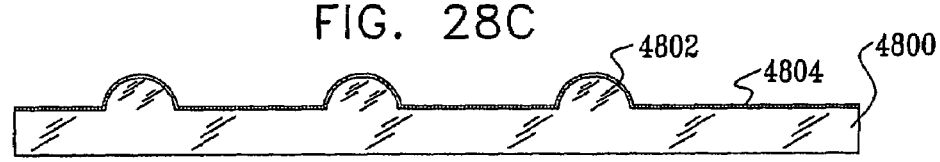
Figure 28D:
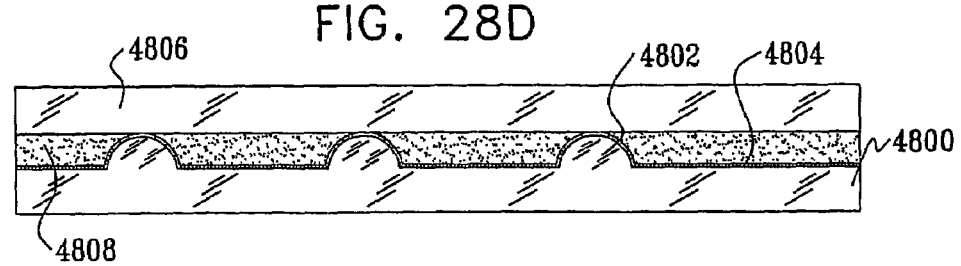
Figure 28E:
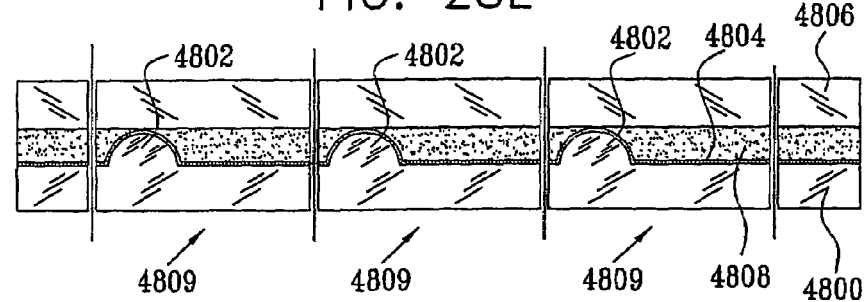

A thin metal layer 4804, typically aluminum, is formed over the substrate 4800 and microlenses 4802 as seen in FIG. 28C, typically by evaporation or sputtering. A glass cover layer 4806 is preferably formed over the array of microlenses 4802 and sealed thereover by an adhesive 4808, as seen in FIG. 28D. The substrate 4800, the metal layer 4804 formed thereon and the glass cover layer 4806 and associated adhesive 4808 are then diced by conventional techniques, as shown in FIG. 28E, thereby defining individual optical elements 4809, each including a curved portion defined by microlens 4802.

Figure 29A:
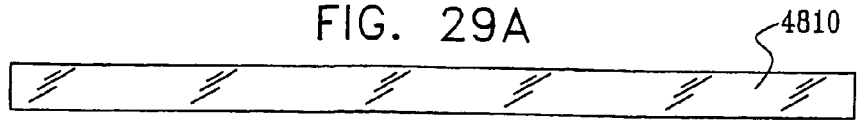
FIGS. 29A, 29B, 29C, 29D, 29E and 29F are simplified illustrations of a method for fabricating optical elements employed in the embodiments of FIGS. 16-27 and FIGS. 35A-41 in accordance with other embodiments of the present invention.
Figure 29B:
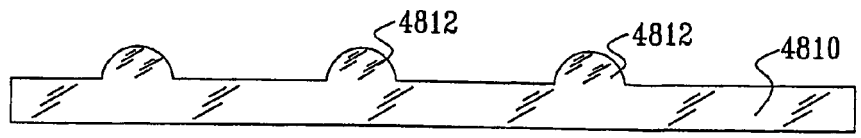

Reference is now made to FIGS. 29A, 29B, 29C, 29D, 29E and 29F, which are simplified illustrations of a method for fabricating optical elements employed in the embodiments of FIGS. 16-27 and FIGS. 35A-41 in accordance with another embodiment of the present invention. A glass substrate 4810, typically of thickness 200-400 microns, seen in FIG. 29A, has formed thereon an array of microlenses 4812, typically formed of photoresist, as seen in FIG. 29B. The microlenses 4812 preferably have an index of refraction that is identical or very close to that of substrate 4810. The microlenses may be formed by one or more conventional techniques, such as photolithography and thermal reflow, photolithography using of a grey scale mask, jet printing and pattern transfer onto the substrate by etching.

Figure 29C:
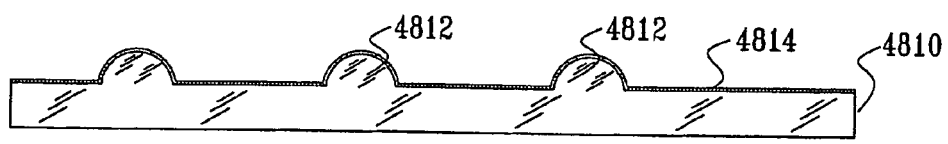
Figure 29D:
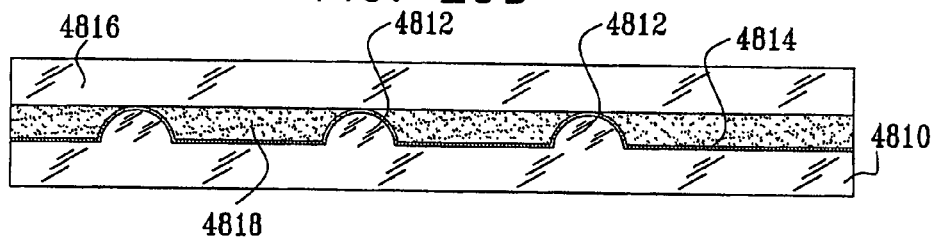
Figure 29E:
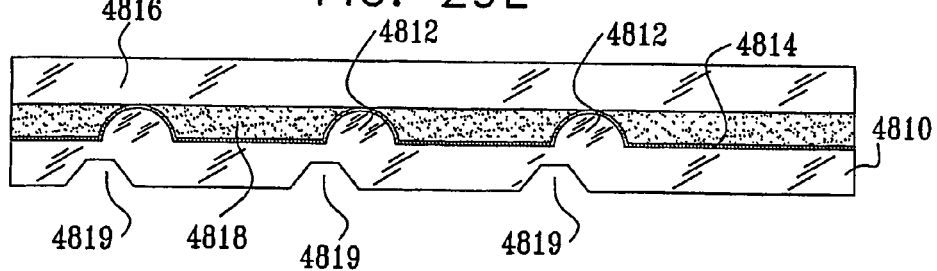

A thin metal layer 4814, typically aluminum, is formed over the substrate 4810 and microlenses 4812 as seen in FIG. 29C, typically by evaporation or sputtering. A glass cover layer 4816 is preferably formed over the array of microlenses 4812 and sealed thereover by an adhesive 4818, as seen in FIG. 29D. The substrate 4810 is then notched from underneath by conventional techniques. As seen in FIG. 29E, notches 4819 are preferably formed at locations partially underlying microlenses 4812.

Figure 29F:
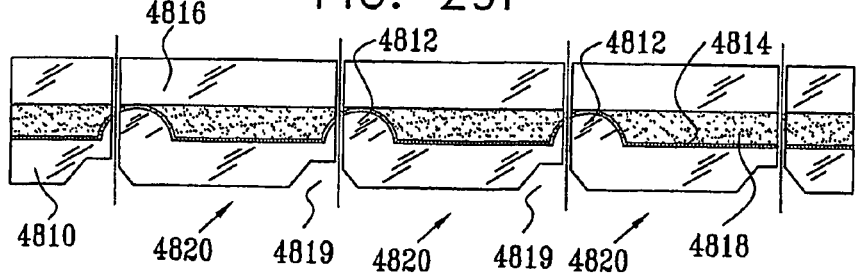

Following notching, the substrate 4810, the microlenses 4812, the metal layer 4814 formed thereon, the glass cover layer 4816 and the adhesive 4818 are diced by conventional techniques, as shown in FIG. 29F, at locations intersecting inclined walls of the notches 4819, thereby defining individual optical elements 4820, each including a curved portion defined by part of microlens 4812.

Figure 30A:
FIGS. 30A, 30B, 30C, 30D, 30E, 30F and 30G are simplified illustrations of a method for fabricating optical elements employed in the embodiments of FIGS. 16-27 and FIGS. 35A-41 in accordance with yet other embodiments of the present invention.
Figure 30B:
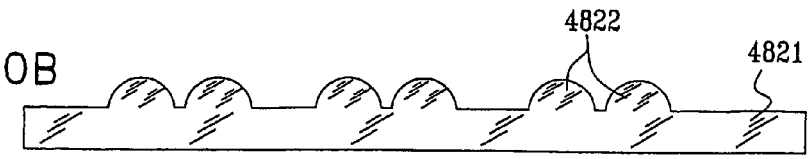

Reference is now made to FIGS. 30A, 30B, 30C, 30D, 30E, 30F and 30G, which are simplified illustrations of a method for fabricating optical elements employed in the embodiments of FIGS. 16-27 and FIGS. 35A-41 in accordance with yet another embodiment of the present invention. A glass substrate 4821, typically of thickness 200-400 microns, seen in FIG. 30A, has formed thereon an array of microlenses 4822, typically formed of photoresist, as seen in FIG. 30B. The microlenses 4822 preferably have an index of refraction that is identical or very close to that of substrate 4821. The microlenses may be formed by one or more conventional techniques, such as photolithography and thermal reflow, photolithography using of a grey scale mask, jet printing and pattern transfer onto the substrate by etching.

Figure 30C:
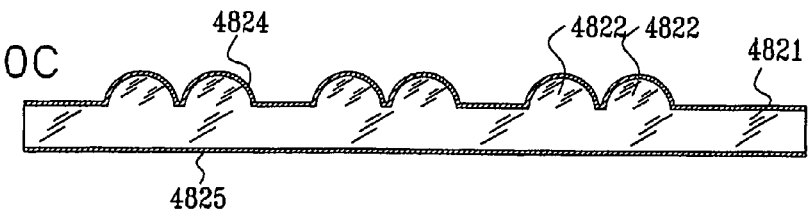
Figure 30D:
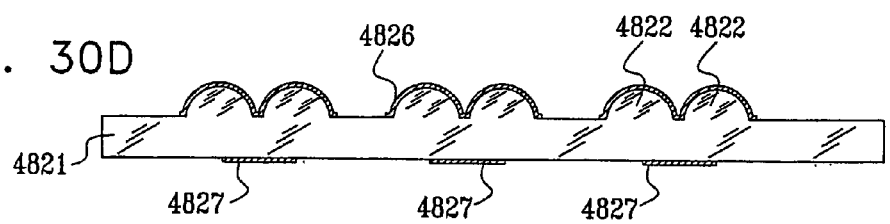
Figure 30E:
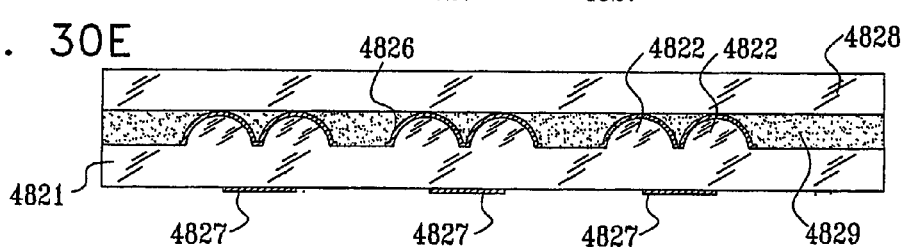

A thin metal layer 4824, typically aluminum, is formed over the substrate 4821 and microlenses 4822 as seen in FIG. 30C, typically by evaporation or sputtering. An additional metal layer 4825, typically aluminum, is similarly formed on an opposite surface of substrate 4821. Metal layers 4824 and 4825 are patterned typically by conventional photolithographic techniques to define respective reflective surfaces 4826 and 4827 as seen in FIG. 30D. A glass cover layer 4828 is preferably formed over the array of microlenses 4822 and sealed thereover by an adhesive 4829 as seen in FIG. 30E.

Figure 30F:
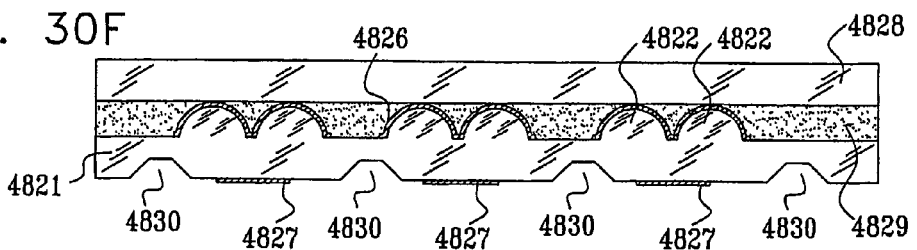
Figure 30G:
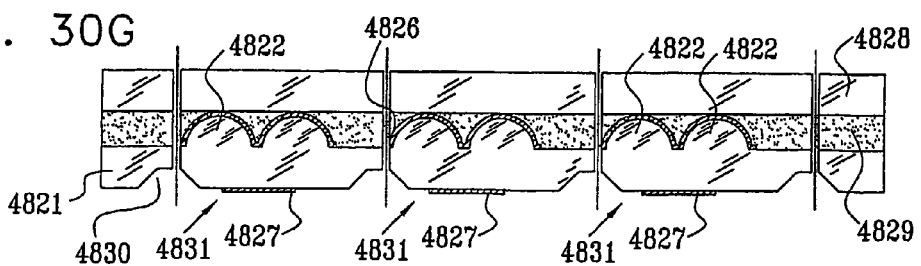

The substrate 4821 is notched from underneath by conventional techniques. As seen in FIG. 30F, notches 4830 need not be at locations partially underlying microlenses 4822. Following notching, the substrate 4821, the microlenses 4822, the metal layers 4824 and 4825 (FIG. 30C), the glass cover layer 4828 and the adhesive 4829 are diced by conventional techniques, as shown in FIG. 30G, at locations intersecting inclined walls of the notches 4830, thereby defining individual optical elements 4831, each including curved reflective portion 4826 defined by a pair of microlenses 4822, as well as flat reflective surface 4827.

Figure 31A:
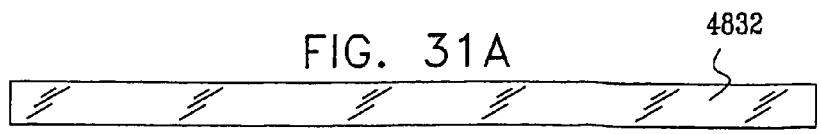
FIGS. 31A, 31B, 31C, 31D, 31E, 31F and 31G are simplified illustrations of a method for fabricating optical elements employed in the embodiments of FIGS. 16-27 and FIGS. 35A-41 in accordance with still another embodiment of the present invention.
Figure 31B:

Reference is now made to FIGS. 31A, 31B, 31C, 31D, 31E, 31F and 31G, which are simplified illustrations of a method for fabricating optical elements employed in the embodiments of FIGS. 16-27 and FIGS. 35A-41 in accordance with still another embodiment of the present invention. A glass substrate 4832, typically of thickness 200-400 microns, seen in FIG. 31A, has formed thereon an array of pairs of microlenses 4833, typically formed of photoresist, as seen in FIG. 31B. The microlenses 4833 preferably have an index of refraction that is identical or very close to that of substrate 4832. The microlenses may be formed by one or more conventional techniques, such as photolithography and thermal reflow, photolithography using of a grey scale mask, jet printing and pattern transfer onto the substrate by etching.

Figure 31C:
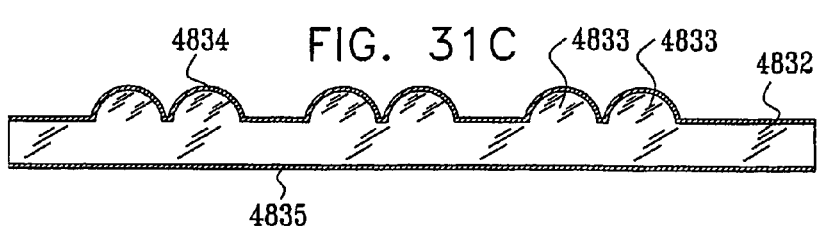
Figure 31D:
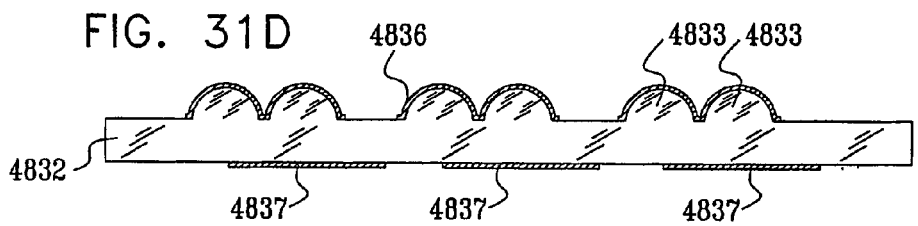
Figure 31E:
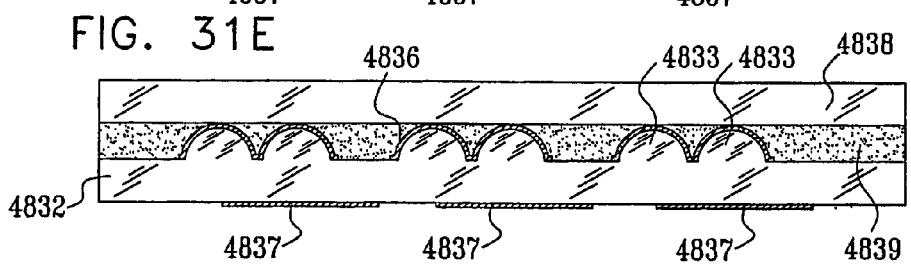

A thin metal layer 4834, typically aluminum, is formed over the substrate 4832 and pairs of microlenses 4833, as seen in FIG. 31C, typically by evaporation or sputtering. An additional metal layer 4835, typically aluminum, is similarly formed on an opposite surface of substrate 4832. Metal layers 4834 and 4835 are patterned, typically by conventional photolithographic techniques, to define respective reflective surfaces 4836 and 4837 as seen in FIG. 31D. A glass cover layer 4838 is preferably formed over the array of microlenses 4833 and sealed thereover by an adhesive 4839 as seen in FIG. 31E.

Figure 31F:
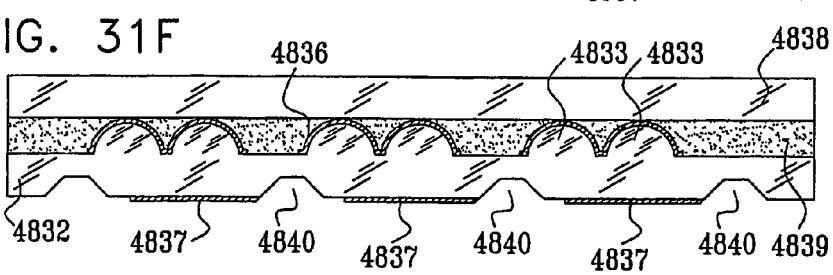
Figure 31G:
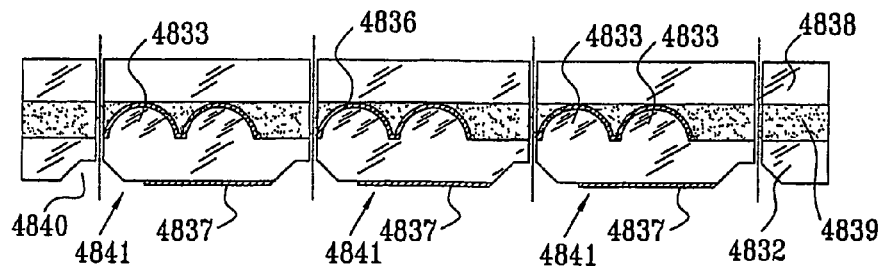

The substrate 4832 is notched from underneath by conventional techniques, defining notches 4840, as seen in FIG. 31F. Following notching, the substrate 4832, the microlenses 4833, the metal layers 4834 and 4835 (FIG. 31C), the glass cover layer 4838 and the adhesive 4839 are diced by conventional techniques, as shown in FIG. 31G, at locations intersecting inclined walls of the notches 4840, thereby defining individual optical elements 4841, each including curved reflective surface 4836 defined by a pair of microlenses 4833, as well as flat reflective surface 4837.

Figure 32A:
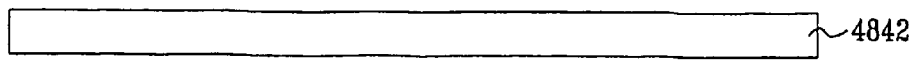
FIGS. 32A, 32B, 32C, 32D, 32E, 32F, 32G and 32H are simplified illustrations of a method for fabricating optical elements employed in the embodiments of FIGS. 16-27 and FIGS. 35A-41 in accordance with a further embodiment of the present invention.
Figure 32B:
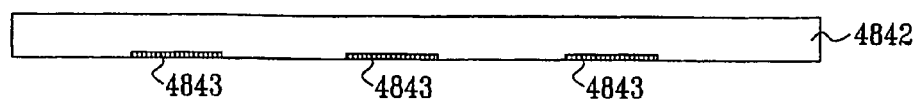
Figure 32C:
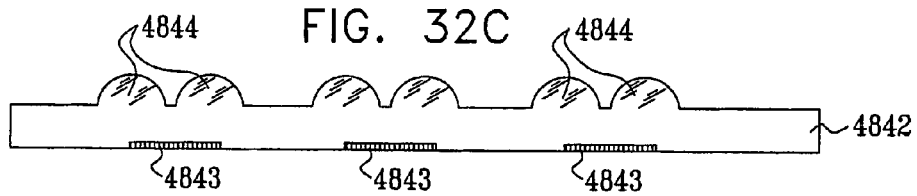

Reference is now made to FIGS. 32A, 32B, 32C, 32D, 32E, 32F, 32G and 32H, which are simplified illustrations of a method for fabricating optical elements employed in the embodiments of FIGS. 16-27 and FIGS. 35A-41 in accordance with a further embodiment of the present invention. A glass substrate 4842, typically of thickness 200-400 microns, seen in FIG. 32A, has formed in an underside surface thereof an array of reflective diffraction gratings 4843, as seen in FIG. 32B, typically by etching. Alternatively, the gratings 4843 may be formed on the surface of the substrate 4842, typically by lithography or transfer. An array of pairs of microlenses 4844, typically formed of photoresist, is formed on an opposite surface of substrate 4842, as seen in FIG. 32C. The microlenses 4844 preferably have an index of refraction that is identical or very close to that of substrate 4842. The microlenses may be formed by one or more conventional techniques, such as photolithography and thermal reflow, photolithography using of a grey scale mask, jet printing and pattern transfer onto the substrate by etching.

Figure 32D:
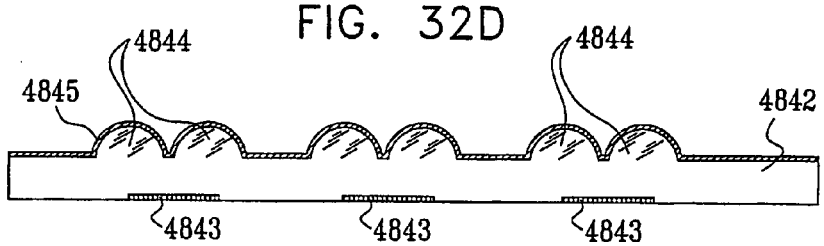
Figure 32E:
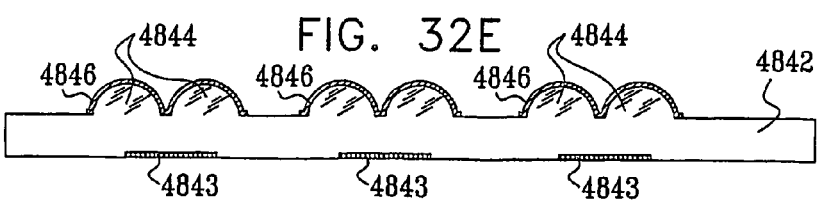
Figure 32F:
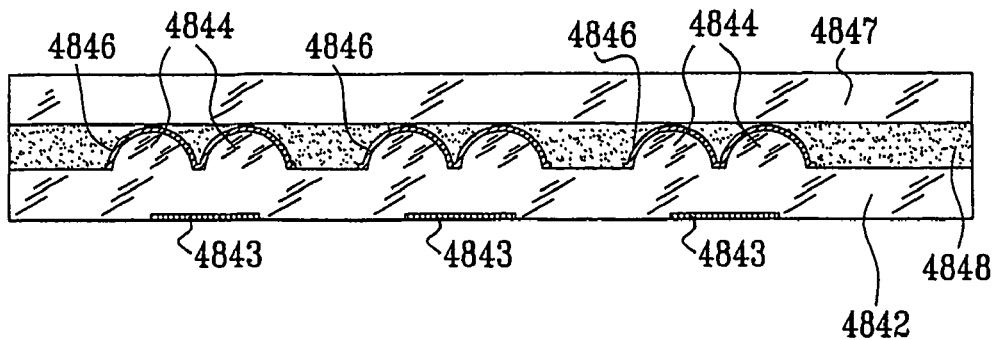

A thin metal layer 4845, typically aluminum, is formed over the substrate 4842 and pairs of microlenses 4844 as seen in FIG. 32D, typically by evaporation or sputtering. Metal layer 4845 is preferably patterned, typically by conventional photolithographic techniques, to define a reflective surface 4846, as seen in FIG. 32E. A glass cover layer 4847 is preferably formed over the array of microlenses 4844 and sealed thereover by an adhesive 4848 as seen in FIG. 32F.

Figure 32G:
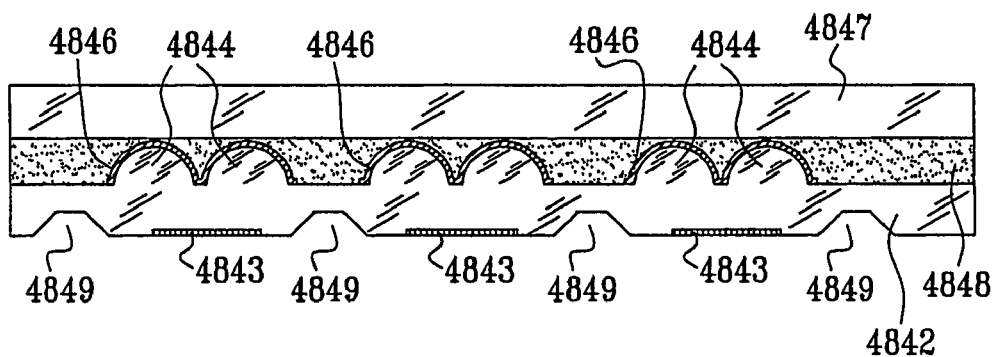
Figure 32H:
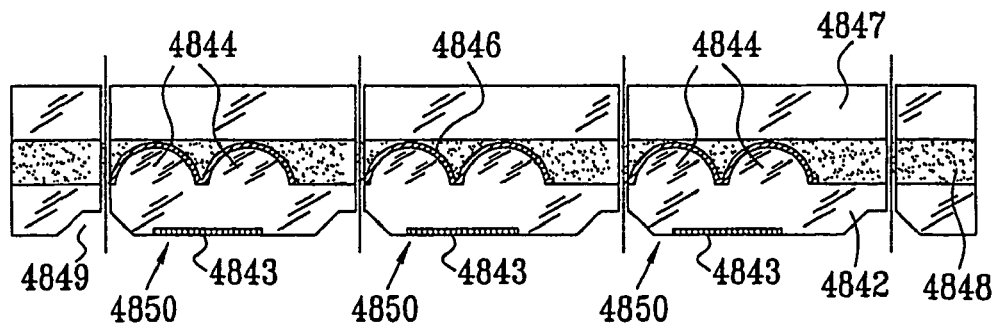

The substrate 4842 is notched from underneath by conventional techniques, defining notches 4849, as seen in FIG. 32G. Following notching, the substrate 4842, the microlenses 4844, the metal layer 4845 (FIG. 32D), the glass cover layer 4847 and the adhesive 4848 are diced by conventional techniques, as shown in FIG. 32H, at locations intersecting inclined walls of the notches 4849, thereby defining individual optical elements 4850, each including curved reflective portion 4846 defined by a pair of microlenses 4844 as well as flat reflective grating 4843.

Figure 33A:
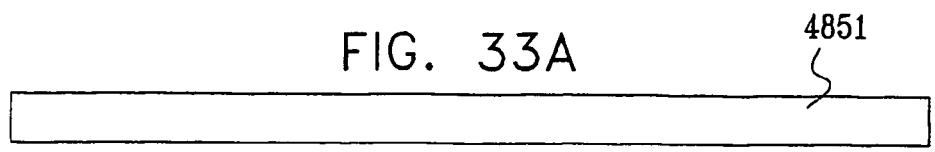
FIGS. 33A, 33B, 33C, 33D, 33E, 33F, 33G and 33H are simplified illustrations of a method for fabricating optical elements employed in the embodiments of FIGS. 16-27 and FIGS. 35A-41 in accordance with yet a further embodiment of the present invention.
Figure 33B:
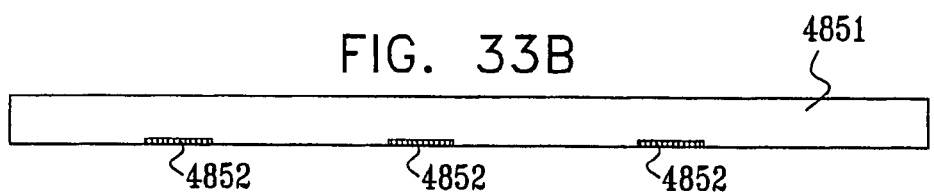
Figure 33C:
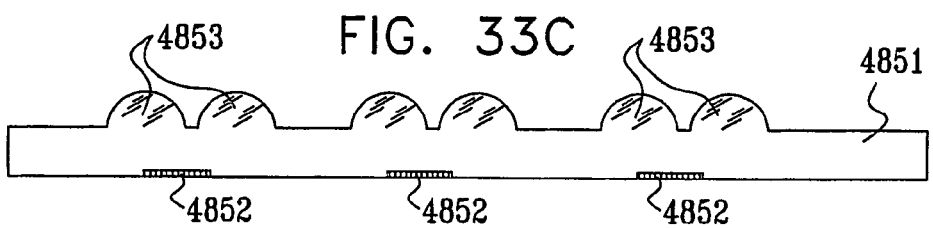

Reference is now made to FIGS. 33A, 33B, 33C, 33D, 33E, 33F, 33G and 33H, which are simplified illustrations of a method for fabricating optical elements employed in the embodiments of FIGS. 16-27 and FIGS. 35A-41 in accordance with yet a further embodiment of the present invention. A glass substrate 4851, typically of thickness 200-400 microns, seen in FIG. 33A, has formed in an underside surface thereof an array of reflective diffraction gratings 4852, as seen in FIG. 33B, typically by etching. Alternatively, the gratings 4852 may be formed on the surface of the substrate 4851, typically by lithography or transfer. An array of pairs of microlenses 4853, typically formed of photoresist, is formed on an opposite surface of substrate 4851, as seen in FIG. 33C. The microlenses 4853 preferably have an index of refraction that is identical or very close to that of substrate 4851. The microlenses may be formed by one or more conventional techniques, such as photolithography and thermal reflow, photolithography using of a grey scale mask, jet printing and pattern transfer onto the substrate by etching.

Figure 33D:
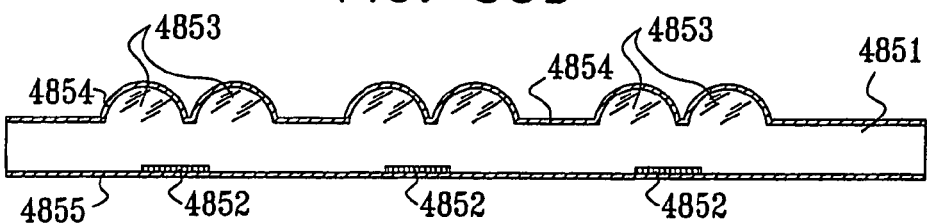
Figure 33E:
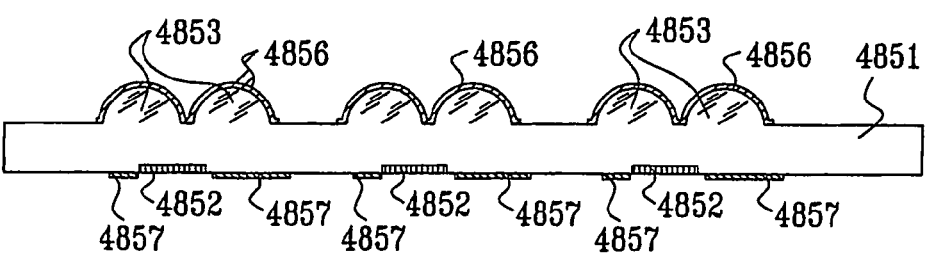
Figure 33F:
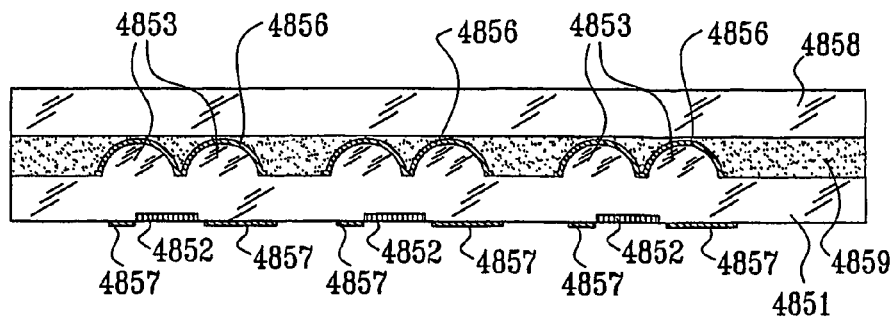

A thin metal layer 4854, typically aluminum, is formed over the substrate 4851 and pairs of microlenses 4853 as seen in FIG. 33D, typically by evaporation or sputtering. An additional metal layer 4855 is similarly formed on an opposite surface of the substrate 4851. Metal layers 4854 and 4855 are preferably patterned, typically by conventional photolithographic techniques, to define respective reflective surfaces 4856 and 4857, as seen in FIG. 33E. A glass cover layer 4858 is preferably formed over the array of microlenses 4853 and sealed thereover by an adhesive 4859 as seen in FIG. 33F.

Figure 33G:
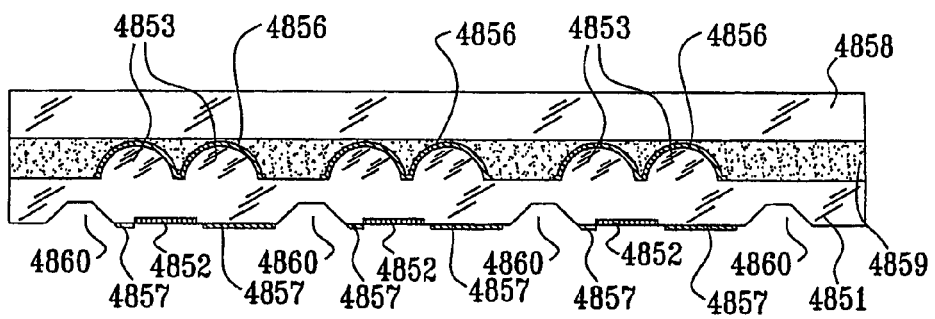
Figure 33H:
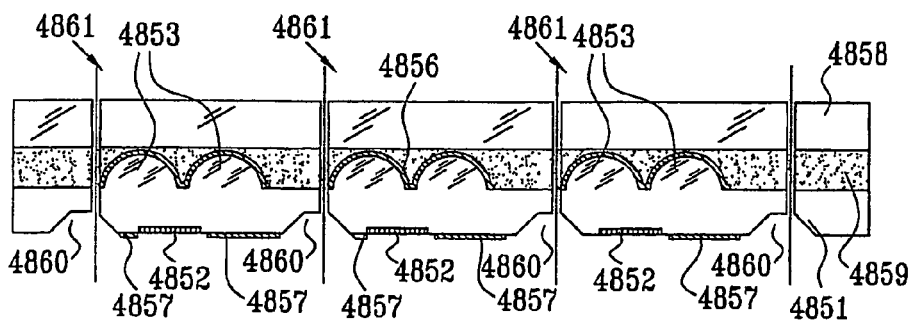

The substrate 4851 is notched from underneath by conventional techniques, defining notches 4860, as seen in FIG. 33G. Following notching, the substrate 4851, the microlenses 4853, the metal layers 4854 and 4855 (FIG. 33D), the glass cover layer 4858 and the adhesive 4859 are diced by conventional techniques, as shown in FIG. 33H, at locations intersecting inclined walls of the notches 4860, thereby defining individual optical elements 4861, each including curved reflective surface 4856 defined by a pair of microlenses 4853 as well as flat reflective grating 4852 and flat reflective surfaces 4857.

Figure 34A:
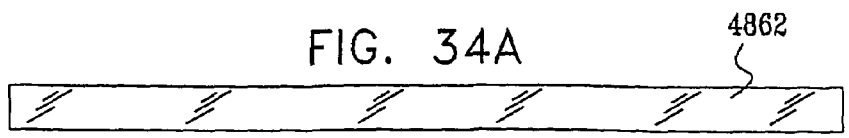
FIGS. 34A, 34B, 34C, 34D, 34E, 34F, 34G and 34H are simplified illustrations of a method for fabricating optical elements employed in the embodiments of FIGS. 16-27 and FIGS. 35A-41 in accordance with still a further embodiment of the present invention.
Figure 34B:
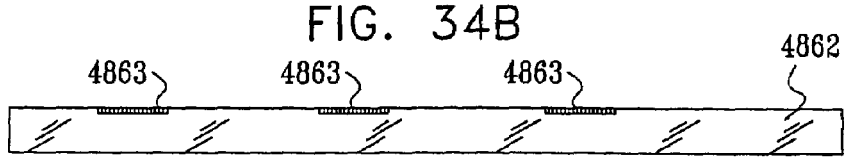
Figure 34C:
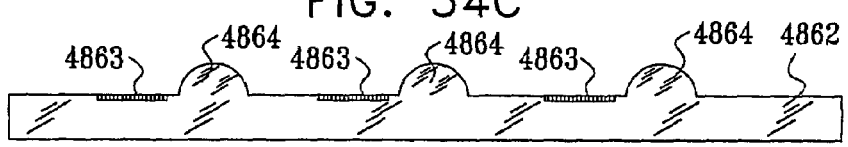

Reference is now made to FIGS. 34A, 34B, 34C, 34D, 34E, 34F, 34G and 34H, which are simplified illustrations of a method for fabricating optical elements employed in the embodiments of FIGS. 16-27 and FIGS. 35A-41 in accordance with still a further embodiment of the present invention. A glass substrate 4862, typically of thickness 200-400 microns, seen in FIG. 34A, has formed therein an array of reflective diffraction gratings 4863, as seen in FIG. 34B, typically by etching. Alternatively, the gratings 4863 may be formed on the surface of the substrate 4862, typically by lithography or transfer. An array of microlenses 4864, typically formed of photoresist, is formed on the same surface of substrate 4862, as seen in FIG. 34C. The microlenses 4864 preferably have an index of refraction which is identical or very close to that of substrate 4862. The microlenses may be formed by one or more conventional techniques, such as photolithography and thermal reflow, photolithography using of a grey scale mask, jet printing and pattern transfer onto the substrate by etching.

Figure 34D:
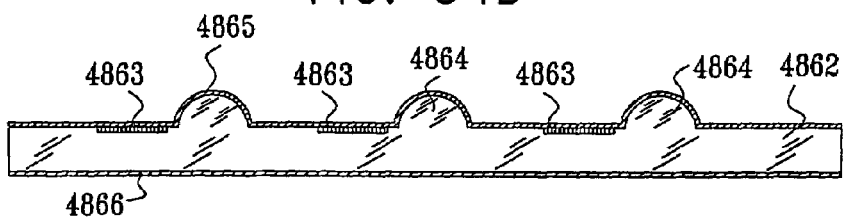
Figure 34E:
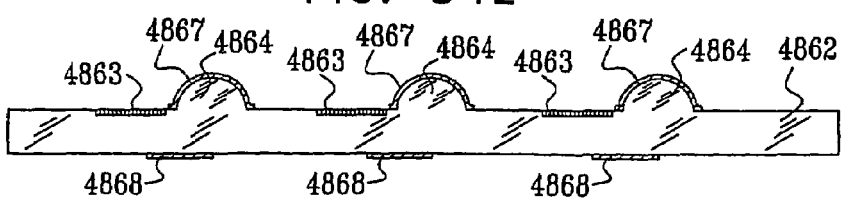
Figure 34F:
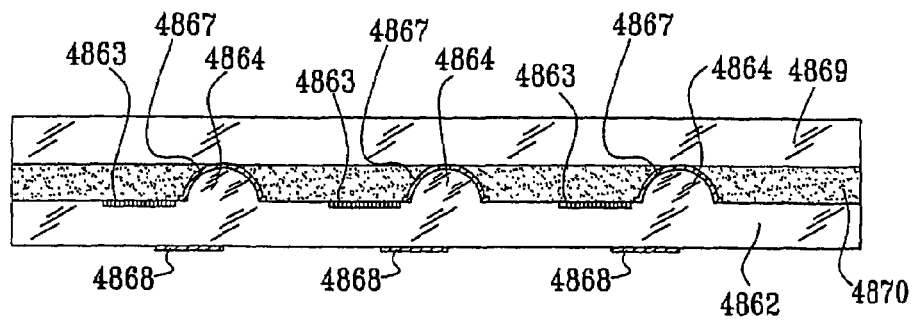

A thin metal layer 4865, typically aluminum, is formed over the substrate 4862 and microlenses 4864 as seen in FIG. 34D, typically by evaporation or sputtering. An additional metal layer 4866 is similarly formed on an opposite surface of the substrate 4862. Metal layers 4865 and 4866 are preferably patterned, typically by conventional photolithographic techniques, to define respective reflective surfaces 4867 and 4868, as seen in FIG. 34E. A glass cover layer 4869 is preferably formed over the array of microlenses 4864 and sealed thereover by an adhesive 4870 as seen in FIG. 34F.

Figure 34G:
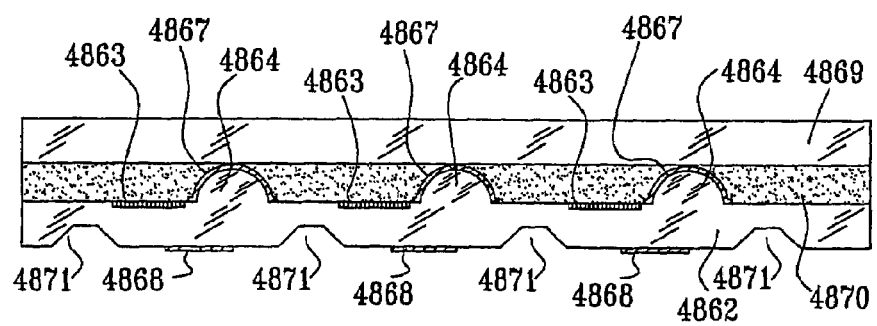
Figure 34H:
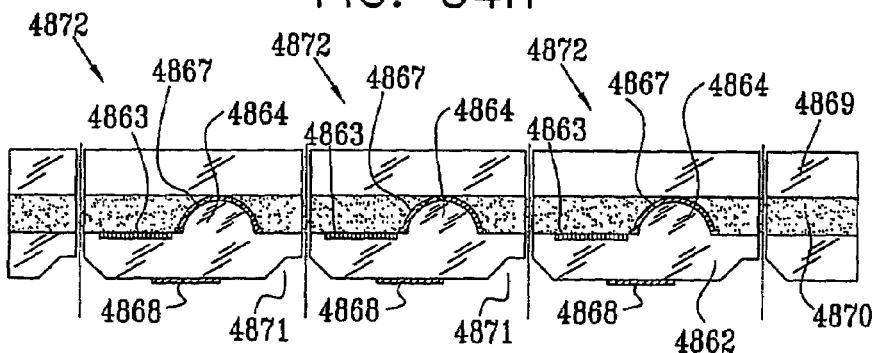

The substrate 4862 is notched from underneath by conventional techniques, defining notches 4871, as seen in FIG. 34G. Following notching, the substrate 4862, the microlenses 4864, the metal layers 4865 and 4866 (FIG. 34D), the glass cover layer 4869 and the adhesive 4870 are diced by conventional techniques, as shown in FIG. 34H, at locations intersecting inclined walls of the notches 4871, thereby defining individual optical elements 4872, each including curved reflective surface 4867 defined by microlens 4864 as well as flat reflective grating 4863 and a flat reflective surface 4868.

It is appreciated that the provision of the glass cover layers 4806, 4816, 4828, 4838, 4847, 4858 and 4869 (FIGS. 28A-34H) provides enhanced mechanical and environmental protection for the micro optical elements 4809, 4820, 4831, 4841, 4850, 4861 and 4872 (FIGS. 28A-34H), respectively. Additionally, provision of the glass cover layers 4806, 4816, 4828, 4838, 4847, 4858 and 4869 (FIGS. 28A-34H) and adhesives 4808, 4818, 4829, 4839, 4848, 4859 and 4870 (FIGS. 28A-34H) enable the micro optical elements 4809, 4820, 4831, 4841, 4850, 4861 and 4872 (FIGS. 28A-34H), to withstand temperatures above the melting temperature of the microlenses 4802, 4812, 4822, 4833, 4844, 4853 and 4864, (FIGS. 28A-34H).

It is appreciated that cover layers 4806, 4816, 4828, 4838, 4847, 4858 and 4869 (FIGS. 28A-34H), may alternatively be formed of any suitable heat-resistant material, such as glass, silicon, alumina and ceramic.

Figure 35A:
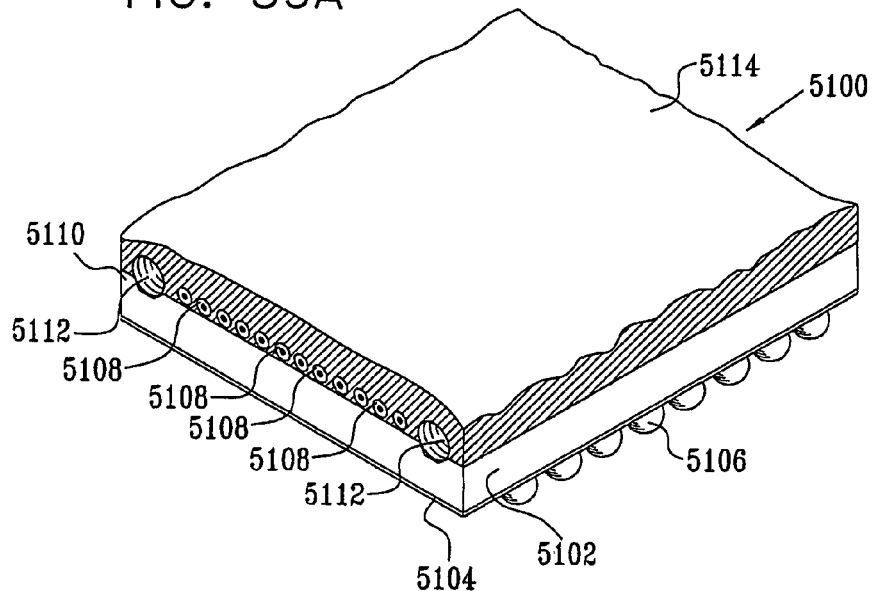
FIGS. 35A and 35B are simplified pictorial illustrations of a packaged electro-optic integrated circuit having integrally formed therein an optical connector and electrical connections, alone and in conjunction with a conventional optical connector.
Figure 35B:
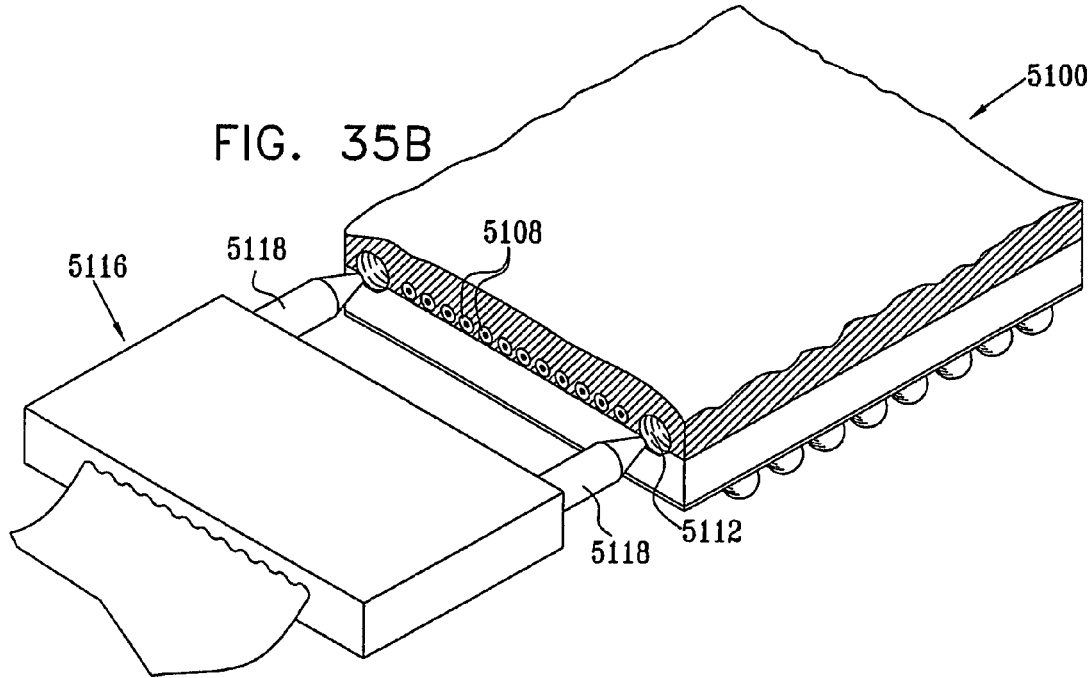

Reference is now made to FIGS. 35A and 35B, which are simplified pictorial illustrations of a packaged electro-optic integrated circuit 5100, having integrally formed therein an optical connector and electrical connections, alone and in conjunction with a conventional optical connector.

As seen in FIGS. 35A and 35B, a packaged electro-optic integrated circuit 5100 is provided in accordance with a preferred embodiment of the present invention, preferably in accordance with the teachings presented hereinabove with reference to FIGS. 1A-27, and includes a semiconductor substrate 5102, typically silicon, silicon germanium, gallium arsenide or indium phosphide. Electrical circuitry (not shown) is formed, as by conventional photolithographic and thin film processing techniques generally used for the manufacturing production of CMOS and other integrated circuits, over one surface of substrate 5102 and is encapsulated by a layer 5104 of a protective material such as silicon dioxide, silicon nitride, silicon oxy-nitride, or BCB, commercially available from Dow Corning of the U.S.A., or any other suitable passivation layer. An array 5106 of electrical connections, preferably in the form of conventional solder bumps, communicates with the electrical circuitry via conductive pathways (not shown) extending through the protective material of layer 5104.

Formed on a surface of substrate 5102 opposite to that adjacent layer 5104 there are defined optical pathways (not shown) which communicate with an array of optical fibers 5108, whose ends are aligned along an edge 5110 of the substrate 5102. Preferably, physical alignment bores 5112 are aligned with the array of optical fibers 5108. The bores 5112 are preferably defined by cylindrical elements, which, together with the optical fibers 5108 and the optical pathways, are encapsulated by a layer 5114 of protective material, preferably epoxy.

FIG. 35B shows a conventional MT type optical connector 5116, such as an MT connector manufactured by SENKO Advanced Components, Inc. of Marlborough, Mass., USA, arranged for mating contact with the packaged electro-optic circuit 5100, wherein alignment pins 5118 of connector 5116 are arranged to seat in alignment bores 5112 of the electro-optic circuit 5100. Optical fiber ends (not shown) of connector 5116 are arranged in butting aligned relationship with the ends of the array 5108 of optical fibers in packaged electro-optic circuit 5100.

Figure 36A:
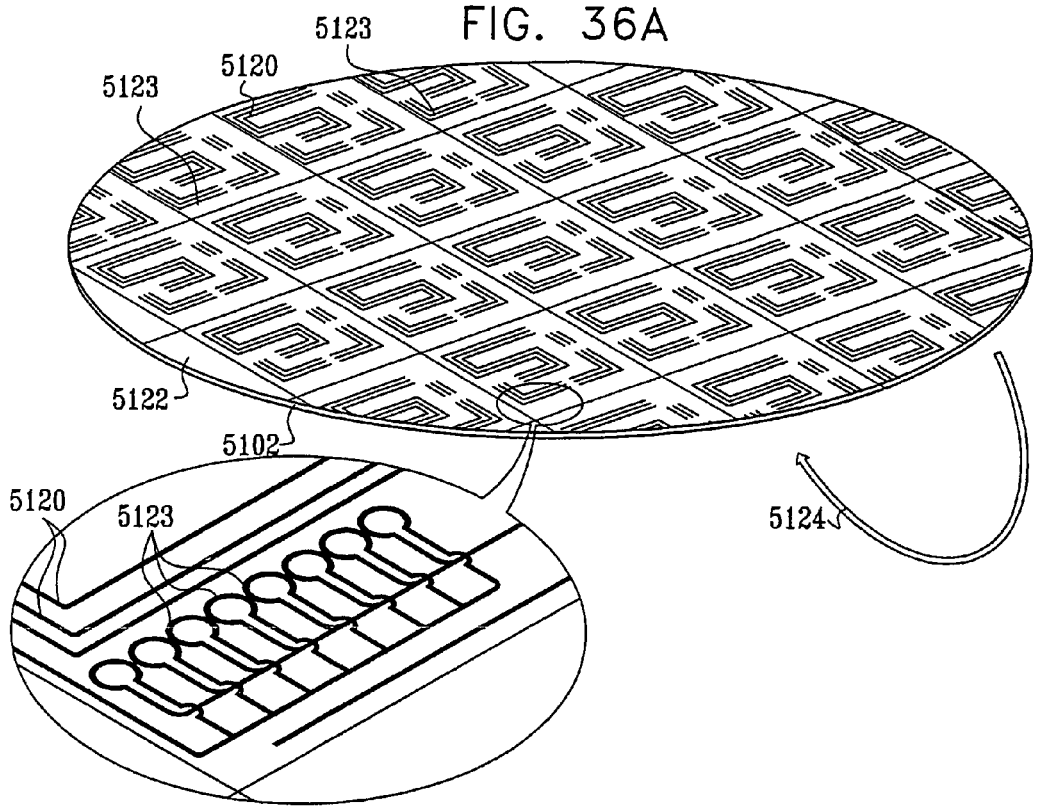

Reference is now made to FIGS. 36A, 36B, 36C, 36D, 36E, 36F and 36G, which are simplified pictorial and sectional illustrations of a plurality of stages in the manufacture of the packaged electro-optic circuit of FIGS. 35A and 35B. Turning to FIG. 36A, it is seen that electrical circuits 5120 are preferably formed onto a first surface 5122 of substrate 5102. Substrate 5102 is preferably of thickness between 200-1000 microns. The electrical circuits 5120 are preferably formed by conventional photolithographic and other thin film techniques employed in the production of CMOS and other integrated circuits.

Figure 36B:
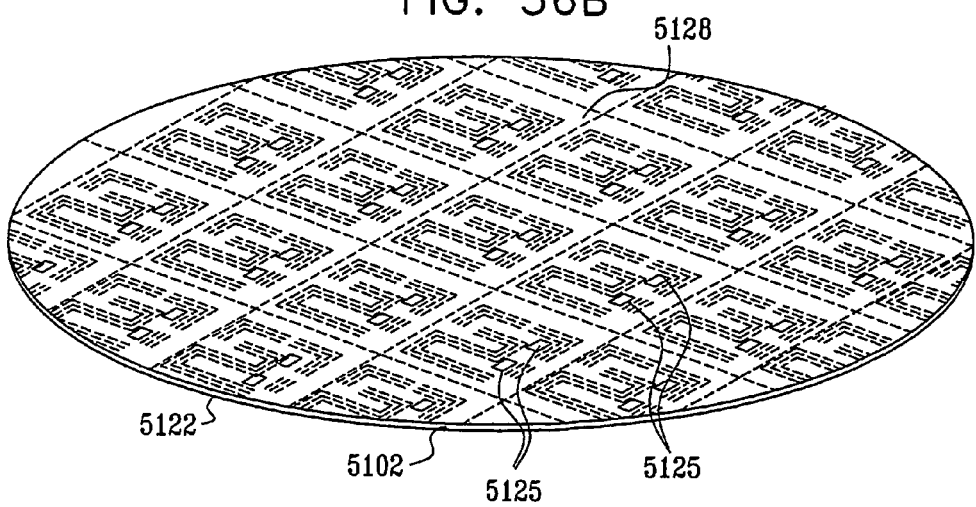

Preferably light detector arrays 5123 are also formed on surface 5122 of substrate 5102 and connected to electrical circuits 5120. The light detector arrays 5123 are preferably formed by chemical deposition and lithography and may comprise, for example, poly-silicon, amorphous silicon, lead sulfide, lead selenide and HgCdTe. The light detector arrays 5123 may advantageously be employed to monitor individual outputs of individual lasers in a laser array embedded in a packaged electro-optic integrated circuit and connector chip, such as chips 1000, 1500, 2000 and 2500, in the embodiments of FIGS. 1A-1D, 2A-2D, 3A-3D and 4A-4D, respectively. The substrate shown in FIG. 36A is turned over, as indicated by an arrow 5124, and as shown in FIG. 36B, an array of holes 5125 extending partially or totally through the semiconductor substrate 5102 is formed, such as by conventional photolithographic techniques, on a second surface 5128, opposite surface 5122 of substrate 5102. Following an etching process, the holes are filled with an optical adhesive (not shown), such as OG 146, manufactured by Epoxy Technology, 14 Fortune Drive, Billerica, Mass. 01821, USA, whose refractive index preferably is precisely matched to that of cores of conventionally manufactured optical fibers. This results in an array of optical vias, formed as described hereinabove with reference to FIGS. 17A-17C, through the substrate 5102, which are transparent to light within at least part of the wavelength range of 400-1650 nm.

Figure 36C:
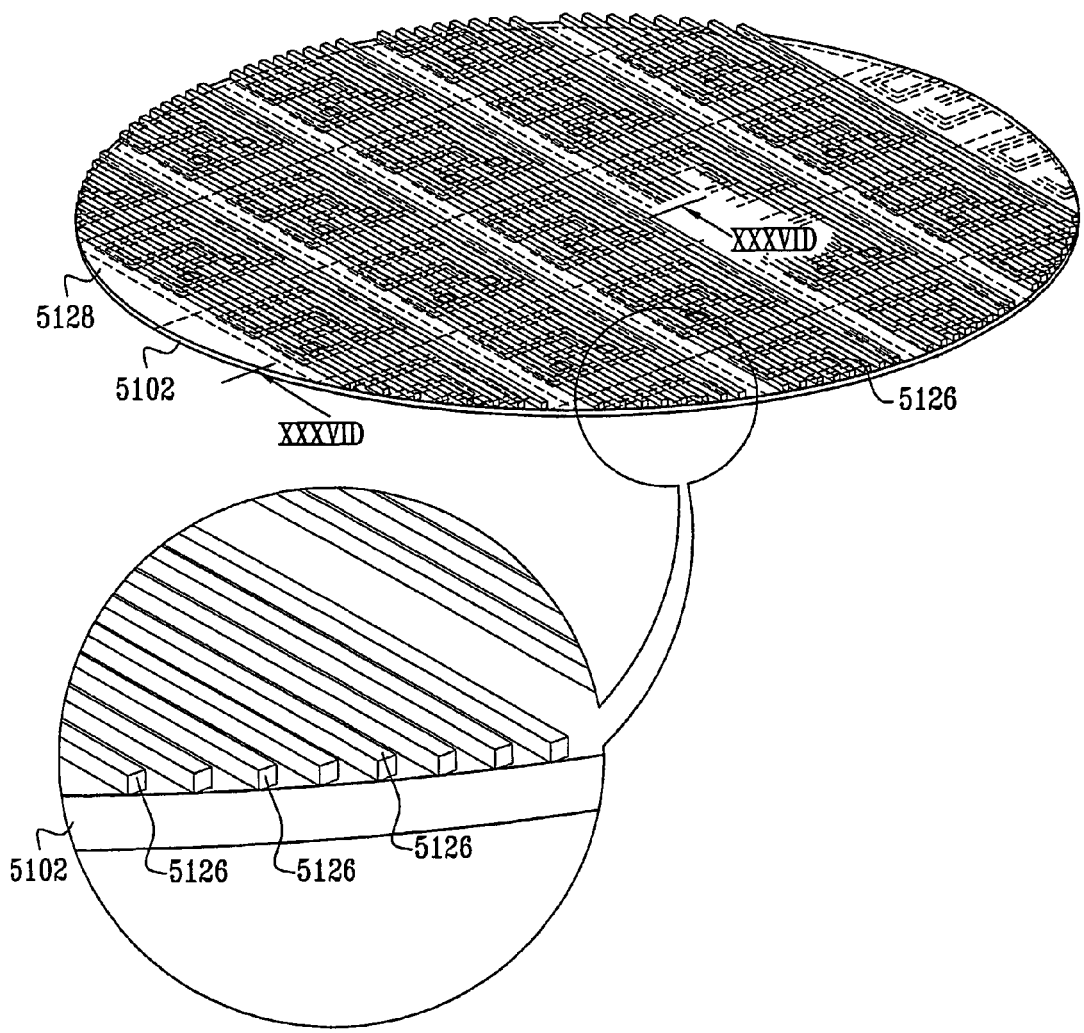

As shown in FIG. 36C, an array of parallel, spaced, elongated optical fiber positioning elements 5126 is preferably formed, such as by conventional photolithographic techniques, over second surface 5128 of substrate 5102. Turning to FIG. 36D, which is a simplified sectional illustrations, taken along the lines XXXVID-XXXVID in FIG. 36C, it is appreciated that the positions of the arrays of optical adhesive filled holes 5125 and positioning elements 5126 on surface 5128 are preferably precisely coordinated with the positions of the electrical circuits 5120 on first surface 5122 of the substrate 5102.

Turning to FIG. 36E, it is seen that notches 5130 are preferably formed on surface 5128, as by means of a dicing blade 5132, to precisely position and accommodate alignment bore defining cylinders 5134, as shown in FIG. 36F. FIG. 36F illustrates that the centers of alignment bore defining cylinders 5134 preferably lie in the same plane as the centers 5136 of optical fibers 5108 which are precisely positioned between elements 5126 on surface 5128. FIG. 36G illustrates encapsulation of the fibers 5108, the cylinders 5134 and the positioning elements 5126 by layer 5114 of protective material, preferably epoxy.

Figure 37A:
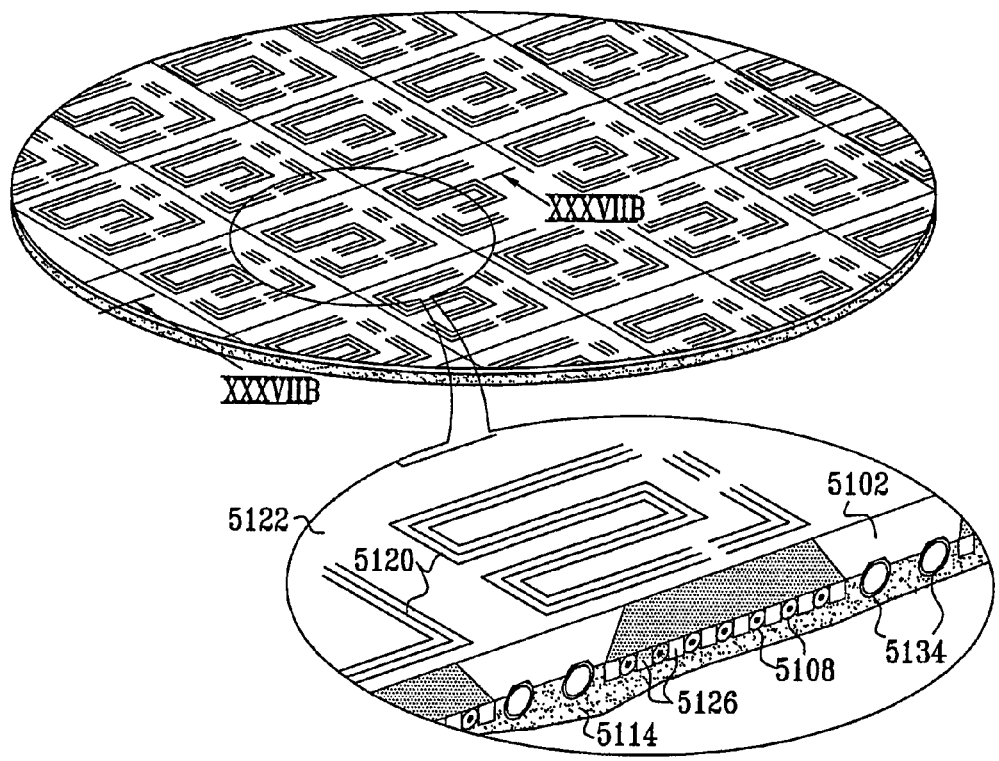

Reference is now made to FIGS. 37A, 37B, 37C, 37D and 37E, which are simplified pictorial and sectional illustrations of a further plurality of stages in the manufacture of the packaged electro-optic circuit of FIGS. 35A and 35B. FIG. 37A shows the wafer of FIG. 36G turned over.

Figure 37B:
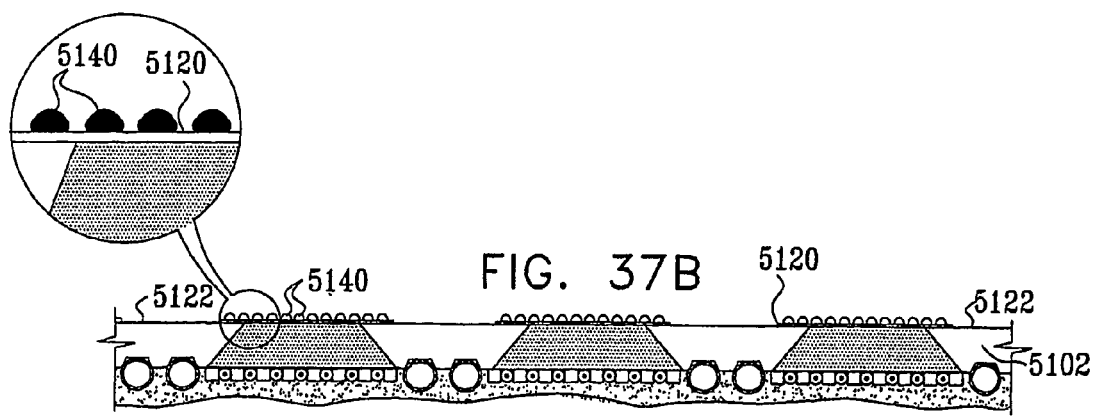

FIG. 37B is a sectional illustration of the wafer of FIG. 37A along lines XXXVIIB-XXXVIIB. As shown in FIG. 37B, a multiplicity of bumps 5140, preferably gold or solder bumps, are formed onto electrical circuits 5120 lying on surface 5122.

A plurality of integrated circuits 5152 are mounted onto the multiplicity of bumps 5140 by standard flip chip attachment techniques, as seen in FIG. 37C. Integrated circuits 5152 may be electrical or electro-optic integrated circuits, as appropriate.

FIG. 37D illustrates the application of underfill material 5154, such as OG 146, manufactured by Epoxy Technology, 14 Fortune Drive, Billerica, Mass. 01821, USA, at the gap between integrated circuits 5152 and electrical circuits 5120 as well as substrate 5102. If integrated circuits 5152 include electro-optic devices, the underfill material 5154 should be transparent as appropriate.

As shown in FIG. 37E, an encapsulation layer 5156, such as a layer of BCB or solder mask or other encapsulating material, is preferably formed over integrated circuits 5152, electrical circuits 5120, substrate 5102 and underfill material 5154.

For the purposes of the following discussion, it is assumed that at least some, if not all, of the integrated circuits 5152 are electro-optic devices. It is appreciated that additional integrated circuits (not shown), which are not electro-optic devices, may be electrically connected to the electrical circuits 5120 on substrate 5102 either by flip chip or by other techniques, such as wire bonding.

Reference is now made to FIG. 38, which is a simplified pictorial illustration corresponding to sectional illustration FIG. 22B. FIG. 38 illustrates the wafer of FIG. 37E, turned over and notched along lines extending perpendicularly to the array of optical fibers 5108, producing notches 5160, which have an inclined cut 5162 extending entirely through at least a core 5164, of each fiber 5108 and extending at least partially through cylindrical elements 5134, and optical adhesive filled holes 5125.

Reference is now made to FIG. 39, which is a simplified pictorial illustration corresponding to sectional illustrations of FIGS. 22C, 22D and 24. FIG. 39 illustrates the wafer of FIG. 38, with partially flat and partially concave mirror assembly 5230 mounted thereon, parallel to one of the inclined cuts 5162 defined by notch 5160, as described hereinabove with reference to FIG. 38. It is appreciated that mirror assembly 5230 extends along the entire length of substrate 5102.

Figure 40A:
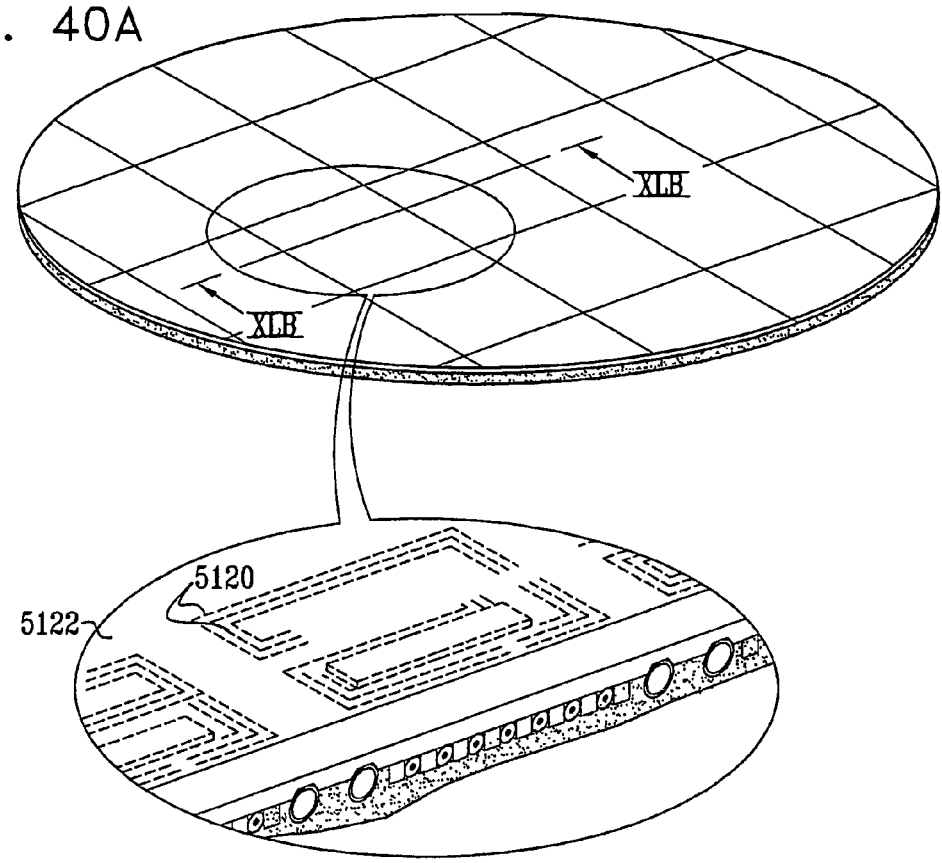
FIGS. 40A, 40B, 40C, 40D, 40E and 40F are simplified pictorial and sectional illustrations of a further plurality of stages in the manufacture of the packaged electro-optic circuit of FIGS. 35A and 35B.
Figure 40B:
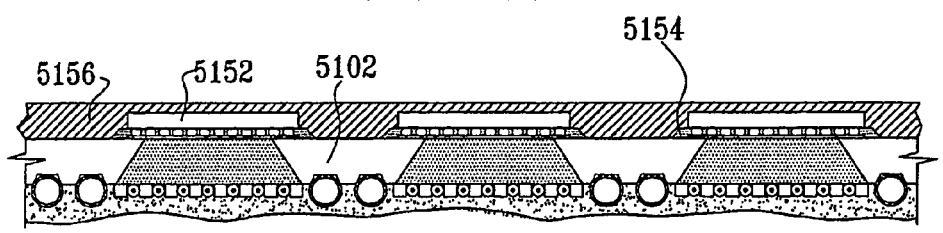
Figure 40C:
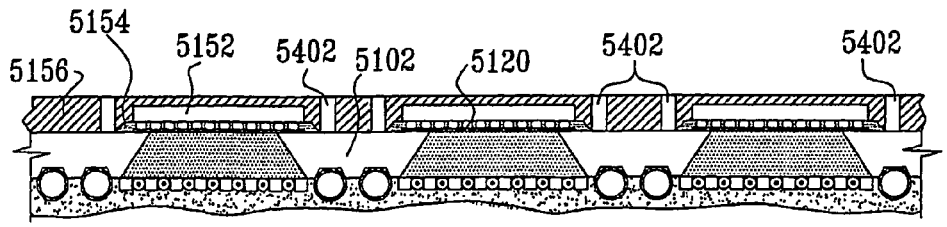
Figure 40D:
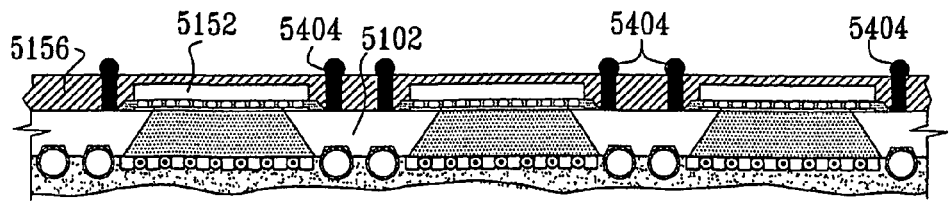

Reference is now made to FIGS. 40A, 40B, 40C, 40D, 40E and 40F, which are simplified pictorial and sectional illustrations of a further plurality of stages in the manufacture of the packaged electro-optic circuit of FIGS. 35A and 35B. FIG. 40A shows the wafer of FIG. 39 turned over. FIG. 40B is a sectional illustration of the wafer of FIG. 40A along lines XLB-XLB. FIG. 40C illustrates the formation of holes 5402 by conventional techniques, such as the use of lasers or photolithography, which communicate through layer 5156 with electrical circuits 5120 on substrate 5102. FIG. 40D shows the formation of solder bumps 5404 in holes 5402.

Figure 40E:
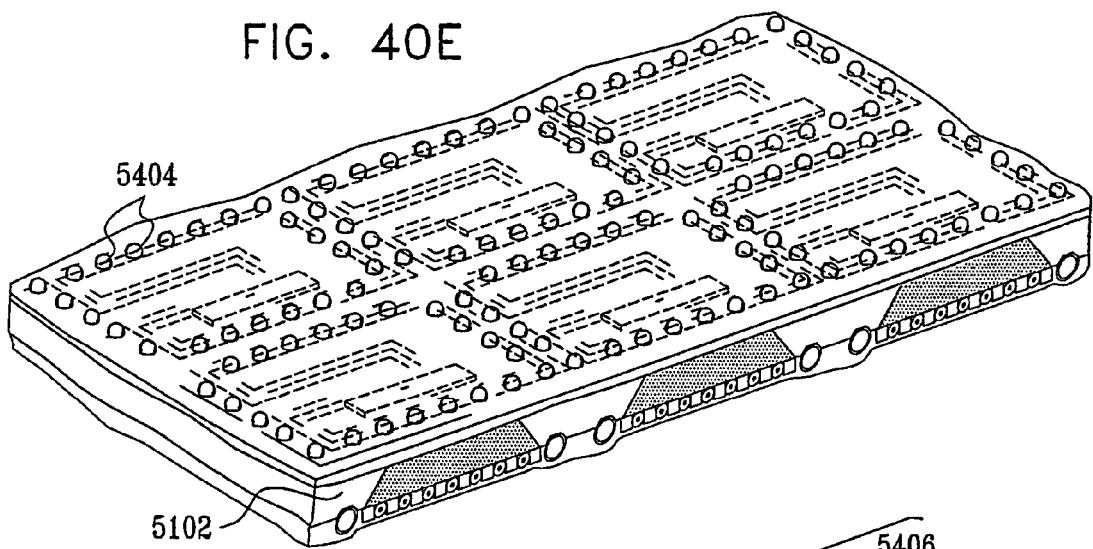
Figure 40F:
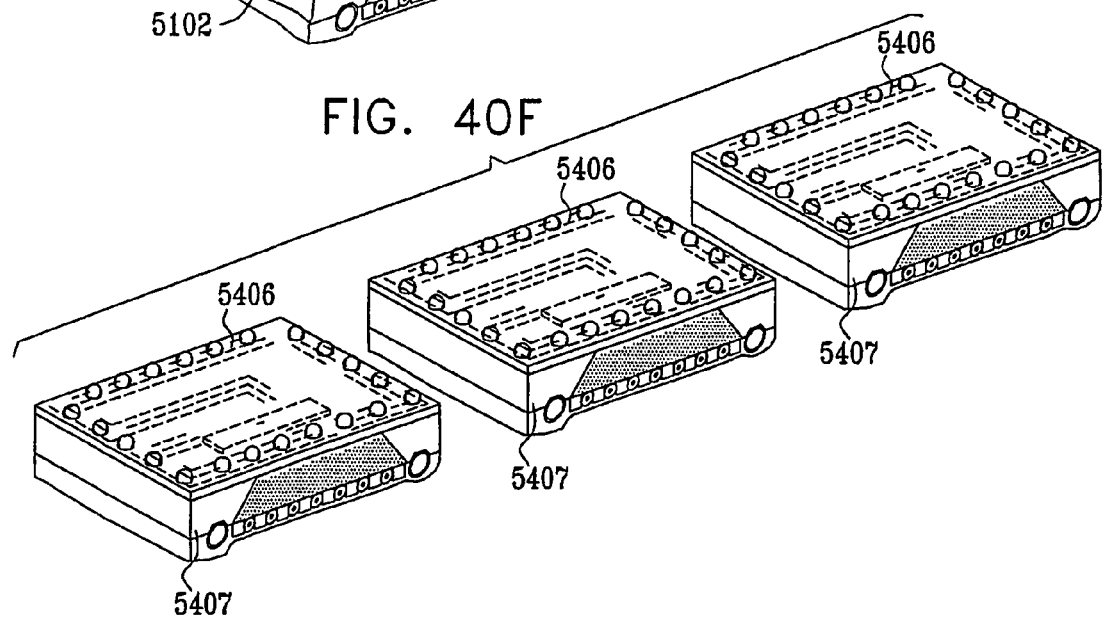

Following the formation of solder bumps 5404 in holes 5402, the wafer, a section of which is shown in FIG. 40E, is preferably diced, providing a plurality of packaged electro-optic circuit chips 5406, as illustrated in FIG. 40F. Following dicing of substrate 5102 into a plurality of packaged electro-optic circuit chips 5406, an optical edge surface 5407 of each of the plurality of packaged electro-optic circuit chips 5406 is polished to provide an optical quality planar surface. It is appreciated that the planar surface defined by the polishing may be either parallel to the plane defined by the dicing, or at any suitable angle.

Reference is now made to FIG. 41, which shows packaged electro-optic integrated circuit chips 5406 mounted on a conventional electrical circuit board 5408 and being interconnected by a conventional optical fiber ribbon 5410 and associated conventional optical fiber connectors 5416.

It will be appreciated by persons skilled in the art that the present invention is not limited by what has been particularly shown and described hereinabove. Rather the scope of the present invention includes both combinations and sub combinations of the various features described hereinabove as well as variations and modifications which would occur to persons skilled in the art upon reading the specification and which are not in the prior art.

The invention claimed is:

1. An optical device comprising:
   a substrate having first and second oppositely facing generally parallel planar surfaces;
   at least one optical fiber, having a core, mounted on said substrate along said first generally parallel planar surface, said substrate and said at least one optical fiber being cut by a common transverse notch having at least one inclined surface extending entirely through said core of said at least one optical fiber, said first generally parallel planar surface and partially through said substrate, and defining at least one of end of said at least one optical fiber at said at least one inclined surface; and
   at least one optical element adhesively mounted at least partially within said notch, said at least one optical element including at least one reflective optical surface facing an end of said at least one optical fiber lying at one of said at least one inclined surface and also facing said second parallel planar surface of said substrate.

2. An optical device according to claim 1 and also comprising electrical circuitry.

3. An optical device according to claim 1 and wherein said core of said at least one optical fiber is in optical communication with said at least one reflective optical surface.

4. An optical device according to claim 1 and also comprising electrical circuit formed on said second surface.

5. An optical device according to claim 1 and wherein said substrate is optically transmissive, permitting optical signal communication therethrough between said first and second surfaces.

6. An optical device according to claim 1 and wherein said at least one inclined surface is a rough surface.

7. An optical device according to claim 1 and wherein said at least one reflective optical surface is a flat reflective surface.

8. An optical device according to claim 1 and wherein said at least one optical element includes a concave mirror.

9. An optical device according to claim 1 and wherein said at least one optical element includes a partially flat and partially concave mirror.

10. An optical device according to claim 1 and wherein said at least one optical element includes a reflective grating.

11. An optical device according to claim 1 and wherein said at least one optical element includes reflective elements formed on opposite surfaces of an optical substrate.

12. An optical device according to claim 1 and wherein said at least one optical element is operative to focus light received from said at least one optical fiber.

13. An optical device according to claim 1 and wherein said at least one optical element is operative to collimate light received from said at least one optical fiber.

14. An optical device according to claim 1 and wherein said at least one optical element is operative to focus at least one of multiple colors of light received from said at least one optical fiber.

15. An optical device according to claim 1 and also including an optical connector on an edge of said optical device.

16. An optical device according to claim 1 and wherein said substrate is optically non-transmissive not permitting optical signal communication therethrough between said first and second surfaces and also comprising at least one optical via extending though said substrate between said first and second surfaces in optical communication with said at least one reflective optical surface.

17. An optical device according to claim 1 and also comprising at least one laser mounted on said substrate and at least one optical detector arranged to sense light emitted by said at least one laser.

18. An optical device according to claim 6 and also comprising an optical adhesive disposed between said rough surface and said at least one optical element, which fills in interstices of said rough surface.

19. An optical device according to claim 18 and wherein said optical adhesive has an index of refraction at least generally matched to that of said core of said at least one optical fiber and to that of said at least one optical element.

20. An optical device according to claim 9 and wherein said partially concave mirror includes a mirror having multiple concave reflective surfaces.

21. An optical device according to claim 15 and wherein said optical connector is aligned with at least one end of said at least one optical fiber along said edge of said optical device and also including electrical circuitry and an array of electrical connections coupled to sale electrical circuitry.

22. An optical device according to claim 15 and wherein said optical connector also comprises alignment bores arranged on said edge of said optical device.

23. A optical device according to claim 16 and also comprising at least one laser mounted on said substrate and at least one optical detector arranged to sense light emitted by said at least one laser.

24. An optical device, comprising:
    a substrate having first and second generally parallel planar surfaces;
    at least one optical fiber, having a core, mounted on said substrate and being cut by a transverse notch having at least one inclined surface extending entirely through said core of said at least one optical fiber and defining at least one of end of at least one optical waveguide at said at least one inclined surface; and
    at least one optical element adhesively mounted at least partially within said notch, said at least one optical element including at least one reflective optical surface facing an end of said at least one optical fiber lying at one of said at least one inclined surface;
    wherein said substrate is optically non-transmissive not permitting optical signal communication therethrough between said first and second surfaces and also comprising at least one optical via extending though said substrate between said first and second surfaces in optical communication with said at least one reflective optical surface.

25. An optical device, comprising:

a substrate having first and second generally parallel planar surfaces;

at least one optical fiber, having a core, mounted on said substrate and being cut by a transverse notch having at least one inclined surface extending entirely through said core of said at least one optical fiber and defining at least one of end of at least one optical waveguide at said at least one inclined surface;

at least one optical element adhesively mounted at least partially within said notch, said at least one optical element including at least one reflective optical surface facing an end of said at least one optical fiber lying at one of said at least one inclined surface; and at least one laser mounted on said substrate and at least one optical detector arranged to sense light emitted by said at least one laser;

wherein said substrate is optically non-transmissive not permitting optical signal communication therethrough between said first and second surfaces and also comprising at least one optical via extending though said substrate between said first and second surfaces in optical communication with said at least one reflective optical surface.

* * * * *